(12) United States Patent
Harada

(10) Patent No.: US 6,717,542 B2
(45) Date of Patent: Apr. 6, 2004

(54) ANALOG TO DIGITAL CONVERTER

(75) Inventor: Hisashi Harada, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/263,658

(22) Filed: Oct. 4, 2002

(65) Prior Publication Data
US 2003/0179124 A1 Sep. 25, 2003

(30) Foreign Application Priority Data
Mar. 22, 2002 (JP) ........................................ 2002-081207

(51) Int. Cl.[7] ................................................ H03M 1/38
(52) U.S. Cl. ........................ 341/161; 341/162; 341/163
(58) Field of Search ................................ 341/161, 162, 341/163

(56) References Cited

U.S. PATENT DOCUMENTS

| 4,897,658 | A | * | 1/1990 | Fujii et al. | ................... | 341/161 |
| 5,252,976 | A | * | 10/1993 | Miho et al. | ................. | 341/163 |
| 5,870,052 | A | * | 2/1999 | Dedic et al. | ................ | 341/161 |
| 6,181,268 | B1 | * | 1/2001 | Miyake et al. | .............. | 341/161 |
| 6,351,231 | B1 | * | 2/2002 | Price et al. | .................. | 341/155 |

FOREIGN PATENT DOCUMENTS

JP  4-271617  9/1992

* cited by examiner

Primary Examiner—Michael Tokar
Assistant Examiner—Khai Nguyen
(74) Attorney, Agent, or Firm—Burns, Doane, Swecker & Mathis, L.L.P.

(57) ABSTRACT

In a conversion sequence for converting an analog input voltage into a digital signal, a redundant comparison cycle is provided to comparison cycles for performing a prescribed number of times of comparison. This redundant comparison cycle may be added after the prescribed number of comparison cycles, or may be inserted into a normal comparison cycle. Such a redundant comparison cycle adds a convergence period of a converted value to the analog input voltage. Accordingly, the final conversion result can be accurately generated even if an error is generated in the conversion sequence. As a result, a successive approximation type analog to digital converter capable of rapidly performing analog-to-digital conversion with high accuracy is implemented.

20 Claims, 31 Drawing Sheets

FIG. 5

MAXIMUM CHARGING/DISCHARGING AMOUNT : 7LSB
VARIATION AMOUNT (LSB)

| INPUT VOLTAGE (LSB) | 1ST COMPARISON | | 2ND COMPARISON 8 | | | | | 3RD COMPARISON 4 | | | | |
|---|---|---|---|---|---|---|---|---|---|---|---|---|
| | COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF |
| 0.0 | 15.5 | -1 | 7.5 | 8 | 7 | 8.5 | -1 | 3.5 | 5 | 5 | 3.5 | -1 |
| 1.0 | 15.5 | -1 | 7.5 | 8 | 7 | 8.5 | -1 | 3.5 | 5 | 5 | 3.5 | -1 |
| 2.0 | 15.5 | -1 | 7.5 | 8 | 7 | 8.5 | -1 | 3.5 | 5 | 5 | 3.5 | -1 |
| 3.0 | 15.5 | -1 | 7.5 | 8 | 7 | 8.5 | -1 | 3.5 | 5 | 5 | 3.5 | -1 |
| 4.0 | 15.5 | -1 | 7.5 | 8 | 7 | 8.5 | -1 | 3.5 | 5 | 5 | 3.5 | -1 |
| 5.0 | 15.5 | -1 | 7.5 | 8 | 7 | 8.5 | -1 | 3.5 | 5 | 5 | 3.5 | -1 |
| 6.0 | 15.5 | -1 | 7.5 | 8 | 7 | 8.5 | -1 | 3.5 | 5 | 5 | 3.5 | -1 |
| 7.0 | 15.5 | -1 | 7.5 | 8 | 7 | 8.5 | -1 | 3.5 | 5 | 5 | 3.5 | 1 |
| 8.0 | 15.5 | -1 | 7.5 | 8 | 7 | 8.5 | -1 | 11.5 | 3 | 3 | 11.5 | 1 |
| 9.0 | 15.5 | -1 | 7.5 | 8 | 7 | 8.5 | -1 | 11.5 | 3 | 3 | 11.5 | 1 |
| 10.0 | 15.5 | -1 | 7.5 | 8 | 7 | 8.5 | -1 | 11.5 | 3 | 3 | 11.5 | 1 |
| 11.0 | 15.5 | -1 | 7.5 | 8 | 7 | 8.5 | 1 | 11.5 | 3 | 3 | 11.5 | 1 |
| 12.0 | 15.5 | -1 | 7.5 | 8 | 7 | 8.5 | 1 | 11.5 | 3 | 3 | 11.5 | 1 |
| 13.0 | 15.5 | -1 | 7.5 | 8 | 7 | 8.5 | 1 | 11.5 | 3 | 3 | 11.5 | 1 |
| 14.0 | 15.5 | -1 | 7.5 | 8 | 7 | 8.5 | 1 | 11.5 | 3 | 3 | 11.5 | 1 |
| 15.0 | 15.5 | -1 | 7.5 | 8 | 7 | 8.5 | 1 | 11.5 | 3 | 3 | 11.5 | 1 |
| 16.0 | 15.5 | 1 | 23.5 | 8 | 7 | 22.5 | -1 | 19.5 | 3 | 3 | 19.5 | 1 |
| 17.0 | 15.5 | 1 | 23.5 | 8 | 7 | 22.5 | -1 | 19.5 | 3 | 3 | 19.5 | 1 |
| 18.0 | 15.5 | 1 | 23.5 | 8 | 7 | 22.5 | -1 | 19.5 | 3 | 3 | 19.5 | 1 |
| 19.0 | 15.5 | 1 | 23.5 | 8 | 7 | 22.5 | -1 | 19.5 | 3 | 3 | 19.5 | 1 |
| 20.0 | 15.5 | 1 | 23.5 | 8 | 7 | 22.5 | -1 | 19.5 | 3 | 3 | 19.5 | 1 |
| 21.0 | 15.5 | 1 | 23.5 | 8 | 7 | 22.5 | -1 | 19.5 | 3 | 3 | 19.5 | 1 |
| 22.0 | 15.5 | 1 | 23.5 | 8 | 7 | 22.5 | -1 | 19.5 | 3 | 3 | 19.5 | 1 |
| 23.0 | 15.5 | 1 | 23.5 | 8 | 7 | 22.5 | 1 | 27.5 | 5 | 5 | 27.5 | -1 |
| 24.0 | 15.5 | 1 | 23.5 | 8 | 7 | 22.5 | 1 | 27.5 | 5 | 5 | 27.5 | -1 |
| 25.0 | 15.5 | 1 | 23.5 | 8 | 7 | 22.5 | 1 | 27.5 | 5 | 5 | 27.5 | -1 |
| 26.0 | 15.5 | 1 | 23.5 | 8 | 7 | 22.5 | 1 | 27.5 | 5 | 5 | 27.5 | -1 |
| 27.0 | 15.5 | 1 | 23.5 | 8 | 7 | 22.5 | 1 | 27.5 | 5 | 5 | 27.5 | -1 |
| 28.0 | 15.5 | 1 | 23.5 | 8 | 7 | 22.5 | 1 | 27.5 | 5 | 5 | 27.5 | -1 |
| 29.0 | 15.5 | 1 | 23.5 | 8 | 7 | 22.5 | 1 | 27.5 | 5 | 5 | 27.5 | -1 |
| 30.0 | 15.5 | 1 | 23.5 | 8 | 7 | 22.5 | 1 | 27.5 | 5 | 5 | 27.5 | -1 |
| 31.0 | 15.5 | 1 | 23.5 | 8 | 7 | 22.5 | 1 | 27.5 | 5 | 5 | 27.5 | -1 |

FIG. 6

| VARIATION AMOUNT (LSB) | | 2 | | | | 1 | | | | 1 | | | | | |
|---|---|---|---|---|---|---|---|---|---|---|---|---|---|---|---|
| | | 4TH COMPARISON | | | | 5TH COMPARISON | | | | 6TH COMPARISON | | | | COM-PARISON RESULT | ERROR TO INPUT |
| INPUT VOLTAGE (LSB) | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INC REF -1:INC REF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INC REF -1:INC REF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INC REF -1:INC REF | | |
| 0.0 | 1.5 | 2 | 2 | 1.5 | -1 | 0.5 | 1 | 1 | 0.5 | -1 | 0.5 | 0 | 0 | 0.5 | -1 | 0 | ○ |
| 1.0 | 1.5 | 2 | 2 | 1.5 | -1 | 0.5 | 1 | 1 | 0.5 | 1 | 1.5 | 1 | 1 | 1.5 | -1 | 1 | ○ |
| 2.0 | 1.5 | 2 | 2 | 1.5 | 1 | 2.5 | 1 | 1 | 2.5 | -1 | 1.5 | 1 | 1 | 1.5 | 1 | 2 | ○ |
| 3.0 | 1.5 | 2 | 2 | 1.5 | 1 | 2.5 | 1 | 1 | 2.5 | 1 | 3.5 | 1 | 1 | 3.5 | -1 | 3 | ○ |
| 4.0 | 5.5 | 2 | 2 | 5.5 | -1 | 4.5 | 1 | 1 | 4.5 | -1 | 3.5 | 1 | 1 | 3.5 | 1 | 4 | ○ |
| 5.0 | 5.5 | 2 | 2 | 5.5 | -1 | 4.5 | 1 | 1 | 4.5 | 1 | 5.5 | 1 | 1 | 5.5 | -1 | 5 | ○ |
| 6.0 | 5.5 | 2 | 2 | 5.5 | 1 | 6.5 | 1 | 1 | 6.5 | -1 | 5.5 | 1 | 1 | 5.5 | 1 | 6 | ○ |
| 7.0 | 5.5 | 2 | 2 | 5.5 | 1 | 6.5 | 1 | 1 | 6.5 | 1 | 7.5 | 1 | 1 | 7.5 | -1 | 7 | ○ |
| 8.0 | 9.5 | 2 | 2 | 9.5 | -1 | 8.5 | 1 | 1 | 8.5 | 1 | 7.5 | 1 | 1 | 7.5 | 1 | 8 | ○ |
| 9.0 | 9.5 | 2 | 2 | 9.5 | -1 | 10.5 | 1 | 1 | 10.5 | -1 | 9.5 | 1 | 1 | 9.5 | -1 | 9 | ○ |
| 10.0 | 9.5 | 2 | 2 | 9.5 | 1 | 10.5 | 1 | 1 | 10.5 | -1 | 9.5 | 1 | 1 | 9.5 | 1 | 10 | ○ |
| 11.0 | 9.5 | 2 | 2 | 9.5 | 1 | 12.5 | 1 | 1 | 12.5 | -1 | 11.5 | 1 | 1 | 11.5 | -1 | 11 | ○ |
| 12.0 | 13.5 | 2 | 2 | 13.5 | -1 | 12.5 | 1 | 1 | 12.5 | 1 | 11.5 | 1 | 1 | 11.5 | 1 | 12 | ○ |
| 13.0 | 13.5 | 2 | 2 | 13.5 | -1 | 14.5 | 1 | 1 | 14.5 | -1 | 13.5 | 1 | 1 | 13.5 | -1 | 13 | ○ |
| 14.0 | 13.5 | 2 | 2 | 13.5 | 1 | 14.5 | 1 | 1 | 14.5 | 1 | 13.5 | 1 | 1 | 13.5 | 1 | 14 | ○ |
| 15.0 | 13.5 | 2 | 2 | 13.5 | 1 | 16.5 | 1 | 1 | 16.5 | -1 | 15.5 | 1 | 1 | 15.5 | -1 | 15 | ○ |
| 16.0 | 17.5 | 2 | 2 | 17.5 | -1 | 16.5 | 1 | 1 | 16.5 | 1 | 15.5 | 1 | 1 | 15.5 | 1 | 16 | ○ |
| 17.0 | 17.5 | 2 | 2 | 17.5 | -1 | 18.5 | 1 | 1 | 18.5 | -1 | 17.5 | 1 | 1 | 17.5 | -1 | 17 | ○ |
| 18.0 | 17.5 | 2 | 2 | 17.5 | 1 | 18.5 | 1 | 1 | 18.5 | 1 | 17.5 | 1 | 1 | 17.5 | 1 | 18 | ○ |
| 19.0 | 17.5 | 2 | 2 | 17.5 | 1 | 20.5 | 1 | 1 | 20.5 | -1 | 19.5 | 1 | 1 | 19.5 | -1 | 19 | ○ |
| 20.0 | 21.5 | 2 | 2 | 21.5 | -1 | 20.5 | 1 | 1 | 20.5 | 1 | 19.5 | 1 | 1 | 19.5 | 1 | 20 | ○ |
| 21.0 | 21.5 | 2 | 2 | 21.5 | -1 | 22.5 | 1 | 1 | 22.5 | -1 | 21.5 | 1 | 1 | 21.5 | -1 | 21 | ○ |
| 22.0 | 21.5 | 2 | 2 | 21.5 | 1 | 22.5 | 1 | 1 | 22.5 | 1 | 21.5 | 1 | 1 | 21.5 | 1 | 22 | ○ |
| 23.0 | 21.5 | 2 | 2 | 21.5 | 1 | 24.5 | 1 | 1 | 24.5 | -1 | 23.5 | 1 | 1 | 23.5 | -1 | 23 | ○ |
| 24.0 | 25.5 | 2 | 2 | 25.5 | -1 | 24.5 | 1 | 1 | 24.5 | 1 | 23.5 | 1 | 1 | 23.5 | 1 | 24 | ○ |
| 25.0 | 25.5 | 2 | 2 | 25.5 | -1 | 24.5 | 1 | 1 | 24.5 | 1 | 25.5 | 1 | 1 | 25.5 | -1 | 25 | ○ |
| 26.0 | 25.5 | 2 | 2 | 25.5 | 1 | 26.5 | 1 | 1 | 26.5 | -1 | 25.5 | 1 | 1 | 25.5 | 1 | 26 | ○ |
| 27.0 | 25.5 | 2 | 2 | 25.5 | 1 | 26.5 | 1 | 1 | 26.5 | 1 | 27.5 | 1 | 1 | 27.5 | -1 | 27 | ○ |
| 28.0 | 29.5 | 2 | 2 | 29.5 | -1 | 28.5 | 1 | 1 | 28.5 | -1 | 27.5 | 1 | 1 | 27.5 | 1 | 28 | ○ |
| 29.0 | 29.5 | 2 | 2 | 29.5 | -1 | 28.5 | 1 | 1 | 28.5 | 1 | 29.5 | 1 | 1 | 29.5 | -1 | 29 | ○ |
| 30.0 | 29.5 | 2 | 2 | 29.5 | 1 | 30.5 | 1 | 1 | 30.5 | -1 | 29.5 | 0 | 0 | 29.5 | 1 | 30 | ○ |
| 31.0 | 29.5 | 2 | 2 | 29.5 | 1 | 30.5 | 1 | 1 | 30.5 | 1 | 30.5 | 0 | 0 | 30.5 | 1 | 31 | ○ |

FIG. 7

MAXIMUM CHARGING/DISCHARGING AMOUNT : 6 (LSB)

| VARIATION AMOUNT (LSB) | | | | | | | | | | | | | | | | | |
|---|---|---|---|---|---|---|---|---|---|---|---|---|---|---|---|---|---|
| | 1ST COMPARISON | | | 2ND COMPARISON | | | | | 3RD COMPARISON | | | | | 4TH COMPARISON | | | |
| | | | | 8 | | | | | 4 | | | | | 2 | | | |
| INPUT VOLTAGE (LSB) | COMPARISON REFERENCE VOLTAGE (LSB) | COMPARISON RESULT 1:INCREF -1:INCREF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:INCREF -1:INCREF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:INCREF -1:INCREF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:INCREF -1:INCREF |
| 0.0 | 15.5 | -1 | 7.5 | 8 | 6 | 9.5 | -1 | 3.5 | 6 | 6 | 3.5 | -1 | 1.5 | 2 | 2 | 1.5 | -1 |
| 1.0 | 15.5 | -1 | 7.5 | 8 | 6 | 9.5 | -1 | 3.5 | 6 | 6 | 3.5 | -1 | 1.5 | 2 | 2 | 1.5 | -1 |
| 2.0 | 15.5 | -1 | 7.5 | 8 | 6 | 9.5 | -1 | 3.5 | 6 | 6 | 3.5 | -1 | 1.5 | 2 | 2 | 1.5 | 1 |
| 3.0 | 15.5 | -1 | 7.5 | 8 | 6 | 9.5 | -1 | 3.5 | 6 | 6 | 3.5 | -1 | 1.5 | 2 | 2 | 1.5 | 1 |
| 4.0 | 15.5 | -1 | 7.5 | 8 | 6 | 9.5 | -1 | 3.5 | 6 | 6 | 3.5 | 1 | 5.5 | 2 | 2 | 5.5 | -1 |
| 5.0 | 15.5 | -1 | 7.5 | 8 | 6 | 9.5 | -1 | 3.5 | 6 | 6 | 3.5 | 1 | 5.5 | 2 | 2 | 5.5 | -1 |
| 6.0 | 15.5 | -1 | 7.5 | 8 | 6 | 9.5 | -1 | 3.5 | 6 | 6 | 3.5 | 1 | 5.5 | 2 | 2 | 5.5 | 1 |
| 7.0 | 15.5 | -1 | 7.5 | 8 | 6 | 9.5 | -1 | 3.5 | 6 | 6 | 3.5 | 1 | 5.5 | 2 | 2 | 5.5 | 1 |
| 8.0 | 15.5 | -1 | 7.5 | 8 | 6 | 9.5 | -1 | 3.5 | 6 | 2 | 11.5 | -1 | 9.5 | 2 | 2 | 9.5 | -1 |
| 9.0 | 15.5 | -1 | 7.5 | 8 | 6 | 9.5 | -1 | 3.5 | 6 | 2 | 11.5 | -1 | 9.5 | 2 | 2 | 9.5 | -1 |
| 10.0 | 15.5 | -1 | 7.5 | 8 | 6 | 9.5 | -1 | 3.5 | 6 | 2 | 11.5 | 1 | 13.5 | 2 | 2 | 13.5 | -1 |
| 11.0 | 15.5 | -1 | 7.5 | 8 | 6 | 9.5 | -1 | 3.5 | 6 | 2 | 11.5 | 1 | 13.5 | 2 | 2 | 13.5 | 1 |
| 12.0 | 15.5 | -1 | 7.5 | 8 | 6 | 9.5 | 1 | 11.5 | 2 | 2 | 11.5 | 1 | 13.5 | 2 | 2 | 13.5 | 1 |
| 13.0 | 15.5 | -1 | 7.5 | 8 | 6 | 9.5 | 1 | 11.5 | 2 | 2 | 11.5 | 1 | 13.5 | 2 | 2 | 13.5 | 1 |
| 14.0 | 15.5 | -1 | 7.5 | 8 | 6 | 9.5 | 1 | 11.5 | 2 | 2 | 11.5 | 1 | 13.5 | 2 | 2 | 13.5 | 1 |
| 15.0 | 15.5 | -1 | 7.5 | 8 | 6 | 9.5 | 1 | 11.5 | 2 | 2 | 11.5 | 1 | 13.5 | 2 | 2 | 13.5 | 1 |
| 16.0 | 15.5 | 1 | 23.5 | 8 | 6 | 21.5 | -1 | 19.5 | 2 | 2 | 19.5 | -1 | 17.5 | 2 | 2 | 17.5 | -1 |
| 17.0 | 15.5 | 1 | 23.5 | 8 | 6 | 21.5 | -1 | 19.5 | 2 | 2 | 19.5 | -1 | 17.5 | 2 | 2 | 17.5 | -1 |
| 18.0 | 15.5 | 1 | 23.5 | 8 | 6 | 21.5 | -1 | 19.5 | 2 | 2 | 19.5 | -1 | 17.5 | 2 | 2 | 17.5 | 1 |
| 19.0 | 15.5 | 1 | 23.5 | 8 | 6 | 21.5 | -1 | 19.5 | 2 | 2 | 19.5 | 1 | 21.5 | 2 | 2 | 21.5 | -1 |
| 20.0 | 15.5 | 1 | 23.5 | 8 | 6 | 21.5 | -1 | 19.5 | 2 | 2 | 19.5 | 1 | 21.5 | 2 | 2 | 21.5 | -1 |
| 21.0 | 15.5 | 1 | 23.5 | 8 | 6 | 21.5 | -1 | 19.5 | 2 | 2 | 19.5 | 1 | 21.5 | 2 | 2 | 21.5 | 1 |
| 22.0 | 15.5 | 1 | 23.5 | 8 | 6 | 21.5 | 1 | 27.5 | 6 | 6 | 27.5 | -1 | 25.5 | 2 | 2 | 25.5 | -1 |
| 23.0 | 15.5 | 1 | 23.5 | 8 | 6 | 21.5 | 1 | 27.5 | 6 | 6 | 27.5 | -1 | 25.5 | 2 | 2 | 25.5 | -1 |
| 24.0 | 15.5 | 1 | 23.5 | 8 | 6 | 21.5 | 1 | 27.5 | 6 | 6 | 27.5 | -1 | 25.5 | 2 | 2 | 25.5 | 1 |
| 25.0 | 15.5 | 1 | 23.5 | 8 | 6 | 21.5 | 1 | 27.5 | 6 | 6 | 27.5 | -1 | 25.5 | 2 | 2 | 25.5 | 1 |
| 26.0 | 15.5 | 1 | 23.5 | 8 | 6 | 21.5 | 1 | 27.5 | 6 | 6 | 27.5 | 1 | 29.5 | 2 | 2 | 29.5 | -1 |
| 27.0 | 15.5 | 1 | 23.5 | 8 | 6 | 21.5 | 1 | 27.5 | 6 | 6 | 27.5 | 1 | 29.5 | 2 | 2 | 29.5 | -1 |
| 28.0 | 15.5 | 1 | 23.5 | 8 | 6 | 21.5 | 1 | 27.5 | 6 | 6 | 27.5 | 1 | 29.5 | 2 | 2 | 29.5 | 1 |
| 29.0 | 15.5 | 1 | 23.5 | 8 | 6 | 21.5 | 1 | 27.5 | 6 | 6 | 27.5 | 1 | 29.5 | 2 | 2 | 29.5 | 1 |
| 30.0 | 15.5 | 1 | 23.5 | 8 | 6 | 21.5 | 1 | 27.5 | 6 | 6 | 27.5 | 1 | 29.5 | 2 | 2 | 29.5 | 1 |
| 31.0 | 15.5 | 1 | 23.5 | 8 | 6 | 21.5 | 1 | 27.5 | 6 | 6 | 27.5 | 1 | 29.5 | 2 | 2 | 29.5 | 1 |

FIG. 8

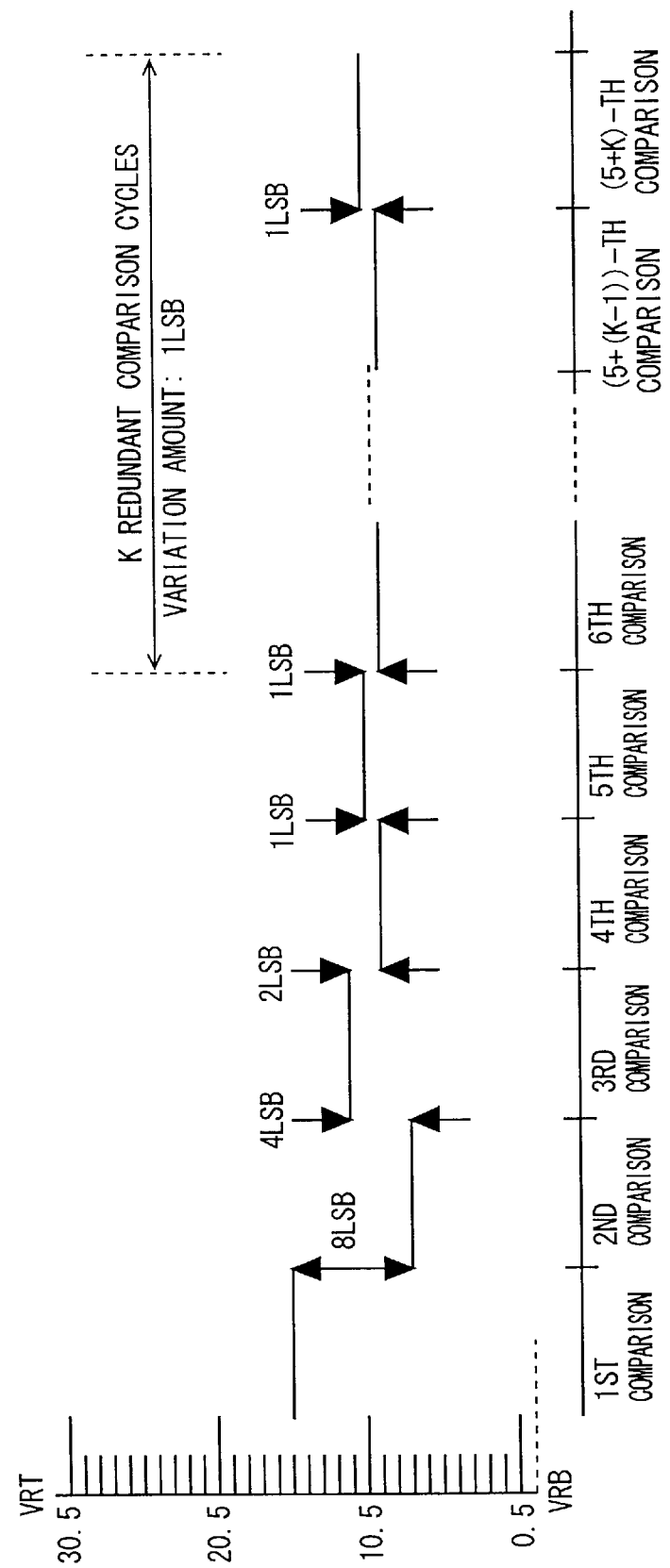
F I G. 9

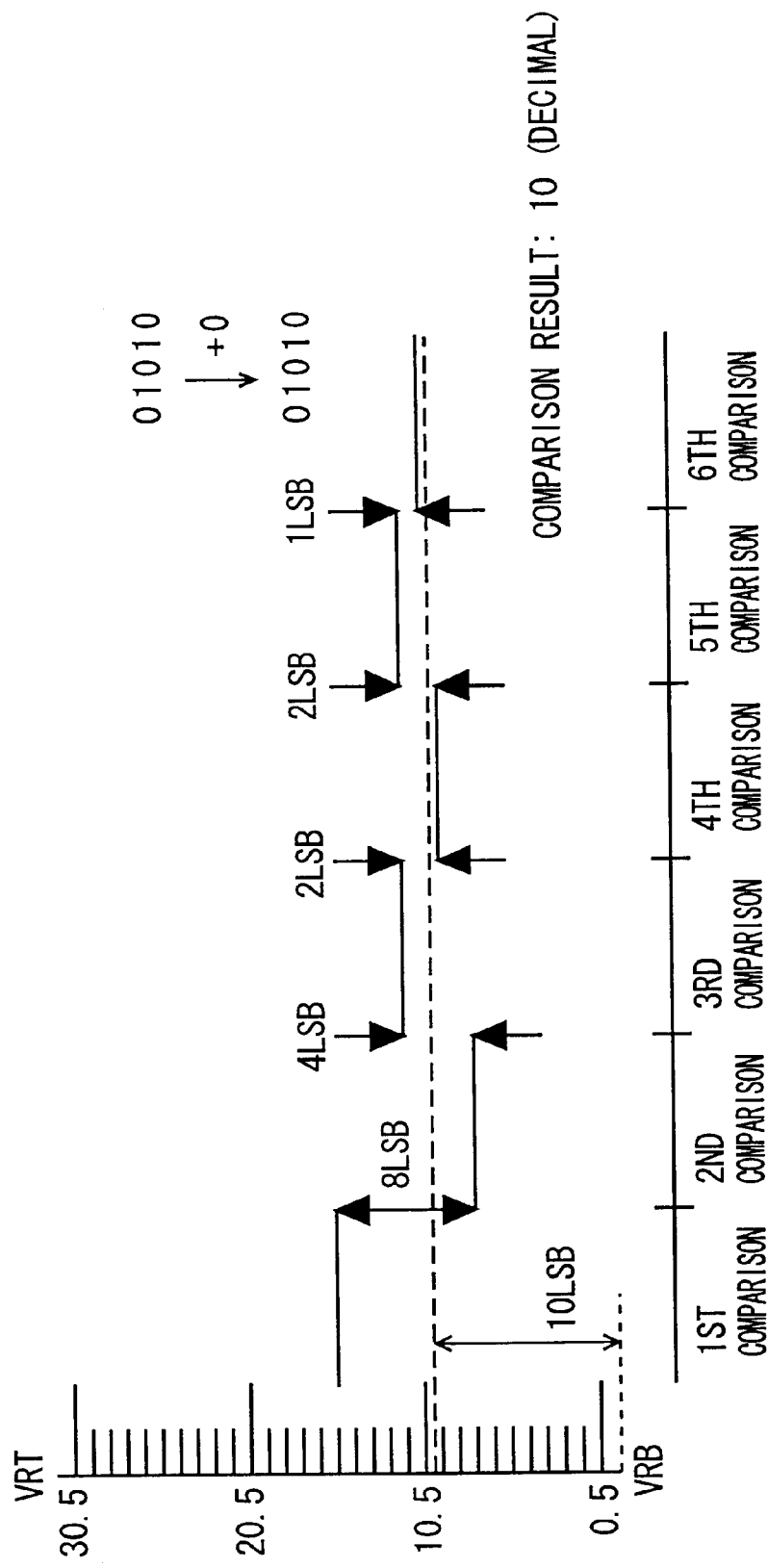

F I G. 1 1

| 4TH COMPARISON | 5TH COMPARISON | 6TH COMPARISON | OPERATION |
|---|---|---|---|
| 1 | 1 | -1 | +1 |
| 1 | 1 | 1 | +2 |
| -1 | -1 | 1 | -1 |
| -1 | -1 | -1 | -2 |

FIG. 12

MAXIMUM CHARGING/DISCHARGING AMOUNT: 6 (LSB)

| INPUT VOLTAGE (LSB) | VARIATION AMOUNT | | | | | | | | | | | | | | | | |
|---|---|---|---|---|---|---|---|---|---|---|---|---|---|---|---|---|---|
| | 1ST COMPARISON | | 2ND COMPARISON | | | | 3RD COMPARISON | | | | 4TH COMPARISON | | | |
| | | | 8 | | | | 4 | | | | 2 | | | |
| | COM-PARISON REFERENCE VOLTAGE (LSB) | COM-PARISON RESULT 1:IN>REF -1:IN<REF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:IN>REF -1:IN<REF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:IN>REF -1:IN<REF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:IN>REF -1:IN<REF |
| 0.0 | 15.5 | -1 | 7.5 | 8 | 6 | 9.5 | -1 | 3.5 | 6 | 6 | 3.5 | -1 | 1.5 | 2 | 2 | 1.5 | -1 |
| 1.0 | 15.5 | -1 | 7.5 | 8 | 6 | 9.5 | -1 | 3.5 | 6 | 6 | 3.5 | -1 | 1.5 | 2 | 2 | 1.5 | -1 |
| 2.0 | 15.5 | -1 | 7.5 | 8 | 6 | 9.5 | -1 | 3.5 | 6 | 6 | 3.5 | 1 | 1.5 | 2 | 2 | 1.5 | 1 |
| 3.0 | 15.5 | -1 | 7.5 | 8 | 6 | 9.5 | -1 | 3.5 | 6 | 6 | 3.5 | 1 | 1.5 | 2 | 2 | 1.5 | 1 |
| 4.0 | 15.5 | -1 | 7.5 | 8 | 6 | 9.5 | -1 | 3.5 | 6 | 6 | 3.5 | -1 | 5.5 | 2 | 2 | 5.5 | -1 |
| 5.0 | 15.5 | -1 | 7.5 | 8 | 6 | 9.5 | -1 | 3.5 | 6 | 6 | 3.5 | 1 | 5.5 | 2 | 2 | 5.5 | 1 |
| 6.0 | 15.5 | -1 | 7.5 | 8 | 6 | 9.5 | -1 | 3.5 | 6 | 6 | 3.5 | 1 | 5.5 | 2 | 2 | 5.5 | 1 |
| 7.0 | 15.5 | -1 | 7.5 | 8 | 6 | 9.5 | -1 | 3.5 | 6 | 6 | 3.5 | 1 | 5.5 | 2 | 2 | 5.5 | 1 |
| 8.0 | 15.5 | -1 | 7.5 | 8 | 6 | 9.5 | -1 | 3.5 | 6 | 6 | 3.5 | 1 | 5.5 | 2 | 2 | 5.5 | 1 |
| 9.0 | 15.5 | -1 | 7.5 | 8 | 6 | 9.5 | -1 | 3.5 | 6 | 6 | 3.5 | 1 | 5.5 | 2 | 2 | 5.5 | 1 |
| 10.0 | 15.5 | -1 | 7.5 | 8 | 6 | 9.5 | 1 | 11.5 | 6 | 2 | 11.5 | -1 | 9.5 | 2 | 2 | 9.5 | -1 |
| 11.0 | 15.5 | -1 | 7.5 | 8 | 6 | 9.5 | 1 | 11.5 | 6 | 2 | 11.5 | 1 | 9.5 | 2 | 2 | 9.5 | 1 |
| 12.0 | 15.5 | -1 | 7.5 | 8 | 6 | 9.5 | 1 | 11.5 | 6 | 2 | 11.5 | 1 | 13.5 | 2 | 2 | 13.5 | -1 |
| 13.0 | 15.5 | -1 | 7.5 | 8 | 6 | 9.5 | 1 | 11.5 | 6 | 2 | 11.5 | 1 | 13.5 | 2 | 2 | 13.5 | -1 |
| 14.0 | 15.5 | -1 | 7.5 | 8 | 6 | 9.5 | 1 | 11.5 | 6 | 2 | 11.5 | 1 | 13.5 | 2 | 2 | 13.5 | 1 |
| 15.0 | 15.5 | -1 | 7.5 | 8 | 6 | 9.5 | 1 | 11.5 | 6 | 2 | 11.5 | 1 | 13.5 | 2 | 2 | 13.5 | 1 |
| 16.0 | 15.5 | 1 | 23.5 | 8 | 6 | 21.5 | -1 | 19.5 | 6 | 2 | 19.5 | -1 | 17.5 | 2 | 2 | 17.5 | -1 |
| 17.0 | 15.5 | 1 | 23.5 | 8 | 6 | 21.5 | -1 | 19.5 | 6 | 2 | 19.5 | -1 | 17.5 | 2 | 2 | 17.5 | -1 |
| 18.0 | 15.5 | 1 | 23.5 | 8 | 6 | 21.5 | -1 | 19.5 | 6 | 2 | 19.5 | 1 | 17.5 | 2 | 2 | 17.5 | 1 |
| 19.0 | 15.5 | 1 | 23.5 | 8 | 6 | 21.5 | -1 | 19.5 | 6 | 2 | 19.5 | 1 | 17.5 | 2 | 2 | 17.5 | 1 |
| 20.0 | 15.5 | 1 | 23.5 | 8 | 6 | 21.5 | -1 | 19.5 | 6 | 2 | 19.5 | 1 | 21.5 | 2 | 2 | 21.5 | -1 |
| 21.0 | 15.5 | 1 | 23.5 | 8 | 6 | 21.5 | -1 | 19.5 | 6 | 2 | 19.5 | 1 | 21.5 | 2 | 2 | 21.5 | 1 |
| 22.0 | 15.5 | 1 | 23.5 | 8 | 6 | 21.5 | 1 | 27.5 | 6 | 6 | 25.5 | -1 | 25.5 | 2 | 2 | 25.5 | -1 |
| 23.0 | 15.5 | 1 | 23.5 | 8 | 6 | 21.5 | 1 | 27.5 | 6 | 6 | 27.5 | -1 | 25.5 | 2 | 2 | 25.5 | -1 |
| 24.0 | 15.5 | 1 | 23.5 | 8 | 6 | 21.5 | 1 | 27.5 | 6 | 6 | 27.5 | -1 | 25.5 | 2 | 2 | 25.5 | -1 |
| 25.0 | 15.5 | 1 | 23.5 | 8 | 6 | 21.5 | 1 | 27.5 | 6 | 6 | 27.5 | -1 | 25.5 | 2 | 2 | 25.5 | 1 |
| 26.0 | 15.5 | 1 | 23.5 | 8 | 6 | 21.5 | 1 | 27.5 | 6 | 6 | 27.5 | 1 | 25.5 | 2 | 2 | 25.5 | 1 |
| 27.0 | 15.5 | 1 | 23.5 | 8 | 6 | 21.5 | 1 | 27.5 | 6 | 6 | 27.5 | 1 | 29.5 | 2 | 2 | 29.5 | -1 |
| 28.0 | 15.5 | 1 | 23.5 | 8 | 6 | 21.5 | 1 | 27.5 | 6 | 6 | 27.5 | 1 | 29.5 | 2 | 2 | 29.5 | -1 |
| 29.0 | 15.5 | 1 | 23.5 | 8 | 6 | 21.5 | 1 | 27.5 | 6 | 6 | 27.5 | 1 | 29.5 | 2 | 2 | 29.5 | -1 |
| 30.0 | 15.5 | 1 | 23.5 | 8 | 6 | 21.5 | 1 | 27.5 | 6 | 6 | 27.5 | 1 | 29.5 | 2 | 2 | 29.5 | 1 |
| 31.0 | 15.5 | 1 | 23.5 | 8 | 6 | 21.5 | 1 | 27.5 | 6 | 6 | 27.5 | 1 | 29.5 | 2 | 2 | 29.5 | 1 |

FIG. 13

| INPUT VOLTAGE (LSB) | VARIATION AMOUNT (LSB) 2 | | | | | VARIATION AMOUNT (LSB) 1 | | | | | COMPARISON RESULT | ERROR TO INPUT |
|---|---|---|---|---|---|---|---|---|---|---|---|---|
| | 5TH COMPARISON | | | | | 6TH COMPARISON | | | | | | |
| | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN<REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN<REF -1:IN<REF | | |
| 0.0 | 0.5 | 1 | 1 | 0.5 | -1 | 0.5 | 0 | 0 | 0.5 | -1 | 0 | O |
| 1.0 | 0.5 | 1 | 1 | 0.5 | 1 | 1.5 | 1 | 1 | 1.5 | -1 | 1 | O |
| 2.0 | 3.5 | 2 | 2 | 3.5 | -1 | 2.5 | 1 | 1 | 2.5 | 1 | 2 | O |
| 3.0 | 3.5 | 2 | 2 | 3.5 | -1 | 2.5 | 1 | 1 | 2.5 | 1 | 3 | O |
| 4.0 | 3.5 | 2 | 2 | 3.5 | 1 | 4.5 | 1 | 1 | 4.5 | -1 | 4 | O |
| 5.0 | 3.5 | 2 | 2 | 3.5 | 1 | 4.5 | 1 | 1 | 4.5 | 1 | 5 | O |
| 6.0 | 7.5 | 2 | 2 | 7.5 | -1 | 6.5 | 1 | 1 | 6.5 | -1 | 6 | O |
| 7.0 | 7.5 | 2 | 2 | 7.5 | -1 | 6.5 | 1 | 1 | 6.5 | 1 | 7 | O |
| 8.0 | 7.5 | 2 | 2 | 7.5 | 1 | 8.5 | 1 | 1 | 8.5 | -1 | 8 | O |
| 9.0 | 7.5 | 2 | 2 | 7.5 | 1 | 8.5 | 1 | 1 | 8.5 | 1 | 9 | O |
| 10.0 | 11.5 | 2 | 2 | 11.5 | -1 | 10.5 | 1 | 1 | 10.5 | -1 | 10 | O |
| 11.0 | 11.5 | 2 | 2 | 11.5 | -1 | 10.5 | 1 | 1 | 10.5 | 1 | 11 | O |
| 12.0 | 11.5 | 2 | 2 | 11.5 | 1 | 12.5 | 1 | 1 | 12.5 | -1 | 12 | O |
| 13.0 | 11.5 | 2 | 2 | 11.5 | 1 | 12.5 | 1 | 1 | 12.5 | 1 | 13 | O |
| 14.0 | 15.5 | 2 | 2 | 15.5 | -1 | 14.5 | 1 | 1 | 14.5 | -1 | 14 | O |
| 15.0 | 15.5 | 2 | 2 | 15.5 | -1 | 14.5 | 1 | 1 | 14.5 | 1 | 15 | O |
| 16.0 | 15.5 | 2 | 2 | 15.5 | 1 | 16.5 | 1 | 1 | 16.5 | -1 | 16 | O |
| 17.0 | 15.5 | 2 | 2 | 15.5 | 1 | 16.5 | 1 | 1 | 16.5 | 1 | 17 | O |
| 18.0 | 19.5 | 2 | 2 | 19.5 | -1 | 18.5 | 1 | 1 | 18.5 | -1 | 18 | O |
| 19.0 | 19.5 | 2 | 2 | 19.5 | -1 | 18.5 | 1 | 1 | 18.5 | 1 | 19 | O |
| 20.0 | 19.5 | 2 | 2 | 19.5 | 1 | 20.5 | 1 | 1 | 20.5 | -1 | 20 | O |
| 21.0 | 19.5 | 2 | 2 | 19.5 | 1 | 20.5 | 1 | 1 | 20.5 | 1 | 21 | O |
| 22.0 | 23.5 | 2 | 2 | 23.5 | -1 | 22.5 | 1 | 1 | 22.5 | -1 | 22 | O |
| 23.0 | 23.5 | 2 | 2 | 23.5 | -1 | 22.5 | 1 | 1 | 22.5 | 1 | 23 | O |
| 24.0 | 23.5 | 2 | 2 | 23.5 | 1 | 24.5 | 1 | 1 | 24.5 | -1 | 24 | O |
| 25.0 | 23.5 | 2 | 2 | 23.5 | 1 | 24.5 | 1 | 1 | 24.5 | 1 | 25 | O |
| 26.0 | 27.5 | 2 | 2 | 27.5 | -1 | 26.5 | 1 | 1 | 26.5 | -1 | 26 | O |
| 27.0 | 27.5 | 2 | 2 | 27.5 | -1 | 26.5 | 1 | 1 | 26.5 | 1 | 27 | O |
| 28.0 | 27.5 | 2 | 2 | 27.5 | 1 | 28.5 | 1 | 1 | 28.5 | -1 | 28 | O |
| 29.0 | 27.5 | 2 | 2 | 27.5 | 1 | 28.5 | 1 | 1 | 28.5 | 1 | 29 | O |
| 30.0 | 30.5 | 1 | 1 | 30.5 | -1 | 29.5 | 1 | 1 | 29.5 | 1 | 30 | O |
| 31.0 | 30.5 | 1 | 1 | 30.5 | 1 | 30.5 | 0 | 0 | 30.5 | 1 | 31 | O |

FIG. 15

MAXIMUM CHARGING/DISCHARGING AMOUNT : 5 (LSB)

| VARIATION AMOUNT (LSB) | | | | | | | | | | | | | | | | | | |
|---|---|---|---|---|---|---|---|---|---|---|---|---|---|---|---|---|---|---|
| | 1ST COMPARISON | | | 2ND COMPARISON | | | | | 3RD COMPARISON | | | | | 4TH COMPARISON | | | | |
| | | | | 8 | | | | | 4 | | | | | 2 | | | | |
| INPUT VOLTAGE (LSB) | COMPARISON REFERENCE VOLTAGE (LSB) | COMPARISON RESULT 1:IN≥REF -1:IN<REF | | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN≥REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN≥REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN≥REF -1:IN<REF |
| 0.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 1.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 2.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 3.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 4.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 5.0 | 15.5 | -1 | | 7.5 | 8 | 5 | 10.5 | -1 | 3.5 | 7 | 5 | 5.5 | -1 | 1.5 | 4 | 4 | 1.5 | -1 |
| 6.0 | 15.5 | -1 | | 7.5 | 8 | 5 | 10.5 | -1 | 3.5 | 7 | 5 | 5.5 | 1 | 5.5 | 0 | 0 | 5.5 | 1 |
| 7.0 | 15.5 | -1 | | 7.5 | 8 | 5 | 10.5 | -1 | 3.5 | 7 | 5 | 5.5 | 1 | 5.5 | 0 | 0 | 5.5 | 1 |
| 8.0 | 15.5 | -1 | | 7.5 | 8 | 5 | 10.5 | -1 | 3.5 | 7 | 5 | 5.5 | 1 | 5.5 | 0 | 0 | 5.5 | 1 |
| 9.0 | 15.5 | -1 | | 7.5 | 8 | 5 | 10.5 | -1 | 3.5 | 7 | 5 | 5.5 | 1 | 5.5 | 0 | 0 | 5.5 | 1 |
| 10.0 | 15.5 | -1 | | 7.5 | 8 | 5 | 10.5 | -1 | 3.5 | 7 | 5 | 5.5 | 1 | 5.5 | 0 | 2 | 9.5 | 1 |
| 11.0 | 15.5 | -1 | | 7.5 | 8 | 5 | 10.5 | -1 | 11.5 | 1 | 1 | 11.5 | -1 | 9.5 | 2 | 2 | 13.5 | 1 |
| 12.0 | 15.5 | -1 | | 7.5 | 8 | 5 | 10.5 | -1 | 11.5 | 1 | 1 | 11.5 | -1 | 13.5 | 2 | 2 | 13.5 | 1 |
| 13.0 | 15.5 | -1 | | 7.5 | 8 | 5 | 10.5 | -1 | 11.5 | 1 | 1 | 11.5 | -1 | 13.5 | 2 | 2 | 13.5 | 1 |
| 14.0 | 15.5 | -1 | | 7.5 | 8 | 5 | 10.5 | -1 | 11.5 | 1 | 1 | 11.5 | -1 | 13.5 | 2 | 2 | 13.5 | 1 |
| 15.0 | 15.5 | -1 | | 7.5 | 8 | 5 | 10.5 | -1 | 11.5 | 1 | 1 | 11.5 | 1 | 17.5 | 2 | 2 | 17.5 | 1 |
| 16.0 | 15.5 | 1 | | 23.5 | 8 | 5 | 20.5 | -1 | 19.5 | 1 | 1 | 19.5 | -1 | 17.5 | 2 | 2 | 17.5 | 1 |
| 17.0 | 15.5 | 1 | | 23.5 | 8 | 5 | 20.5 | -1 | 19.5 | 1 | 1 | 19.5 | -1 | 17.5 | 2 | 2 | 17.5 | 1 |
| 18.0 | 15.5 | 1 | | 23.5 | 8 | 5 | 20.5 | -1 | 19.5 | 1 | 1 | 19.5 | -1 | 17.5 | 2 | 2 | 17.5 | 1 |
| 19.0 | 15.5 | 1 | | 23.5 | 8 | 5 | 20.5 | -1 | 19.5 | 1 | 1 | 19.5 | 1 | 21.5 | 2 | 2 | 21.5 | 1 |
| 20.0 | 15.5 | 1 | | 23.5 | 8 | 5 | 20.5 | 1 | 27.5 | 7 | 5 | 25.5 | -1 | 25.5 | 0 | 0 | 25.5 | 1 |
| 21.0 | 15.5 | 1 | | 23.5 | 8 | 5 | 20.5 | 1 | 27.5 | 7 | 5 | 25.5 | -1 | 25.5 | 0 | 0 | 25.5 | 1 |
| 22.0 | 15.5 | 1 | | 23.5 | 8 | 5 | 20.5 | 1 | 27.5 | 7 | 5 | 25.5 | -1 | 25.5 | 0 | 0 | 25.5 | 1 |
| 23.0 | 15.5 | 1 | | 23.5 | 8 | 5 | 20.5 | 1 | 27.5 | 7 | 5 | 25.5 | -1 | 25.5 | 0 | 0 | 25.5 | 1 |
| 24.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 25.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 26.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 27.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 28.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 29.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 30.0 | 15.5 | 1 | | 23.5 | 8 | 5 | 20.5 | 1 | 27.5 | 7 | 5 | 25.5 | 1 | 29.5 | 4 | 4 | 29.5 | 1 |
| 31.0 | 15.5 | 1 | | 23.5 | 8 | 5 | 20.5 | 1 | 27.5 | 7 | 5 | 25.5 | 1 | 29.5 | 4 | 4 | 29.5 | 1 |

FIG. 16

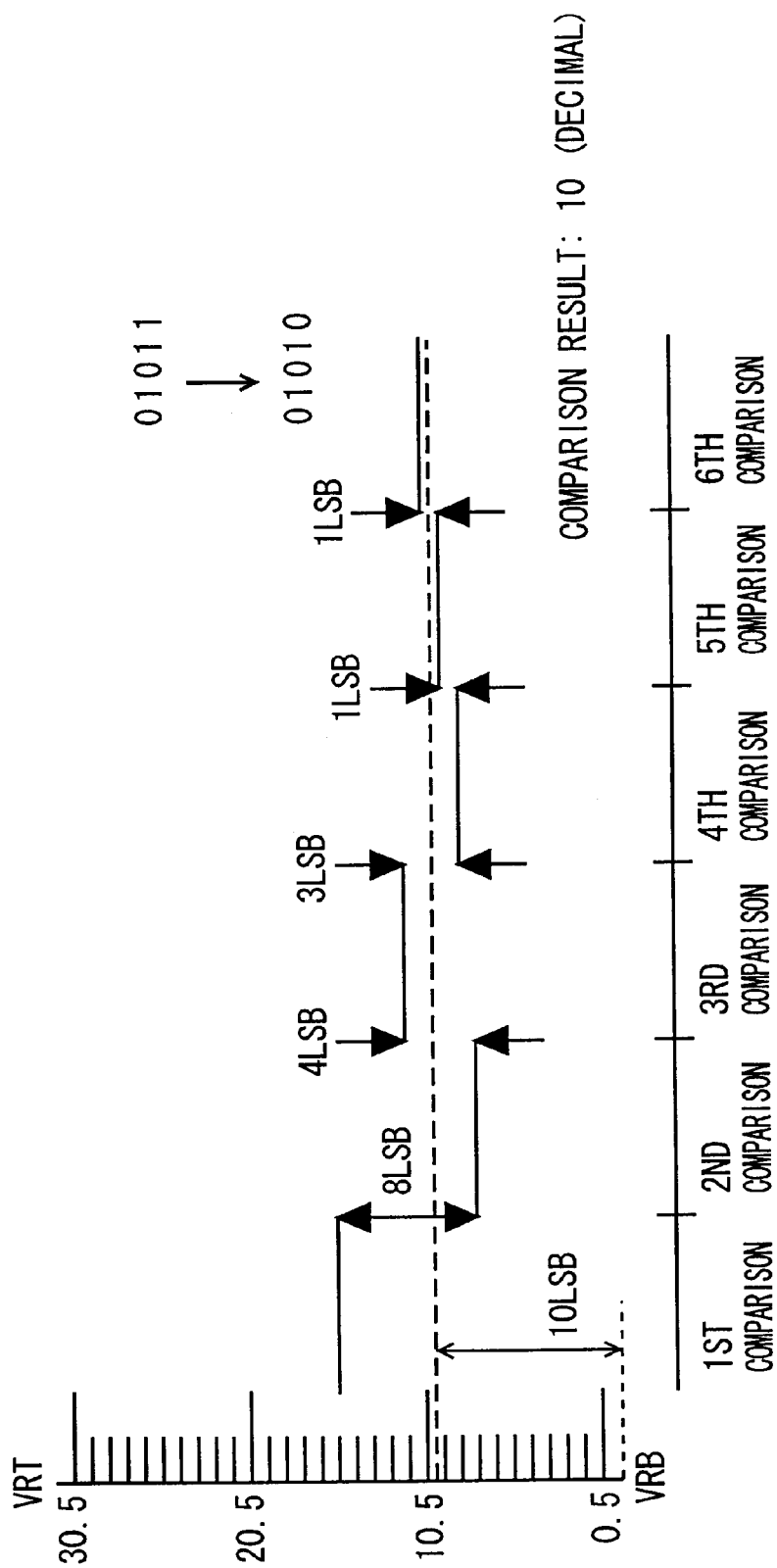

F I G. 1 8
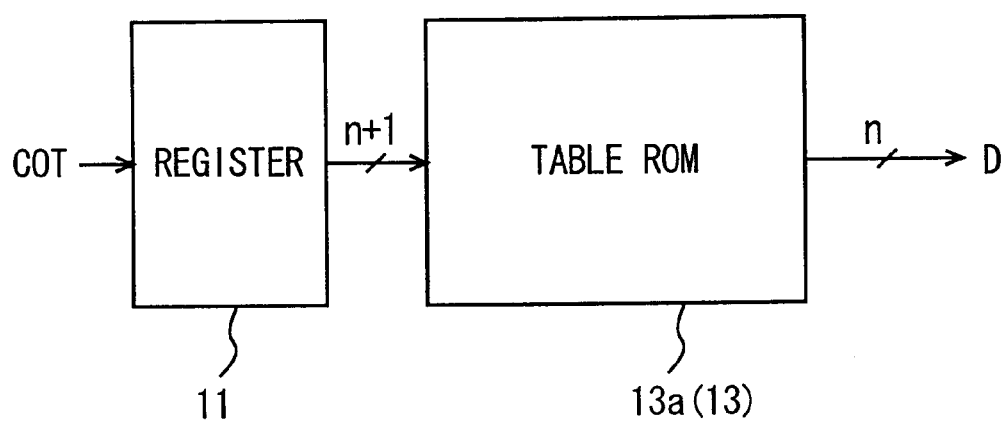

FIG. 19

MAXIMUM CHARGING/DISCHARGING AMOUNT : 6 (LSB)

| INPUT VOLTAGE (LSB) | VARIATION AMOUNT (LSB) | | | | | | | | | | | | |
|---|---|---|---|---|---|---|---|---|---|---|---|---|---|
| | 1ST COMPARISON | | 2ND COMPARISON 8 | | | | | 3RD COMPARISON 4 | | | | | |
| | COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | |
| 0.0 | 15.5 | -1 | 7.5 | 8 | 6 | 9.5 | -1 | 3.5 | 6 | 6 | 3.5 | -1 | |
| 1.0 | 15.5 | -1 | 7.5 | 8 | 6 | 9.5 | -1 | 3.5 | 6 | 6 | 3.5 | -1 | |
| 2.0 | 15.5 | -1 | 7.5 | 8 | 6 | 9.5 | -1 | 3.5 | 6 | 6 | 3.5 | -1 | |
| 3.0 | 15.5 | -1 | 7.5 | 8 | 6 | 9.5 | -1 | 3.5 | 6 | 6 | 3.5 | -1 | |
| 4.0 | 15.5 | -1 | 7.5 | 8 | 6 | 9.5 | -1 | 3.5 | 6 | 6 | 3.5 | -1 | |
| 5.0 | 15.5 | -1 | 7.5 | 8 | 6 | 9.5 | -1 | 3.5 | 6 | 6 | 3.5 | -1 | |
| 6.0 | 15.5 | -1 | 7.5 | 8 | 6 | 9.5 | -1 | 3.5 | 6 | 6 | 3.5 | -1 | |
| 7.0 | 15.5 | -1 | 7.5 | 8 | 6 | 9.5 | -1 | 3.5 | 6 | 6 | 3.5 | -1 | |
| 8.0 | 15.5 | -1 | 7.5 | 8 | 6 | 9.5 | -1 | 3.5 | 6 | 6 | 3.5 | -1 | |
| 9.0 | 15.5 | -1 | 7.5 | 8 | 6 | 9.5 | -1 | 3.5 | 6 | 6 | 3.5 | -1 | |
| 10.0 | 15.5 | -1 | 7.5 | 8 | 6 | 9.5 | -1 | 11.5 | 2 | 2 | 11.5 | -1 | |
| 11.0 | 15.5 | -1 | 7.5 | 8 | 6 | 9.5 | 1 | 11.5 | 2 | 2 | 11.5 | -1 | |
| 12.0 | 15.5 | -1 | 7.5 | 8 | 6 | 9.5 | 1 | 11.5 | 2 | 2 | 11.5 | -1 | |
| 13.0 | 15.5 | -1 | 7.5 | 8 | 6 | 9.5 | 1 | 11.5 | 2 | 2 | 11.5 | -1 | |
| 14.0 | 15.5 | -1 | 7.5 | 8 | 6 | 9.5 | 1 | 11.5 | 2 | 2 | 11.5 | -1 | |
| 15.0 | 15.5 | -1 | 7.5 | 8 | 6 | 9.5 | 1 | 11.5 | 2 | 2 | 11.5 | 1 | |
| 16.0 | 15.5 | 1 | 23.5 | 8 | 6 | 21.5 | -1 | 19.5 | 2 | 2 | 19.5 | -1 | |
| 17.0 | 15.5 | 1 | 23.5 | 8 | 6 | 21.5 | -1 | 19.5 | 2 | 2 | 19.5 | -1 | |
| 18.0 | 15.5 | 1 | 23.5 | 8 | 6 | 21.5 | -1 | 19.5 | 2 | 2 | 19.5 | -1 | |
| 19.0 | 15.5 | 1 | 23.5 | 8 | 6 | 21.5 | -1 | 19.5 | 2 | 2 | 19.5 | -1 | |
| 20.0 | 15.5 | 1 | 23.5 | 8 | 6 | 21.5 | -1 | 19.5 | 2 | 2 | 19.5 | 1 | |
| 21.0 | 15.5 | 1 | 23.5 | 8 | 6 | 21.5 | -1 | 27.5 | 6 | 6 | 27.5 | -1 | |
| 22.0 | 15.5 | 1 | 23.5 | 8 | 6 | 21.5 | 1 | 27.5 | 6 | 6 | 27.5 | -1 | |
| 23.0 | 15.5 | 1 | 23.5 | 8 | 6 | 21.5 | 1 | 27.5 | 6 | 6 | 27.5 | -1 | |
| 24.0 | 15.5 | 1 | 23.5 | 8 | 6 | 21.5 | 1 | 27.5 | 6 | 6 | 27.5 | -1 | |
| 25.0 | 15.5 | 1 | 23.5 | 8 | 6 | 21.5 | 1 | 27.5 | 6 | 6 | 27.5 | -1 | |
| 26.0 | 15.5 | 1 | 23.5 | 8 | 6 | 21.5 | 1 | 27.5 | 6 | 6 | 27.5 | -1 | |
| 27.0 | 15.5 | 1 | 23.5 | 8 | 6 | 21.5 | 1 | 27.5 | 6 | 6 | 27.5 | -1 | |
| 28.0 | 15.5 | 1 | 23.5 | 8 | 6 | 21.5 | 1 | 27.5 | 6 | 6 | 27.5 | 1 | |
| 29.0 | 15.5 | 1 | 23.5 | 8 | 6 | 21.5 | 1 | 27.5 | 6 | 6 | 27.5 | 1 | |
| 30.0 | 15.5 | 1 | 23.5 | 8 | 6 | 21.5 | 1 | 27.5 | 6 | 6 | 27.5 | 1 | |
| 31.0 | 15.5 | 1 | 23.5 | 8 | 6 | 21.5 | 1 | 27.5 | 6 | 6 | 27.5 | 1 | |

FIG. 20

| VARIATION AMOUNT (LSB) | | 3 (LSB) | | | | | 1 (LSB) | | | | | 1 (LSB) | | | | | |
|---|---|---|---|---|---|---|---|---|---|---|---|---|---|---|---|---|---|
| | | 4TH COMPARISON | | | | | 5TH COMPARISON | | | | | 6TH COMPARISON | | | | | |
| INPUT VOLTAGE (LSB) | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INCREF -1:INCREF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INCREF -1:INCREF | COM-PARISON REFERENCE VOLTAGE (LSB) | REQUIRED VARIATION AMOUNT | ACTUAL VARIATION AMOUNT | ACTUAL COM-PARISON REFERENCE VOLTAGE (LSB) | COM-PARISON RESULT 1:INCREF -1:INCREF | COM-PARISON RESULT | ERROR TO INPUT |
| 0.0 | 0.5 | 3 | 3 | 0.5 | -1 | 0.5 | 0 | 0 | 0.5 | -1 | 0.5 | 0 | 0 | 0.5 | -1 | 0 | 0 |
| 1.0 | 0.5 | 3 | 3 | 0.5 | 1 | 1.5 | 1 | 1 | 1.5 | -1 | 0.5 | 1 | 1 | 0.5 | 1 | 1 | 0 |
| 2.0 | 0.5 | 3 | 3 | 0.5 | 1 | 1.5 | 1 | 1 | 1.5 | 1 | 2.5 | 1 | 1 | 2.5 | -1 | 2 | 0 |
| 3.0 | 0.5 | 3 | 3 | 0.5 | 1 | 1.5 | 1 | 1 | 1.5 | 1 | 2.5 | 1 | 1 | 2.5 | 1 | 3 | 0 |
| 4.0 | 6.5 | 3 | 3 | 6.5 | -1 | 5.5 | 1 | 1 | 5.5 | -1 | 4.5 | 1 | 1 | 4.5 | -1 | 4 | 0 |
| 5.0 | 6.5 | 3 | 3 | 6.5 | -1 | 5.5 | 1 | 1 | 5.5 | 1 | 4.5 | 1 | 1 | 4.5 | 1 | 5 | 0 |
| 6.0 | 6.5 | 3 | 3 | 6.5 | -1 | 5.5 | 1 | 1 | 5.5 | 1 | 6.5 | 1 | 1 | 6.5 | -1 | 6 | 0 |
| 7.0 | 6.5 | 3 | 3 | 6.5 | 1 | 7.5 | 1 | 1 | 7.5 | -1 | 6.5 | 1 | 1 | 6.5 | 1 | 7 | 0 |
| 8.0 | 6.5 | 3 | 3 | 6.5 | 1 | 7.5 | 1 | 1 | 7.5 | 1 | 8.5 | 1 | 1 | 8.5 | -1 | 8 | 0 |
| 9.0 | 6.5 | 3 | 3 | 6.5 | 1 | 7.5 | 1 | 1 | 7.5 | 1 | 8.5 | 1 | 1 | 8.5 | 1 | 9 | 0 |
| 10.0 | 8.8 | 3 | 3 | 8.5 | 1 | 9.5 | 1 | 1 | 9.5 | -1 | 10.5 | 1 | 1 | 10.5 | -1 | 10 | 0 |
| 11.0 | 8.5 | 3 | 3 | 8.5 | 1 | 9.5 | 1 | 1 | 9.5 | 1 | 10.5 | 1 | 1 | 10.5 | 1 | 11 | 0 |
| 12.0 | 14.5 | 3 | 3 | 14.5 | -1 | 13.5 | 1 | 1 | 13.5 | -1 | 12.5 | 1 | 1 | 12.5 | -1 | 12 | 0 |
| 13.0 | 14.5 | 3 | 3 | 14.5 | -1 | 13.5 | 1 | 1 | 13.5 | 1 | 12.5 | 1 | 1 | 12.5 | 1 | 13 | 0 |
| 14.0 | 14.5 | 3 | 3 | 14.5 | -1 | 13.5 | 1 | 1 | 13.5 | 1 | 14.5 | 1 | 1 | 14.5 | -1 | 14 | 0 |
| 15.0 | 14.5 | 3 | 3 | 14.5 | 1 | 15.5 | 1 | 1 | 15.5 | -1 | 14.5 | 1 | 1 | 14.5 | 1 | 15 | 0 |
| 16.0 | 16.5 | 3 | 3 | 16.5 | -1 | 15.5 | 1 | 1 | 15.5 | 1 | 16.5 | 1 | 1 | 16.5 | -1 | 16 | 0 |
| 17.0 | 16.5 | 3 | 3 | 16.5 | 1 | 17.5 | 1 | 1 | 17.5 | -1 | 16.5 | 1 | 1 | 16.5 | 1 | 17 | 0 |
| 18.0 | 16.5 | 3 | 3 | 16.5 | 1 | 17.5 | 1 | 1 | 17.5 | 1 | 18.5 | 1 | 1 | 18.5 | -1 | 18 | 0 |
| 19.0 | 16.5 | 3 | 3 | 16.5 | 1 | 17.5 | 1 | 1 | 17.5 | 1 | 18.5 | 1 | 1 | 18.5 | 1 | 19 | 0 |
| 20.0 | 22.5 | 3 | 3 | 22.5 | -1 | 21.5 | 1 | 1 | 21.5 | -1 | 20.5 | 1 | 1 | 20.5 | -1 | 20 | 0 |
| 21.0 | 22.5 | 3 | 3 | 22.5 | -1 | 21.5 | 1 | 1 | 21.5 | 1 | 20.5 | 1 | 1 | 20.5 | 1 | 21 | 0 |
| 22.0 | 24.5 | 3 | 3 | 24.5 | -1 | 23.5 | 1 | 1 | 23.5 | -1 | 22.5 | 1 | 1 | 22.5 | -1 | 22 | 0 |
| 23.0 | 24.5 | 3 | 3 | 24.5 | -1 | 23.5 | 1 | 1 | 23.5 | 1 | 22.5 | 1 | 1 | 22.5 | 1 | 23 | 0 |
| 24.0 | 24.5 | 3 | 3 | 24.5 | -1 | 23.5 | 1 | 1 | 23.5 | 1 | 24.5 | 1 | 1 | 24.5 | -1 | 24 | 0 |
| 25.0 | 24.5 | 3 | 3 | 24.5 | 1 | 25.5 | 1 | 1 | 25.5 | -1 | 24.5 | 1 | 1 | 24.5 | 1 | 25 | 0 |
| 26.0 | 24.5 | 3 | 3 | 24.5 | 1 | 25.5 | 1 | 1 | 25.5 | 1 | 26.5 | 1 | 1 | 26.5 | -1 | 26 | 0 |
| 27.0 | 24.5 | 3 | 3 | 24.5 | 1 | 25.5 | 1 | 1 | 25.5 | 1 | 26.5 | 1 | 1 | 26.5 | 1 | 27 | 0 |
| 28.0 | 30.5 | 3 | 3 | 30.5 | -1 | 29.5 | 1 | 1 | 29.5 | -1 | 28.5 | 1 | 1 | 28.5 | -1 | 28 | 0 |
| 29.0 | 30.5 | 3 | 3 | 30.5 | -1 | 29.5 | 1 | 1 | 29.5 | 1 | 28.5 | 1 | 1 | 28.5 | 1 | 29 | 0 |
| 30.0 | 30.5 | 3 | 3 | 30.5 | -1 | 29.5 | 1 | 1 | 29.5 | 1 | 30.5 | 0 | 0 | 30.5 | -1 | 30 | 0 |
| 31.0 | 30.5 | 3 | 3 | 30.5 | 1 | 30.5 | 0 | 0 | 30.5 | 1 | 30.5 | 0 | 0 | 30.5 | 1 | 31 | 0 |

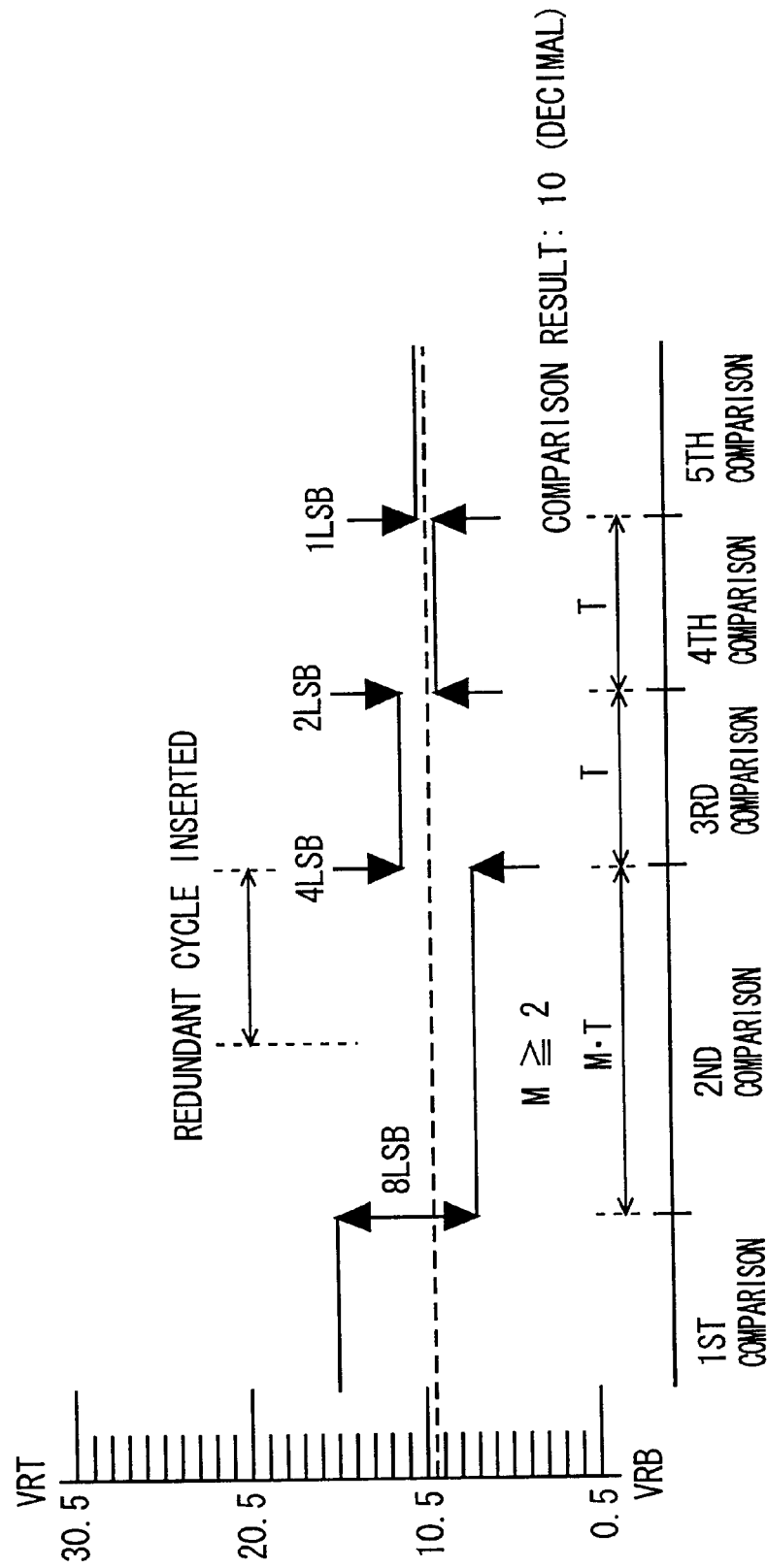

FIG. 29    PRIOR ART

MAXIMUM CHARGING/DISCHARGING AMOUNT : 8 (LSB)

| VARIATION AMOUNT (LSB) | | 8 | | | | | 4 | | | | |
|---|---|---|---|---|---|---|---|---|---|---|---|
| 1ST COMPARISON | | 2ND COMPARISON | | | | | 3RD COMPARISON | | | | |
| INPUT VOLTAGE (LSB) | COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF |
| 0.0 | 15.5 | -1 | 7.5 | 8 | 8 | 7.5 | -1 | 3.5 | 4 | 4 | 3.5 | -1 |
| 1.0 | 15.5 | -1 | 7.5 | 8 | 8 | 7.5 | -1 | 3.5 | 4 | 4 | 3.5 | -1 |
| 2.0 | 15.5 | -1 | 7.5 | 8 | 8 | 7.5 | -1 | 3.5 | 4 | 4 | 3.5 | -1 |
| 3.0 | 15.5 | -1 | 7.5 | 8 | 8 | 7.5 | -1 | 3.5 | 4 | 4 | 3.5 | -1 |
| 4.0 | 15.5 | -1 | 7.5 | 8 | 8 | 7.5 | -1 | 3.5 | 4 | 4 | 3.5 | -1 |
| 5.0 | 15.5 | -1 | 7.5 | 8 | 8 | 7.5 | -1 | 3.5 | 4 | 4 | 3.5 | -1 |
| 6.0 | 15.5 | -1 | 7.5 | 8 | 8 | 7.5 | -1 | 3.5 | 4 | 4 | 3.5 | -1 |
| 7.0 | 15.5 | -1 | 7.5 | 8 | 8 | 7.5 | -1 | 3.5 | 4 | 4 | 3.5 | -1 |
| 8.0 | 15.5 | -1 | 7.5 | 8 | 8 | 7.5 | 1 | 11.5 | 4 | 4 | 11.5 | -1 |
| 9.0 | 15.5 | -1 | 7.5 | 8 | 8 | 7.5 | 1 | 11.5 | 4 | 4 | 11.5 | -1 |
| 10.0 | 15.5 | -1 | 7.5 | 8 | 8 | 7.5 | 1 | 11.5 | 4 | 4 | 11.5 | -1 |
| 11.0 | 15.5 | -1 | 7.5 | 8 | 8 | 7.5 | 1 | 11.5 | 4 | 4 | 11.5 | -1 |
| 12.0 | 15.5 | -1 | 7.5 | 8 | 8 | 7.5 | 1 | 11.5 | 4 | 4 | 11.5 | 1 |
| 13.0 | 15.5 | -1 | 7.5 | 8 | 8 | 7.5 | 1 | 11.5 | 4 | 4 | 11.5 | 1 |
| 14.0 | 15.5 | -1 | 7.5 | 8 | 8 | 7.5 | 1 | 11.5 | 4 | 4 | 11.5 | 1 |
| 15.0 | 15.5 | -1 | 7.5 | 8 | 8 | 7.5 | 1 | 11.5 | 4 | 4 | 11.5 | 1 |
| 16.0 | 15.5 | 1 | 23.5 | 8 | 8 | 23.5 | -1 | 19.5 | 4 | 4 | 19.5 | 1 |
| 17.0 | 15.5 | 1 | 23.5 | 8 | 8 | 23.5 | -1 | 19.5 | 4 | 4 | 19.5 | 1 |
| 18.0 | 15.5 | 1 | 23.5 | 8 | 8 | 23.5 | -1 | 19.5 | 4 | 4 | 19.5 | 1 |
| 19.0 | 15.5 | 1 | 23.5 | 8 | 8 | 23.5 | -1 | 19.5 | 4 | 4 | 19.5 | 1 |
| 20.0 | 15.5 | 1 | 23.5 | 8 | 8 | 23.5 | -1 | 19.5 | 4 | 4 | 19.5 | 1 |
| 21.0 | 15.5 | 1 | 23.5 | 8 | 8 | 23.5 | -1 | 19.5 | 4 | 4 | 19.5 | 1 |
| 22.0 | 15.5 | 1 | 23.5 | 8 | 8 | 23.5 | -1 | 19.5 | 4 | 4 | 19.5 | 1 |
| 23.0 | 15.5 | 1 | 23.5 | 8 | 8 | 23.5 | -1 | 19.5 | 4 | 4 | 19.5 | 1 |
| 24.0 | 15.5 | 1 | 23.5 | 8 | 8 | 23.5 | 1 | 27.5 | 4 | 4 | 27.5 | 1 |
| 25.0 | 15.5 | 1 | 23.5 | 8 | 8 | 23.5 | 1 | 27.5 | 4 | 4 | 27.5 | 1 |
| 26.0 | 15.5 | 1 | 23.5 | 8 | 8 | 23.5 | 1 | 27.5 | 4 | 4 | 27.5 | 1 |
| 27.0 | 15.5 | 1 | 23.5 | 8 | 8 | 23.5 | 1 | 27.5 | 4 | 4 | 27.5 | 1 |
| 28.0 | 15.5 | 1 | 23.5 | 8 | 8 | 23.5 | 1 | 27.5 | 4 | 4 | 27.5 | 1 |
| 29.0 | 15.5 | 1 | 23.5 | 8 | 8 | 23.5 | 1 | 27.5 | 4 | 4 | 27.5 | 1 |
| 30.0 | 15.5 | 1 | 23.5 | 8 | 8 | 23.5 | 1 | 27.5 | 4 | 4 | 27.5 | 1 |
| 31.0 | 15.5 | 1 | 23.5 | 8 | 8 | 23.5 | 1 | 27.5 | 4 | 4 | 27.5 | 1 |

FIG. 30  PRIOR ART

| VARIATION AMOUNT (LSB) | 2 | | | | | 1 | | | | | OUTPUT | |
|---|---|---|---|---|---|---|---|---|---|---|---|---|
| | 4TH COMPARISON | | | | | 5TH COMPARISON | | | | | | |
| INPUT VOLTAGE (LSB) | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:IN>REF -1:IN<REF | COMPARISON RESULT | ERROR TO INPUT |
| 0.0 | 1.5 | 2 | 2 | 1.5 | -1 | 0.5 | 1 | 1 | 0.5 | -1 | 0 | 0 |
| 1.0 | 1.5 | 2 | 2 | 1.5 | -1 | 0.5 | 1 | 1 | 0.5 | 1 | 1 | 0 |
| 2.0 | 1.5 | 2 | 2 | 1.5 | 1 | 2.5 | 1 | 1 | 2.5 | -1 | 2 | 0 |
| 3.0 | 1.5 | 2 | 2 | 1.5 | 1 | 2.5 | 1 | 1 | 2.5 | 1 | 3 | 0 |
| 4.0 | 5.5 | 2 | 2 | 5.5 | -1 | 4.5 | 1 | 1 | 4.5 | -1 | 4 | 0 |
| 5.0 | 5.5 | 2 | 2 | 5.5 | -1 | 4.5 | 1 | 1 | 4.5 | 1 | 5 | 0 |
| 6.0 | 5.5 | 2 | 2 | 5.5 | 1 | 6.5 | 1 | 1 | 6.5 | -1 | 6 | 0 |
| 7.0 | 5.5 | 2 | 2 | 5.5 | 1 | 6.5 | 1 | 1 | 6.5 | 1 | 7 | 0 |
| 8.0 | 9.5 | 2 | 2 | 9.5 | -1 | 8.5 | 1 | 1 | 8.5 | -1 | 8 | 0 |
| 9.0 | 9.5 | 2 | 2 | 9.5 | -1 | 8.5 | 1 | 1 | 8.5 | 1 | 9 | 0 |
| 10.0 | 9.5 | 2 | 2 | 9.5 | 1 | 10.5 | 1 | 1 | 10.5 | -1 | 10 | 0 |
| 11.0 | 9.5 | 2 | 2 | 9.5 | 1 | 10.5 | 1 | 1 | 10.5 | 1 | 11 | 0 |
| 12.0 | 13.5 | 2 | 2 | 13.5 | -1 | 12.5 | 1 | 1 | 12.5 | -1 | 12 | 0 |
| 13.0 | 13.5 | 2 | 2 | 13.5 | -1 | 12.5 | 1 | 1 | 12.5 | 1 | 13 | 0 |
| 14.0 | 13.5 | 2 | 2 | 13.5 | 1 | 14.5 | 1 | 1 | 14.5 | -1 | 14 | 0 |
| 15.0 | 13.5 | 2 | 2 | 13.5 | 1 | 14.5 | 1 | 1 | 14.5 | 1 | 15 | 0 |
| 16.0 | 17.5 | 2 | 2 | 17.5 | -1 | 16.5 | 1 | 1 | 16.5 | -1 | 16 | 0 |
| 17.0 | 17.5 | 2 | 2 | 17.5 | -1 | 16.5 | 1 | 1 | 16.5 | 1 | 17 | 0 |
| 18.0 | 17.5 | 2 | 2 | 17.5 | 1 | 18.5 | 1 | 1 | 18.5 | -1 | 18 | 0 |
| 19.0 | 17.5 | 2 | 2 | 17.5 | 1 | 18.5 | 1 | 1 | 18.5 | 1 | 19 | 0 |
| 20.0 | 21.5 | 2 | 2 | 21.5 | -1 | 20.5 | 1 | 1 | 20.5 | -1 | 20 | 0 |
| 21.0 | 21.5 | 2 | 2 | 21.5 | -1 | 20.5 | 1 | 1 | 20.5 | 1 | 21 | 0 |
| 22.0 | 21.5 | 2 | 2 | 21.5 | 1 | 22.5 | 1 | 1 | 22.5 | -1 | 22 | 0 |
| 23.0 | 21.5 | 2 | 2 | 21.5 | 1 | 22.5 | 1 | 1 | 22.5 | 1 | 23 | 0 |
| 24.0 | 25.5 | 2 | 2 | 25.5 | -1 | 24.5 | 1 | 1 | 24.5 | -1 | 24 | 0 |
| 25.0 | 25.5 | 2 | 2 | 25.5 | -1 | 24.5 | 1 | 1 | 24.5 | 1 | 25 | 0 |
| 26.0 | 25.5 | 2 | 2 | 25.5 | 1 | 26.5 | 1 | 1 | 26.5 | -1 | 26 | 0 |
| 27.0 | 25.5 | 2 | 2 | 25.5 | 1 | 26.5 | 1 | 1 | 26.5 | 1 | 27 | 0 |
| 28.0 | 29.5 | 2 | 2 | 29.5 | -1 | 28.5 | 1 | 1 | 28.5 | -1 | 28 | 0 |
| 29.0 | 29.5 | 2 | 2 | 29.5 | -1 | 28.5 | 1 | 1 | 28.5 | 1 | 29 | 0 |
| 30.0 | 29.5 | 2 | 2 | 29.5 | 1 | 30.5 | 1 | 1 | 30.5 | -1 | 30 | 0 |
| 31.0 | 29.5 | 2 | 2 | 29.5 | 1 | 30.5 | 1 | 1 | 30.5 | 1 | 31 | 0 |

FIG. 31  PRIOR ART

MAXIMUM CHARGING/DISCHARGING AMOUNT : 7 (LSB)
VARIATION AMOUNT (LSB)

| INPUT VOLTAGE (LSB) | 1ST COMPARISON | | 2ND COMPARISON 8 | | | | | 3RD COMPARISON 4 | | | | |
|---|---|---|---|---|---|---|---|---|---|---|---|---|
| | COMPARISON REFERENCE VOLTAGE (LSB) | COMPARISON RESULT 1:INCREF -1:INKREF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:INCREF -1:INKREF | COMPARISON REFERENCE VOLTAGE (LSB) | REQUIRED VARIATION AMOUNT | ACTUAL VARIATION AMOUNT | ACTUAL COMPARISON REFERENCE VOLTAGE (LSB) | COMPARISON RESULT 1:INCREF -1:INKREF |
| 0.0 | 15.5 | -1 | 7.5 | 8 | 7 | 8.5 | -1 | 3.5 | 5 | 5 | 3.5 | -1 |
| 1.0 | 15.5 | -1 | 7.5 | 8 | 7 | 8.5 | -1 | 3.5 | 5 | 5 | 3.5 | -1 |
| 2.0 | 15.5 | -1 | 7.5 | 8 | 7 | 8.5 | -1 | 3.5 | 5 | 5 | 3.5 | -1 |
| 3.0 | 15.5 | -1 | 7.5 | 8 | 7 | 8.5 | -1 | 3.5 | 5 | 5 | 3.5 | -1 |
| 4.0 | 15.5 | -1 | 7.5 | 8 | 7 | 8.5 | -1 | 3.5 | 5 | 5 | 3.5 | -1 |
| 5.0 | 15.5 | -1 | 7.5 | 8 | 7 | 8.5 | -1 | 3.5 | 5 | 5 | 3.5 | 1 |
| 6.0 | 15.5 | -1 | 7.5 | 8 | 7 | 8.5 | -1 | 3.5 | 5 | 5 | 3.5 | 1 |
| 7.0 | 15.5 | -1 | 7.5 | 8 | 7 | 8.5 | -1 | 3.5 | 5 | 5 | 3.5 | 1 |
| 8.0 | 15.5 | -1 | 7.5 | 8 | 7 | 8.5 | -1 | 11.5 | 3 | 3 | 11.5 | -1 |
| 9.0 | 15.5 | -1 | 7.5 | 8 | 7 | 8.5 | -1 | 11.5 | 3 | 3 | 11.5 | -1 |
| 10.0 | 15.5 | -1 | 7.5 | 8 | 7 | 8.5 | -1 | 11.5 | 3 | 3 | 11.5 | -1 |
| 11.0 | 15.5 | -1 | 7.5 | 8 | 7 | 8.5 | -1 | 11.5 | 3 | 3 | 11.5 | -1 |
| 12.0 | 15.5 | -1 | 7.5 | 8 | 7 | 8.5 | -1 | 11.5 | 3 | 3 | 11.5 | 1 |
| 13.0 | 15.5 | -1 | 7.5 | 8 | 7 | 8.5 | -1 | 11.5 | 3 | 3 | 11.5 | 1 |
| 14.0 | 15.5 | -1 | 7.5 | 8 | 7 | 8.5 | -1 | 11.5 | 3 | 3 | 11.5 | 1 |
| 15.0 | 15.5 | -1 | 7.5 | 8 | 7 | 8.5 | -1 | 11.5 | 3 | 3 | 11.5 | 1 |
| 16.0 | 15.5 | 1 | 23.5 | 8 | 7 | 22.5 | -1 | 19.5 | 3 | 3 | 19.5 | -1 |
| 17.0 | 15.5 | 1 | 23.5 | 8 | 7 | 22.5 | -1 | 19.5 | 3 | 3 | 19.5 | -1 |
| 18.0 | 15.5 | 1 | 23.5 | 8 | 7 | 22.5 | -1 | 19.5 | 3 | 3 | 19.5 | -1 |
| 19.0 | 15.5 | 1 | 23.5 | 8 | 7 | 22.5 | -1 | 19.5 | 3 | 3 | 19.5 | 1 |
| 20.0 | 15.5 | 1 | 23.5 | 8 | 7 | 22.5 | -1 | 19.5 | 3 | 3 | 19.5 | 1 |
| 21.0 | 15.5 | 1 | 23.5 | 8 | 7 | 22.5 | -1 | 19.5 | 3 | 3 | 19.5 | 1 |
| 22.0 | 15.5 | 1 | 23.5 | 8 | 7 | 22.5 | 1 | 27.5 | 5 | 3 | 19.5 | 1 |
| 23.0 | 15.5 | 1 | 23.5 | 8 | 7 | 22.5 | 1 | 27.5 | 5 | 5 | 27.5 | -1 |
| 24.0 | 15.5 | 1 | 23.5 | 8 | 7 | 22.5 | 1 | 27.5 | 5 | 5 | 27.5 | -1 |
| 25.0 | 15.5 | 1 | 23.5 | 8 | 7 | 22.5 | 1 | 27.5 | 5 | 5 | 27.5 | -1 |
| 26.0 | 15.5 | 1 | 23.5 | 8 | 7 | 22.5 | 1 | 27.5 | 5 | 5 | 27.5 | -1 |
| 27.0 | 15.5 | 1 | 23.5 | 8 | 7 | 22.5 | 1 | 27.5 | 5 | 5 | 27.5 | 1 |
| 28.0 | 15.5 | 1 | 23.5 | 8 | 7 | 22.5 | 1 | 27.5 | 5 | 5 | 27.5 | 1 |
| 29.0 | 15.5 | 1 | 23.5 | 8 | 7 | 22.5 | 1 | 27.5 | 5 | 5 | 27.5 | 1 |
| 30.0 | 15.5 | 1 | 23.5 | 8 | 7 | 22.5 | 1 | 27.5 | 5 | 5 | 27.5 | 1 |
| 31.0 | 15.5 | 1 | 23.5 | 8 | 7 | 22.5 | 1 | 27.5 | 5 | 5 | 27.5 | 1 |

FIG. 32  PRIOR ART

ANALOG TO DIGITAL CONVERTER

BACKGROUND OF THE INVENTION

1. Field of the Invention

The present invention generally relates to an analog to digital converter (A-D converter) for converting an analog signal into a digital signal. More particularly, the present invention relates to a successive approximation type A-D converter for successively comparing an analog input voltage with a comparison reference voltage on a bit-by-bit basis from the most significant bit of a digital signal.

2. Description of the Background Art

A-D converters for converting an analog signal into a digital signal are widely used in a variety of fields. Since a signal is digitally processed, high-speed, accurate signal processing can be implemented while reducing the influences such as noises. Moreover, the use of digital circuitry as processing circuitry stabilizes circuit operation and simplifies the circuit structure as much as possible.

Various circuit structures are used for such an A-D converter. A successive approximation method is conventionally known as an A-D conversion method used in the A-D converter. In this method, the bit values of the digital signal are determined by successively comparing an analog input signal with a comparison reference voltage on a bit-by-bit basis from the most significant bit. The comparison reference voltage level for the next bit value is determined according to the comparison result of the upper bit. The variation amount of the comparison reference voltage is predetermined for each comparison step. The variation amount corresponding to the weight of each respective bit of the digital signal is normally used as the variation amount of the comparison reference voltage.

FIG. 26 schematically shows an example of the structure of a conventional A-D converter. Referring to FIG. 26, the conventional A-D converter includes a ladder resistor 1 for generating a comparison reference voltage candidates through resistance division, a selector 2 for selecting an output voltage of the ladder resistor 1 in accordance with a control signal from a control circuit 100 to produce a comparison reference voltage for each comparison, a sample-and-hold circuit (S/H circuit) 3 operating under the control of control circuit 100 for sampling and holding an analog input signal (voltage) Vin, a comparator 4 for comparing the voltage held by the S/H circuit 3 with the comparison reference voltage selected by the selector 2, and a register 110 for storing an output signal of the comparator 4 successively. Register 110 outputs an n-bit digital signal D.

Control circuit 100 determines various operation timings according to a clock signal CLK from a clock generator 10, and generates a selection control signal to selector 2 according to a bit value stored in register 110. Clock generator 10 generates a basic internal clock signal CLK for determining each comparison cycle in accordance with an external clock signal. A digital conversion cycle for each analog input signal and a comparison/determination cycle for each bit value of each digital signal are determined based on this internal clock signal CLK.

Ladder resistor 1 resistance-divides externally generated or internally generated reference voltages VRT and VRB to generate candidate comparison reference voltages. The maximum output voltage value of ladder resistor 1 is a reference voltage VRT–0.5LSB, and the minimum output voltage value thereof is a reference voltage VRB+LSB. Voltage LSB represents a resolution of A-D conversion, and corresponds to a voltage of the least significant bit of the digital signal. Provided that the digital signal is an N-bit signal, voltage LSB is given by (VRT–VRB)/2^N, where the symbol "^" denotes power.

FIG. 27 illustrates an example of the comparison sequence of the A-D converter shown in FIG. 26. It is herein assumed that the analog input voltage is converted into a 5-bit digital signal. The abscissa indicates time and the ordinate indicates voltage. Five conversion cycles are shown in FIG. 27. Ladder resistor 1 resistance-divides voltages the VRT and VRB and generates voltages in the range of 30.5LSB to 0.5LSB in steps of 1LSB as candidate comparison reference voltages.

In order to generate a 5-bit digital signal, ladder resistor 1 generates the voltage levels of thirty steps in accordance with the voltages VRT and VRB. Since the digital signal is a 5-bit signal, the unit variation amount (increment) of the comparison reference voltage, LSB, is given by (VRT–VRB)/2^5. The minimum output voltage of ladder resistor 1 is a voltage VRB+0.5LSB, and the maximum output voltage thereof is a voltage VRB+30.5LSB. When analog input voltage Vin is higher than voltage VRB+30.5LSB, every bit of the resultant 5-bit digital signal is "1". On the other hand, when analog input voltage Vin is lower than voltage VRB+0.5LSB, every bit of the resultant digital signal is "0".

In the successive approximation method, each bit value of the digital signal is sequentially determined on a bit-by-bit basis from the most significant bit based on comparison between an analog input voltage and a comparison reference voltage. Therefore, comparison must be performed five times in order to generate a 5-bit digital signal.

Now, conversion operation into a 5-bit digital signal of the A-D converter shown in FIG. 26 will be described with reference to FIG. 27.

Referring to FIG. 27, it is now assumed that analog input voltage Vin is at a voltage level VRB+10LSB. S/H circuit 3 shown in FIG. 26 samples and holds this analog input voltage Vin.

In the first comparison, selector 2 selects a median of the candidate voltages output from ladder resistor 1, that is, VRB+15.5LSB, as a comparison reference voltage VC. Comparator 4 then compares analog input voltage Vin held in S/H circuit 3 with the selected comparison reference voltage VC. In the first comparison, analog input voltage Vin is lower than the comparison reference voltage. Therefore, comparator 4 outputs "0" and register 110 stores bit "0". The first comparison result corresponds to the fifth bit (most significant bit) of the final conversion result, that is, the digital signal.

Control circuit 100 generates a control signal to selector 2 according to the value of the fifth bit (most significant bit) stored in register 110 or the output signal of comparator 4. Since comparator 4 outputs "0" in this stage, selector 2 selects a voltage lower than the comparison reference voltage of the first comparison by 8LSB as a comparison reference voltage of the second comparison. More specifically, in the second comparison, comparison reference voltage VRB+7.5LSB is selected and applied to comparator 4. In the second comparison, analog input voltage Vin is higher than comparison reference voltage VRB+7.5LSB. Therefore, comparator 4 outputs "1" and register 110 stores bit "1" as a value of the fourth bit.

According to the output signal of comparator 4 or the bit value stored in register 110, control circuit 100 generates such a selection control signal causing selector 2 to select a voltage higher than the comparison reference voltage of the second comparison by 4LSB, that is, VRB+11.5LSB, as a comparison reference voltage of the third comparison. In the third comparison, analog input voltage Vin is lower than the selected comparison reference voltage. Therefore, comparator 4 outputs "0" and register 110 stores the output signal (bit value) of comparator 4 at the position of the third bit.

According to the third comparison result, control circuit 100 generates a selection control signal such that selector 2 selects a voltage lower than the comparison reference voltage of the third comparison by 2LSB, that is, VRB+9.5LSB, as a comparison reference voltage of the fourth comparison. In the fourth comparison, analog input voltage Vin is higher than the selected comparison reference voltage VRB+9.5LSB. Therefore, comparator 4 outputs "1" and register 110 stores the output signal "1" of comparator 4 at the position of the fourth bit.

In the fifth comparison, control circuit 100 generates a selection control signal to selector 2 according to the fourth comparison result. As a result, selector 2 selects a voltage higher than the comparison reference voltage of the fourth comparison by 1LSB, that is, VRB+10.5LSB, as a comparison reference voltage of the fifth comparison. In the fifth comparison, analog input voltage Vin is lower than the selected comparison reference voltage. Therefore, comparator 4 outputs "0". At the end of the fifth comparison, register 110 stores "01010 (binary)", which indicates that input signal Vin is at a voltage level 10LSB on the basis of the voltage VRB. In this way, analog input voltage Vin is converted into a digital signal "01010".

In the above successive approximation operation, the variation amount of the comparison reference voltage is successively varied in each comparison cycle and the variation direction thereof is determined based on the comparison result of the preceding cycle. This method is called "binary search". In the binary search method, a target voltage level is specified by sequentially reducing the search range for a voltage of interest in decrements of ½ times. Since the region where the voltage of interest is present is determined in units of the voltage LSB, conversion precision is given by LSB. A coefficient for the variation amount of the comparison reference voltage in each comparison cycle corresponds to the weight of the bit value of the digital signal.

FIG. 28 schematically shows the structure of ladder resistor 1 and selector 2 in FIG. 26. Referring to FIG. 28, ladder resistor 1 includes resistive elements RA to RD connected in series with each other. Ladder resistor 1 generates a large number of comparison reference voltages, and diffused resistors or polysilicon resistors are normally used for resistive elements RA to RD. In the case where resistive elements RA to RD are formed of a diffusion layer or polysilicon, parasitic capacitance PCr to a substrate region (well region) is generated. Parasitic capacitance PCr is connected to a connection node of each resistive element.

In order that ladder resistor 1 generates a multiplicity of candidate comparison reference voltages, the resistive elements of ladder resistor 1 are connected so as to form a resistance network. FIG. 28 representatively shows resistive elements RA to RD forming a part of ladder resistor 1.

Selector 2 includes cascaded switching transistors SWPA to SWPC of a plurality of stages, and switching transistors SWNA to SWNC connected in parallel with switching transistors SWPA to SWPC respectively. P-channel MOS (insulated gate type) transistors are used for switching transistors SWPA to SWPC, and N-channel MOS transistors are used for switching transistors SWNA to SWNC. Selection control signals ZSCNA to ZSCNC are applied to the gates of switching transistors SWPA to SWPC, respectively. Selection control signals SCNA to SCNC are applied to the gates of switching transistors SWNA to SWNC, respectively.

In selector 2, P-channel and N-channel MOS transistors are connected in parallel with each other to form a so-called CMOS (Complementary MOS) transmission gate in each switching transistor. In other words, by the switching operation of the switching transistors SWPA to SWPC, SWNA to SWNC, selector 2 selects an output voltage of ladder resistor 1 as a comparison reference voltage VC without causing any loss of the threshold voltage. However, since MOS transistors are used for switching transistors SWPA to SWPC, SWNA to SWNC, parasitic capacitance PCt resulting from junction capacitance or the like is connected to each node. Moreover, channel resistance (ON-state resistance) TYr is present in the voltage transmission path.

In selector 2, a plurality of stages of switching transistors are connected in series with each other in order to reduce the parasitic capacitance to comparator 4.

As shown in FIG. 28, ladder resistor 1 has parasitic capacitance PCr at each node, and selector 2 has parasitic capacitance PCt and parasitic resistance TYr. Accordingly, upon transmission of the comparison reference voltage, RC delay due to such parasitic capacitances and parasitic resistance adversely affects the charging and discharging rates of the comparison reference voltage input node of comparator 4. More specifically, when selector 2 selects a comparison reference voltage, the voltage at the comparison reference voltage input node of comparator 4 should be rapidly set to the voltage level selected by selector 2. However, such transmission delay makes it impossible to rapidly charge or discharge the comparison reference voltage input node of comparator 4 to the voltage selected by selector 2. As a result, it takes a long time to set the voltage at the comparison reference voltage input node of comparator 4 to a required voltage level.

Moreover, as the resolution of the digital signal is increased, the number of bits of the digital signal is increased and accordingly the voltage LSB is reduced. As a result, a margin for error of the comparison reference voltage is reduced accordingly. Moreover, the number of comparison reference voltages is increased. This increases the circuit scale of ladder resistor 1 and selector 2, whereby parasitic resistance and parasitic capacitance are increased accordingly.

Accordingly, in the case of the high-resolution A-D conversion, the comparison reference voltage input node of comparator 4 may not be rapidly charged/discharged to a required voltage level in each comparison cycle.

FIGS. 29 and 30 show, in a table form, the input voltage, comparison reference voltage and comparison result of the comparison sequence of FIG. 27. Referring to FIGS. 29 and 30, the input voltage is varied in the range of 0.0LSB to 31.0LSB in increments of 1LSB. It is herein assumed that the voltage VRB is a ground voltage. The actual maximum charging/discharging amount of the input node of comparator 4 is 8LSB per conversion cycle.

When analog input voltage IN is higher than comparison reference voltage REF, "1" is output as the comparison result. When analog input voltage IN is lower than comparison reference voltage REF, "−1" is output as the comparison result. The comparison result "−1" corresponds to bit value "0" of the digital signal.

FIG. 29 shows the first to third comparison sequence, and FIG. 30 shows the fourth and fifth comparison results and the output results.

When the maximum charging/discharging amount of the comparison reference voltage is 8LSB per comparison cycle, the variation amount of the comparison reference voltage is equal to or smaller than the maximum charging/discharging amount in the second comparison cycle and the following comparison cycles. Therefore, an ideal comparison reference voltage (ideal value) is equal to an actual comparison reference voltage (actual value), and the output result matches the analog input voltage. As a result, A-D conversion can be performed accurately.

In FIG. 30, "○" indicates that the comparison result is correct. As shown in FIG. 30, every analog input value is correctly converted into a digital signal. Provided that the comparison reference voltage input node of comparator 4 can be charged/discharged by the required amount within the comparison cycle time, A-D conversion can be performed accurately.

Figure 32:
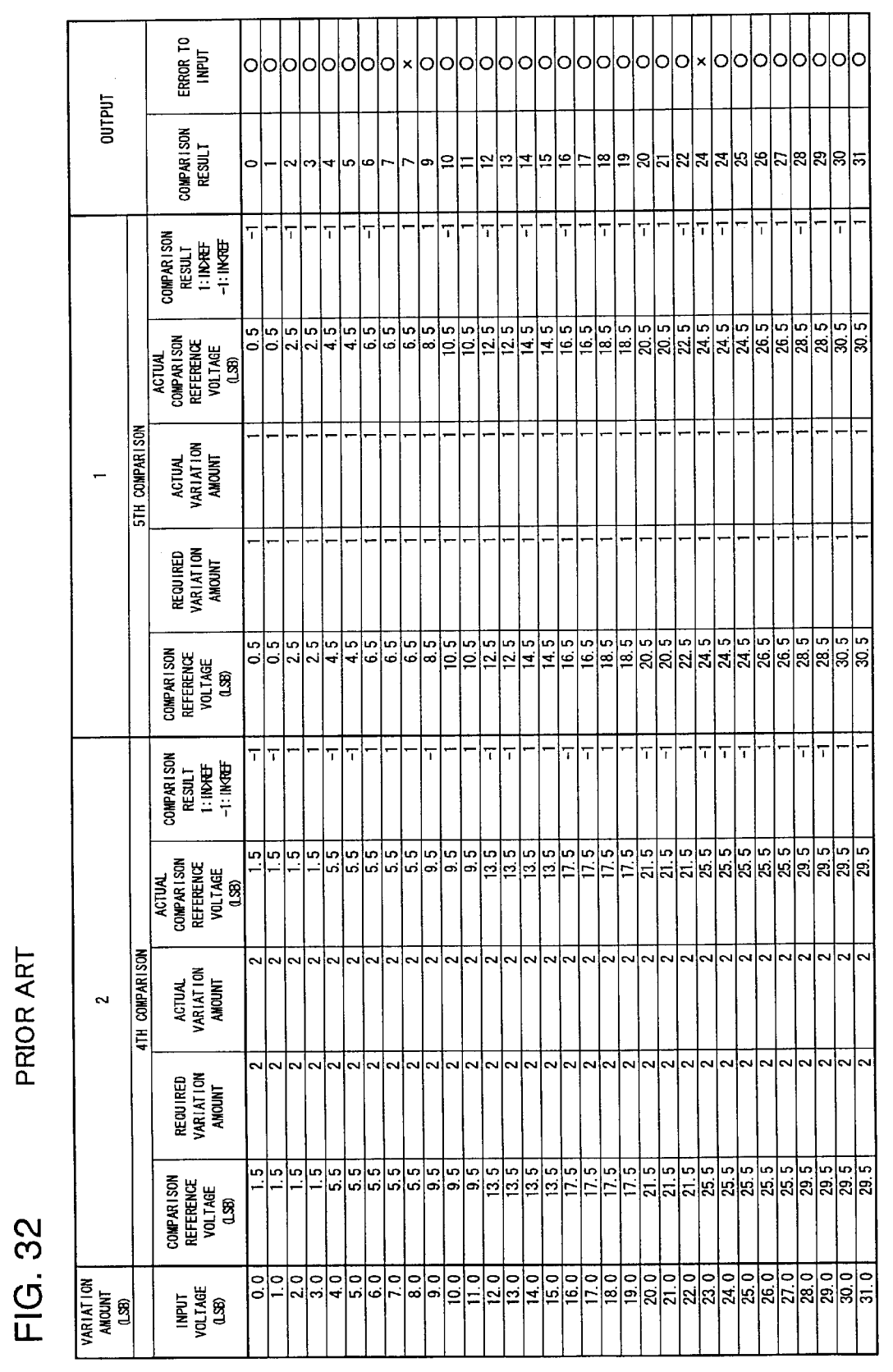

FIGS. 31 and 32 shows the conversion result of the case where the maximum charging/discharging amount per comparison cycle is 7LSB. FIG. 31 shows the first to third comparison results, and FIG. 32 shows the fourth and fifth comparison results and the output. In FIG. 32, "X" indicates that the comparison result is wrong and "○" indicates that the comparison result is correct. The analog input voltage is varied in the range of 0.0LSB to 31.0LSB in increments of 1LSB.

Referring to FIG. 31, in the second comparison operation, the comparison reference voltage is actually varied by only 7LSB, although the required variation amount is 8LSB. Therefore, for analog input voltages 0.0LSB to 15.0LSB, the comparison reference voltage input node of comparator 4 is not sufficiently discharged, whereby the actual comparison reference voltage of the second comparison cycle is higher than the ideal value by 1LSB. For analog input voltages 16.0LSB to 31.0LSB, the comparison reference voltage input node of comparator 4 is not sufficiently charged, whereby the actual comparison reference voltage of the second comparison cycle is lower than the ideal value by 1LSB. As a result, in the second comparison cycle, the comparison result is wrong for analog input voltages 8.0LSB and 23.0LSB.

For the input voltages 8LSB and 23LSB, the comparison reference voltages are different in voltage level from those in the correct comparison operation in the third and following comparison cycles. As a result, the final comparison result (output) for analog input voltage 8.0LSB assumes 7LSB, and the final comparison result (output) for analog input voltage 23.0LSB assumes 24LSB.

Therefore, in the successive approximation method, an input analog signal may not be accurately converted into a digital signal on the following conditions: the maximum change rate of the comparison reference voltage to the comparison circuit is small, the actual variation amount of the comparison reference voltage is smaller than the required amount, and the difference between ideal and actual values is greater than the permissible error of the comparison reference voltage.

FIG. 33 shows an example of the relation between analog input signal Vin and comparison reference voltage VC. In FIG. 33, each comparison cycle is determined according to a clock signal CLK. In the first comparison cycle, comparison reference voltage VC is set to a median of the variable range thereof. In the first comparison cycle, comparison reference voltage VC is normally biased to a prescribed bias voltage close to the median. Therefore, comparison reference voltage VC need not be varied significantly. In other words, comparison reference voltage VC reaches the median within the comparison cycle.

It is herein assumed that comparison reference voltage VC is to be reduced by a voltage ΔA in the following comparison cycle. As shown by dashed line in FIG. 33, if comparison reference voltage VC is actually reduced by only ΔB due to a slow discharging rate, accurate comparison is assured as long as the difference between ideal and actual values, ΔER, is within the permissible error of the comparison reference voltage. However, accurate comparison and conversion would not be achieved if the difference ΔER exceeds the permissible error.

It is now assumed that analog input voltage Vin lies between ideal value VID and actual value VP of the comparison reference voltage, as shown in FIG. 33. If the error between ideal value VID and actual value VP, ΔER, is equal to or greater than the voltage LSB, there is a case that the voltage level of analog input voltage Vin would lie between actual value VP and ideal value VID. Comparison is performed according to actual value VP. Therefore, the actual comparison result is "0", although the correct comparison result is "1". As a result, monotonous increase in the output of the A-D converter will be impeded.

As the resolution is increased, the voltage LSB is reduced accordingly. As a result, the permissible error of comparison reference voltage VC is also reduced. In order to make comparison accuracy high, it is necessary to wait until actual value VP reaches ideal value VID. This requires an increased comparison cycle time, hindering rapid comparison.

If a wrong comparison result is obtained in one comparison cycle, the comparison reference voltages of the following comparison cycles are determined according to the wrong comparison result. As a result, a wrong conversion result would be output without compensating for the wrong bit values.

FIG. 34 shows an example of the comparison sequence. In FIG. 34, the abscissa indicates time, and the ordinate indicates voltage in units of LSB. It is herein assumed that reference voltage VRB is 0V. Analog input voltage Vin is 23LSB, and the maximum charging/discharging amount of the comparison reference voltage is less than 8LSB, and is e.g., 7LSB. The median is 15.5LSB, and input signal voltage Vin is higher than the median.

In the first comparison cycle T1, analog input voltage Vin is compared with comparison reference voltage 15.5LSB. Since analog input voltage Vin is higher than comparison reference voltage 15.5LSB, "1" is output.

In the second comparison cycle T2, comparison reference voltage 15.5LSB is required to be varied by 8LSB. Chain line in FIG. 34 indicates an ideal waveform of the comparison reference voltage with the variation of 8LSB. It is herein assumed that the comparison reference voltage is actually varied by the voltage ΔB, which is equal to or less than 7LSB, due to the response delay of the waveform. Ideally, analog input signal voltage Vin is lower than the comparison reference voltage in the second comparison cycle, and therefore "0" should be output as the second comparison output. Actually, however, the comparison reference voltage is, e.g., 22.5LSB, which is lower than the analog input voltage Vin. Therefore, the wrong value "1" is output as the second comparison result.

In the third comparison cycle T3, the comparison reference voltage is further increased according to the comparison result of the second comparison cycle T2. In the third comparison cycle T3, the comparison reference voltage is varied by 4LSB with respect to the ideal comparison reference voltage of the second comparison cycle T2. Therefore, the comparison reference voltage of the second comparison cycle T2 is actually varied by (8LSB−ΔB)+4LSB in the third comparison cycle T3. The maximum charging/discharging amount ΔB is greater than the variation amount in the third comparison cycle T3, that is, 12LSB−ΔB. Therefore, the comparison reference voltage can be sufficiently increased to the ideal value within the cycle time. Accordingly, the comparison result of the third comparison cycle T3 is "0". In each of the following comparison cycles T4, T5, the comparison reference voltage is reduced by a prescribed value according to the comparison result, and "0" is output as the comparison result. As a result, "11000" is output as the comparison result.

If the comparison reference voltage is varied ideally, "0" is output in the second comparison cycle T2, and the comparison reference voltage is reduced by 4LSB in the third comparison cycle T3. Accordingly, the voltage waveform as shown by chain line in FIG. 34 is obtained in the third to fifth comparison cycles T3, T4, T5. In other words, "1", "1" and "1" are respectively output as the third to fifth comparison results.

As described above, accurate conversion would be impeded if the comparison reference voltage input node of the comparator cannot be sufficiently charged/discharged, and the difference (error) between the actual comparison reference voltage and the ideal comparison reference voltage is equal to or greater than the permissible error. In FIG. 34, the analog input voltage should be converted into "23 (decimal)", but is actually converted into "24 (decimal)".

In the successive approximation type A-D converter, the reference voltage level of each comparison cycle is determined according to the comparison result of the preceding comparison cycle. Therefore, if an erroneous comparison result is present in any of the upper bits, it would affect the lower bits. The successive approximation type A-D converter does not have a function of correcting such an error. Therefore, as the resolution is increased and the permissible error of the comparison reference voltage is reduced, the influence of the charging/discharging rate of the comparison reference voltage is increased significantly. Such an influence is more remarkable particularly for accurate, rapid conversion.

Such a problem is not limited to the above A-D converter using a ladder resistor. An A-D converter using a capacitor and a hybrid A-D converter using both a ladder resistor and a capacitor also successively compare an input analog voltage with a comparison reference voltage in the successive approximation type A-D conversion circuitry. Therefore, such A-D converters also encounter the same problem.

SUMMARY OF THE INVENTION

It is an object of the present invention to provide a successive approximation type A-D converter capable of rapidly converting an analog signal into a digital signal with high accuracy.

It is another object of the present invention to provide a successive approximation type A-D converter having an error correction function and thus capable of generating an accurate conversion result even if a wrong comparison result is produced.

According to a first aspect of the present invention, an analog to digital (A-D) converter includes a comparator for comparing an analog signal with a comparison reference voltage a predetermined number of times that is equal to the number of bits of an output digital signal, and a control circuit for controlling the comparator to perform the predetermined number of comparisons and a redundant comparison. A voltage level of the comparison reference voltage is variable in each comparison. The control circuit determines and sets the voltage level of the comparison reference voltage in each comparison.

According to a second aspect of the present invention, an analog to digital (A-D) converter includes a comparator for comparing an applied analog signal with a comparison reference voltage, and a control circuit for setting a period of comparison cycles of the comparator and a voltage level of the comparison reference voltage in each comparison cycle. The control circuit determines the respective cycle periods of second and subsequent comparisons of such that the cycle times of successive comparison cycles including at least said second comparison cycle vary from each other.

According to the second aspect of the present invention, the A-D converter further includes a circuit for generating a digital signal corresponding to the analog signal according to an output signal of the comparator.

Such redundant comparison provides an error correction function. More specifically, even if a wrong conversion result is generated in any of the predetermined number of comparisons, the error can be corrected based on the redundant comparison result to achieve accurate analog-to-digital conversion. Moreover, since merely the redundant comparison is performed, conversion can be performed with high accuracy in synchronization with a high-speed clock signal.

The redundant comparison may be added after the predetermined number of comparisons. The successive approximation type A-D converter performs the conversion based on the binary search method. Therefore, even if a wrong conversion result is generated due to insufficient charging/discharging of the comparison reference voltage, such an increased number of comparison cycles ensures a convergence period of the conversion output to an input voltage. Accordingly, the final conversion output can be generated with the error corrected.

Alternatively, the redundant comparison may be inserted into a comparison cycle to equivalently increase the cycle time of that comparison cycle. In this case, even if comparison is made in synchronization with a high-speed clock signal and the cycle time is shortened, the comparison reference voltage can be sufficiently charged or discharged to a desired voltage level. Accurate comparison is thus ensured.

In the successive approximation type A-D converter, the second comparison cycle may have a longer cycle time than the other comparison cycles. This provides a sufficient period for the comparison reference voltage to be varied in the second comparison cycle that is the largest in variation amount of the comparison reference voltage. Therefore, even if the charging/discharging rate of the comparison reference voltage is not high enough, the comparison reference voltage can be accurately set to a desired voltage level within the cycle time. As a result, comparison for generating a digital signal can be accurately made even if a short basic cycle time is assigned to the comparison cycles.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows a specific example of the A-D conversion sequence according to the first embodiment of the present invention.

FIG. 6 shows a specific example of the A-D conversion sequence according to the first embodiment of the present invention.

FIG. 7 shows a specific example of an A-D conversion sequence according to a second embodiment of the present invention.

FIG. 8 shows a specific example of the A-D conversion sequence according to the second embodiment of the present invention.

FIG. 9 shows an A-D conversion sequence according to a modification of the second embodiment of the present invention.

FIG. 10 shows an example of an A-D conversion sequence according to a third embodiment of the present invention.

FIG. 11 illustrates an example of error correction operation in the AD conversion sequence according to the third embodiment of the present invention.

FIG. 12 shows a specific example of the A-D conversion sequence according to the third embodiment of the present invention.

FIG. 13 shows a specific example of the A-D conversion sequence according to the third embodiment of the present invention.

FIG. 15 shows a specific example of the A-D conversion sequence according to the fourth embodiment of the present invention.

FIG. 16 shows a specific example of the A-D conversion sequence according to the fourth embodiment of the present invention.

FIG. 17 shows a specific example of an A-D conversion sequence according to a fifth embodiment of the present invention.

FIG. 18 shows the structure of an error correction portion in the A-D conversion sequence according to the fifth embodiment of the present invention.

FIG. 19 shows a specific example of the A-D conversion sequence according to the fifth embodiment of the present invention.

FIG. 20 shows a specific example of the A-D conversion sequence according to the fifth embodiment of the present invention.

FIG. 21 shows a specific example of an A-D conversion sequence according to a sixth embodiment of the present invention.

FIG. 29 shows a specific example of the conventional A-D conversion sequence.

FIG. 30 shows a specific example of the conventional A-D conversion sequence.

FIG. 31 shows a specific example of the conventional A-D conversion sequence.

FIG. 32 shows a specific example of the conventional A-D conversion sequence.

DESCRIPTION OF THE PREFERRED EMBODIMENTS

[First Embodiment]

Figure 1:
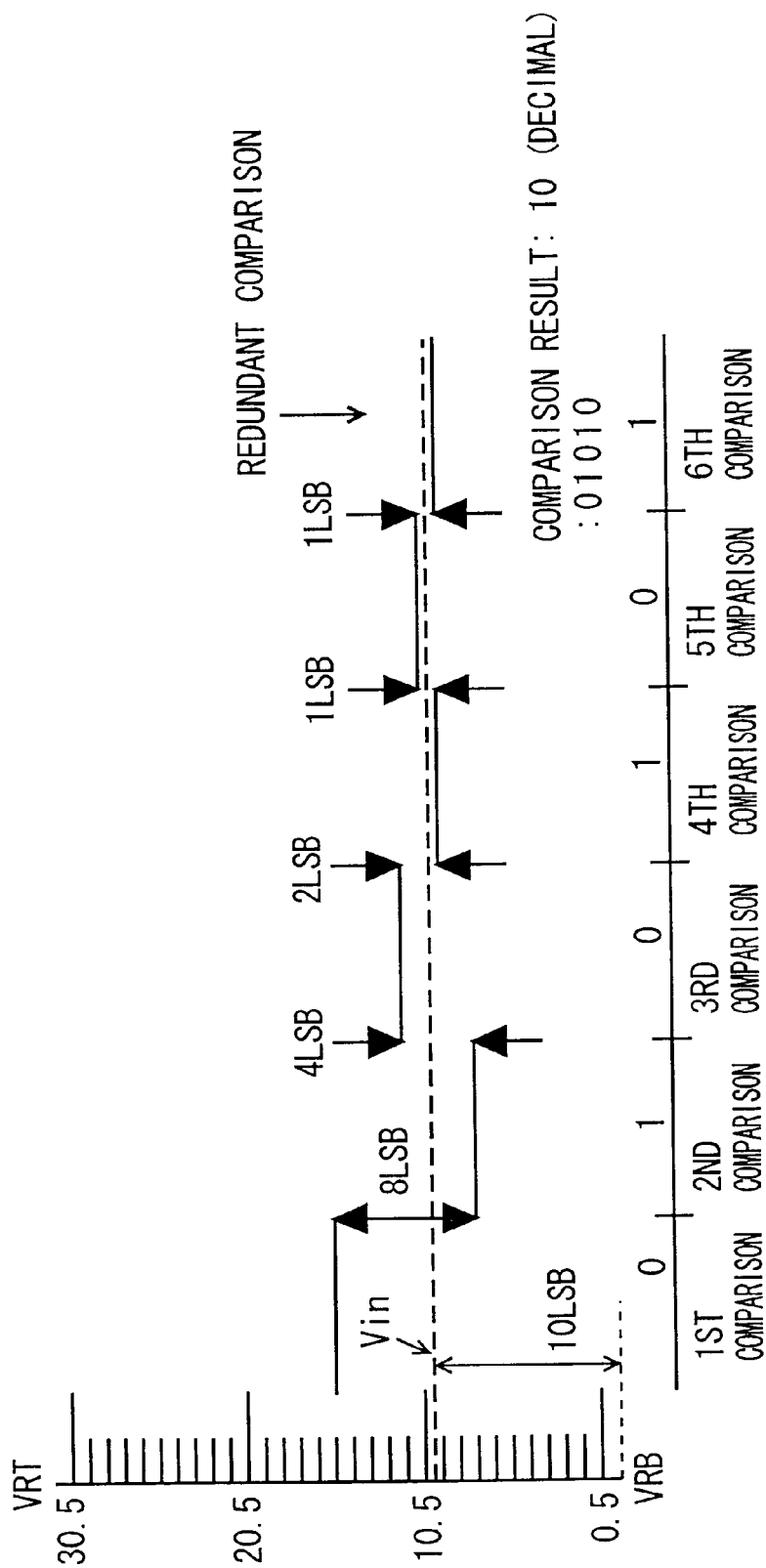
FIG. 1 shows an example of a conversion sequence of an A-D converter according to a first embodiment of the present invention.

FIG. 1 shows a comparison sequence of an A-D converter according to the first embodiment of the present invention. It is herein assumed that a 5-bit digital signal is generated by the comparison sequence of FIG. 1. The resolution is LSB, which is given by $(VRT-VRB)/2^5$, as in the conventional example. Candidate comparison reference voltages are generated in the range from 0.5LSB to 30.5LSB in increments of 1LSB.

As shown in FIG. 1, the comparison sequence of the first embodiment additionally includes the sixth comparison cycle as a redundant comparison cycle. Whether the first to fifth comparison results are correct or not is determined based on the comparison result of the redundant comparison cycle, and the 5-bit digital signal is corrected based on the determination result. Like the fifth comparison cycle, the comparison reference voltage is varied by 1LSB in the redundant comparison cycle (the sixth comparison cycle). A permissible error voltage of the comparison reference voltage is 1LSB.

Adding this redundant comparison cycle (the sixth comparison cycle) is equivalent to adding the charging/discharging time of 1LSB for the comparison reference voltage. It is herein assumed that the converted value is converged to the analog input voltage in the sixth comparison cycle.

If the fifth and sixth comparison results have different signs, input signal voltage Vin is at a voltage level between the fifth and sixth comparison results. The comparison reference voltage is varied by 1LSB in the sixth comparison cycle (the redundant comparison cycle). Accordingly, it can be determined that the comparison results of the first to fifth comparison cycles are correct (because the voltage level of the comparison reference voltage is converged to the level of input analog signal voltage Vin).

If the first comparison result is "1", the comparison reference voltage must be increased by 8LSB in the second comparison cycle. In this case, a correct second comparison result is "0". However, if charging of the comparison reference voltage is not enough, "1" would be output as the second comparison result. In this case, the converted value is higher than the correct value, and the converted values in the fifth and sixth comparison cycles are higher than the analog input value. If the fifth and sixth comparison results are both "−1", it is determined that the conversion result is not converged to the analog input voltage in the fifth comparison. When the permissible error is LSB, 1 is subtracted from the converted value obtained by the first to fifth comparison cycles.

On the other hand, if the first comparison result is "0", the comparison reference voltage must be reduced by 8LSB in the second comparison cycle. In this case, a correct second comparison result is "1". However, if charging of the comparison reference voltage is not enough, "0" would be output as the second comparison result. In this case, the converted value is lower than the correct value, and the converted values in the fifth and sixth comparison cycles are lower than the analog input value. If the fifth and sixth comparison results are both "+1", it is determined that an error conversion is generated and that the conversion result is not converged to the analog input voltage in the fifth comparison. When the permissible error is LSB, 1 is added to the converted value obtained by the first to fifth comparison cycles.

FIG. 1 exemplarily shows a sequence of variation in comparison reference voltage, in which input analog signal voltage Vin is VRB+10LSB. In FIG. 1, the fifth comparison result is different from the sixth comparison result. In this case, the converted value is converged to the analog input voltage in the fifth comparison cycle. Therefore, the converted value "01010" obtained by the first to fifth comparison cycles correctly indicates a digital signal.

The structure of the A-D converter of the first embodiment will now be described. Error correction operation that is performed when a wrong conversion result is obtained by insufficient charging/discharging will be described subsequently.

Figure 2:
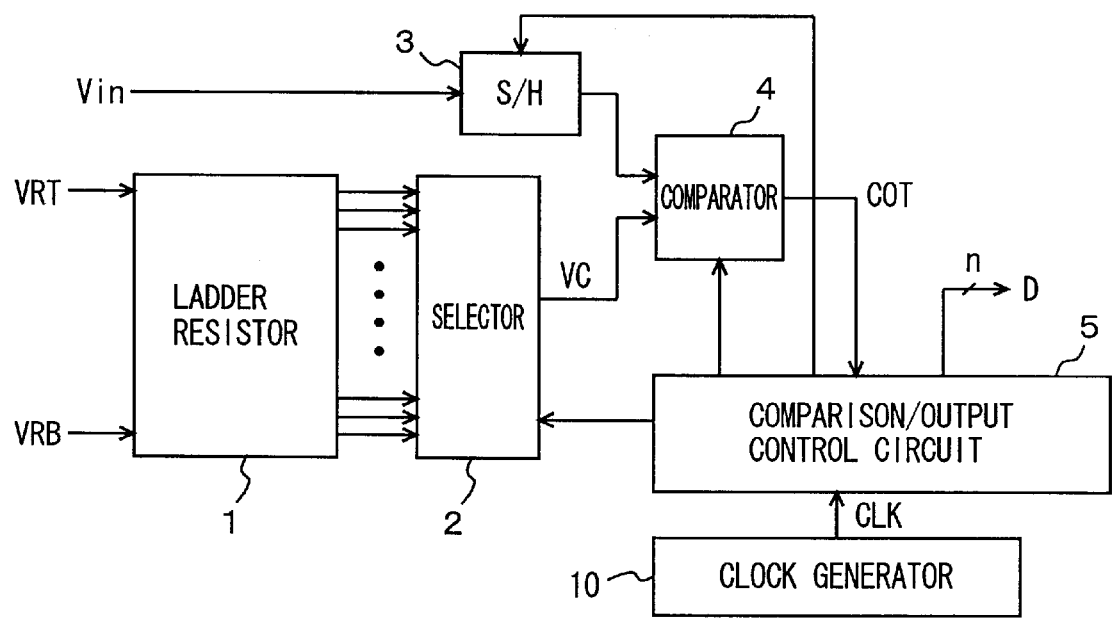
FIG. 2 schematically shows the structure of a main part of the A-D converter according to the first embodiment of the present invention.

FIG. 2 schematically shows the overall structure of the A-D converter according to the first embodiment. The A-D converter of FIG. 2 includes a comparison/output control circuit 5 for performing a comparison control and generating an output digital signal D based on the comparison results up to the sixth cycle. Comparison/output control circuit 5 generates a comparison reference voltage selection signal for a selector 2 and a signal for determining the comparison timing of comparator 4 according to a clock signal CLK from a clock generator 10. Each comparison cycle is determined based on clock signal CLK generated by clock generator 10.

Comparison/output control circuit 5 generates an n-bit digital signal D (in the present embodiment, 5-bit digital signal D) according to an output signal COT of comparator 4.

Figure 3:
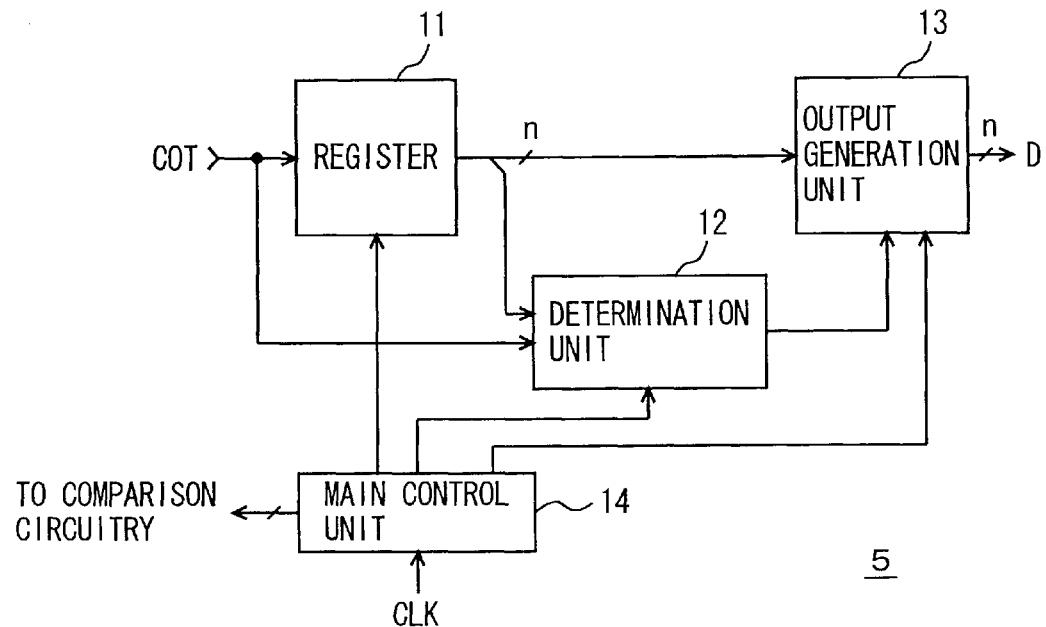
FIG. 3 schematically shows the structure of a main part of a comparison/output control circuit in FIG. 2.

FIG. 3 schematically shows the structure of a main part of comparison/output control circuit 5 in FIG. 2. In FIG. 3, each function of comparison/output control circuit 5 is shown to be implemented by hardware. However, each block shown in FIG. 3 (except register 11) may be implemented by software.

In FIG. 3, comparison/output control circuit 5 includes a register 11 for sequentially storing an output signal COT of comparator 4 by n bits, a determination unit 12 receiving output signal COT of comparator 4 and the final comparison bit (least significant bit) in register 11, an output generation unit 13 for applying a predetermined operation to the output signal of n bits from register 11, in accordance with the output signal of determination unit 12, to generate an n-bit digital signal, and a main control unit 14 controlling the operations of register 11, determination unit 12 and output generation unit 13.

Register 11 stores an output signal COT of comparator 4, i.e., a signal indicating the comparison result, sequentially from the most significant bit toward the least significant bit. In the redundant comparison cycle, determination unit 12 receives the least significant bit stored in register 11 and output signal COT from the comparator 4 in the redundant comparison cycle, to determine whether or not the logic levels of the received signals match with each other for generating a signal indicating the determination result.

Output generation unit 13 adds 1, 0 or −1 to the n-bit output data of register 11 according to the determination result of determination unit 12, and generates a final output digital signal D. Main control unit 14 generates a control signal for controlling operation of selector 2, comparator 4 and sample-and-hold circuit (S/H circuit) 3 shown in FIG. 2.

Figure 4:
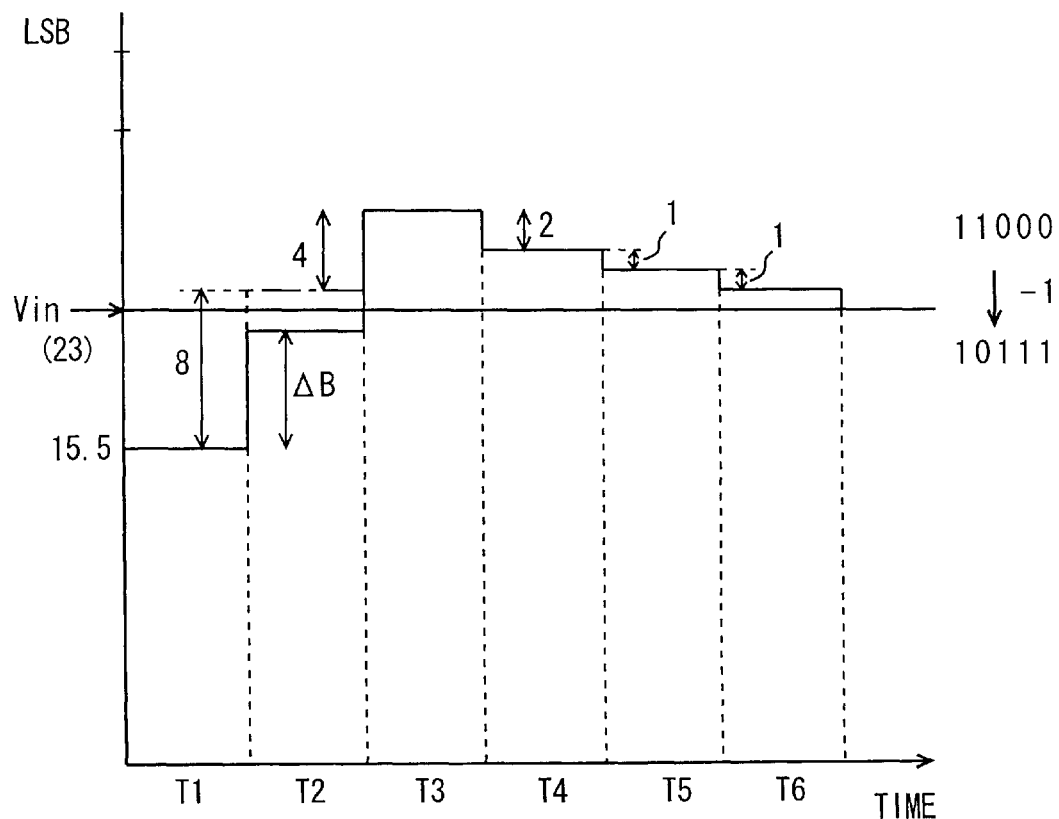
FIG. 4 illustrates error correction operation of the A-D converter according to the first embodiment of the present invention.

FIG. 4 shows an example of a conversion sequence according to the first embodiment of the present invention. In the illustrated example, an analog input voltage at the level of the voltage 23LSB is converted into a 5-bit digital signal.

In the first comparison cycle T1, the comparison reference voltage is lower than analog input voltage Vin. Therefore, the comparison result is "1", which indicates that the comparison reference voltage is to be increased in the second comparison cycle T2.

It is herein assumed that the comparison reference voltage is increased by only ΔB in the second comparison cycle T2 although it should be increased by 8LSB (ΔB<8LSB). In this case, output signal COT of comparator 4 attains "1" in the second comparison cycle T2 although it should attain "0". According to the wrong determination in the second comparison cycle T2, comparator 4 outputs "0" as output signal COT in each of the third to fifth comparison cycles T3 to T5.

In the redundant comparison cycle (sixth comparison cycle) T6, the comparison reference voltage is reduced by 1LSB to perform the comparison. Although the comparison reference voltage approaches to analog input voltage Vin by 1LSB in the redundant comparison cycle T6, it is still higher than input analog voltage Vin. Therefore, output signal COT of comparator 4 attains "0". It is herein assumed that, if wrong determination is made in the second comparison cycle T2, the converted value is converged to analog input voltage Vin in the redundant comparison cycle T6.

If the voltage level of input analog signal Vin is 23 (decimal), the conversion result is "11000" at the end of the fifth comparison cycle, and indicates 24 (decimal). Determination unit 12 then determines whether or not the comparison result of the redundant comparison cycle T6 is the same in sign as the comparison result of the fifth comparison cycle T5. In this example, output signal COT of comparator 4 is "0" in both comparison cycles T5 and T6. Determination unit 12 therefore determines that the conversion result obtained by the first to fifth comparison cycles has a higher voltage level than input analog voltage Vin. Accordingly, output generation unit 13 adds −1 to the conversion result and generates "10111 (23: decimal)" as final output data D. Bit "0" in the converted value corresponds to the comparison result "−1".

As a result, even when the charging/discharging rate of the comparison reference voltage is not enough with respect to the comparison cycle time, adding the redundant comparison cycle allows an additional convergence time period for the voltage of the conversion result to the input analog signal. Accordingly, the charging/discharging rate can be compensated for. Therefore, rapid conversion can be implemented with high accuracy even when the comparison cycle is short and the resolution is high.

In the present embodiment, the redundant comparison cycle is provided and the comparison reference voltage is varied by 1LSB in the redundant comparison cycle. This allows an additional time period corresponding to 1LSB for the output digital signal converging to the input analog signal in the comparison sequence. Therefore, even if wrong determination is made due to an insufficient charging/discharging rate, the wrong comparison result can be accurately corrected using the result of the redundant cycle. As a result, accurate A-D conversion is achieved.

If the comparison result is "1" in the fifth and sixth comparison cycles, determination unit 12 determines that the converted value obtained by the first to fifth comparison cycles is lower than analog input value Vin according to the wrong determination in the second comparison cycle. Accordingly, +1 is added to the converted value obtained through conversion up to the fifth cycle.

FIGS. 5 and 6 show a comparison reference voltage, actual comparison reference voltage, comparison result in each comparison cycle, and final result value in the sequence for converting an analog input signal into a 5-bit digital data according to the first embodiment of the present invention. When input voltage IN is higher than comparison reference voltage REF, "1" is output as the comparison result. On the other hand, when input voltage IN is lower than comparison reference voltage REF, "−1" is output as the comparison result. The analog input voltage is varied in the range from 0.00LBS to 31.0LSB in increments of 1LSB. The maximum charging/discharging amount of the comparison reference voltage is 7LSB. FIG. 5 shows the first to third comparison cycles, and FIG. 6 shows the fourth to sixth comparison cycles and the final converted value.

As shown in FIG. 5, the comparison reference voltage is actually varied by only 7LSB in the second comparison although it should be varied by 8LSB. Therefore, the actual comparison reference voltage is different from the ideal comparison reference voltage by 1LSB. The ideal comparison reference voltage is the output voltage of ladder resistor 1 selected by selector 2. In this example, for analog input voltage 8.0LSB, the ideal comparison reference voltage is 7.5LSB, whereas the actual comparison reference voltage (actual value) is 8.5LSB, resulting in a wrong comparison result. Similarly, for analog input voltage 23.0LSB, the ideal comparison reference voltage is 23.5LSB, whereas the actual comparison reference voltage is 22.5LSB, resulting in a wrong comparison result. Wrong determination was not made for the other analog input voltages.

In the third comparison, the actual comparison reference voltage level (actual value) is varied toward the ideal value. The maximum variation amount of the comparison reference voltage in the third comparison cycle is 5LSB, which is smaller than 7LSB. Therefore, the comparison reference voltage can be sufficiently varied within the comparison cycle. In other words, the actual comparison reference voltage becomes equal to the ideal comparison reference voltage. Therefore, a correct comparison result is obtained in the third comparison.

As shown in FIG. 6, the ideal and actual variation amounts of the comparison reference voltage are 2LSB in the fourth comparison and 1LSB in the fifth comparison. In other words, the actual comparison reference voltage is equal to the ideal comparison reference voltage in each of the fourth and fifth comparisons. Therefore, a correct comparison result is obtained in the fourth and fifth comparisons.

Thereafter, the sixth comparison is performed. The fifth and sixth comparison results are both "1" for analog input voltage 8LSB+VRB (in FIGS. 5 and 6, VRB is 0 V). These comparison results indicate that the conversion result still has a lower voltage level than the actual analog input voltage. In this case, according to the sixth comparison result, +1 is added to the conversion result obtained by the first to fifth comparisons for error correction, whereby 8LSB can be output as the final comparison result. In other words, "00111" is added with "1" and thus can be converted into "01000".

For analog input voltage 23LSB, the fifth and sixth comparison results are both "−1". This means that the conversion result obtained by the first to fifth comparison cycles is higher than the actual analog input voltage. In this case, according to the sixth comparison result, −1 is added to the digital value obtained by the first to fifth comparison cycles, whereby a digital value corresponding to 23LSB can be accurately produced. In other words, "11000" can be corrected to "10111" by adding "−1" the converted value. The corrected final converted value can be obtained in this way.

For the other analog input voltages, the fifth and sixth comparison results have different signs. Therefore, 0 (zero) is added to the conversion result obtained by the first to fifth comparisons, whereby the final conversion result is output. For analog input voltages 0.0LSB, 31.0LSB, the comparison reference voltage in the fifth comparison cycle has the same voltage level as that in the sixth comparison cycle. This is because the comparison reference voltage reaches the lower limit and the upper limit in the fifth comparison cycle, respectively. In this case, there is a sufficient difference between the comparison reference voltage and the analog input voltage even if the charging/discharging rate is 7LSB. Therefore, a correct comparison result is obtained. For the upper and lower limit values, the fifth or sixth comparison result may be used as the least significant bit. Alternatively, when the comparison reference voltage is 0.5LSB (lower limit) in the sixth comparison cycle and the fifth and sixth comparison results are both "−1", the least significant bit may be set to "0". When the comparison reference voltage is 30.5LSB (upper limit) in the sixth comparison cycle and the fifth and sixth comparison results are both "1", the least significant bit may be set to "1".

Note that FIGS. 5 and 6 exemplarily show a conversion sequence for generating a 5-bit digital signal. The number of comparison cycles is appropriately determined according to the number of bits of a digital signal to be generated.

If the comparison reference voltage level is different from the upper or lower limit, determination unit 12 outputs a signal indicating an operation to be performed to output generation unit 13 according to the comparison results in the fifth and sixth comparison cycles. Determination unit 12 may be formed of a table ROM (Read Only Memory) receiving the output signal of comparator 4 of the fifth and sixth comparison cycles as an address signal. In this case, "−1" is stored at address "00", and "1" is stored at address "11". Alternatively, the final converted values for 8LSB and 23LSB may be output from the table ROM and selected as the final conversion result instead of the output signal of register 11.

[Modification]

The above redundant determination is based on the comparison result of the redundant cycle and the comparison result of the final conversion cycle in normal conversion cycles. However, provided that the conversion result is converged to the analog input value in the redundant cycle, the following correction operation can be performed using a comparison reference voltage Vc of the redundant cycle and the determination result of the redundant cycle. If the determination result is "1", it means that the analog input voltage is higher than comparison reference voltage Vc. In this case, the higher value is selected from the two converted values corresponding comparison reference voltage Vc. On the other hand, if the determination result of the redundant cycle is "−1", it means that the analog input voltage is lower than comparison reference voltage Vc of the redundant cycle. Therefore, the lower value is selected from the two converted values corresponding to comparison reference voltage Vc.

For example, as shown in FIG. 1, when the analog input voltage is 10LSB, comparison reference voltage Vc is 9.5LSB in the redundant cycle, and the comparison result is "1". In this case, the conversion result corresponding to 9.5LSB is "9" and "10" in decimal notation, and the higher value "10" is selected.

As shown in FIG. 4, when the analog input voltage is 23LSB, comparison reference voltage Vc is 23.5LSB in the redundant cycle, and the comparison result is "−1". In this case, the conversion result corresponding to 23.5LSB is "23" and "24" in decimal notation, and the lower value "23" is selected.

This conversion process can be considered as follows. Comparison reference voltage Vc has the voltage level set in the range of 0.5LSB to 30.5LSB in units of 1LSB. The conversion result is any value that is varied in the range of 0LSB to 31LSB in units of 1LSB. In this case, comparison reference voltage Vc is represented by the fractional part. For example, when comparison reference voltage Vc is 9.5LSB, it is represented as "01001.1". If the comparison result of the redundant cycle is "1", 0.5 (=0.1) is added to the comparison reference voltage. If the comparison result of the redundant cycle is "−1", −0.5 is added to the comparison reference voltage.

In other words, when the analog input voltage is 10LSB, "0.5" in decimal ("0.1" in binary) is added to the code "01001.1" corresponding to comparison reference voltage 9.5LSB of the redundant cycle. As a result, the conversion result "01010" can be obtained.

When the analog input voltage is 23LSB, comparison reference voltage Vc of the redundant cycle is 23.5LSB, and the code corresponding to this comparison reference voltage Vc is "11000.1". The comparison result is "−1" as shown in FIG. 4. Therefore, −0.5 is added to the code "11000.1", whereby "11000" is obtained.

Provided that 0.5 LSB to 31.5LSB of comparison reference voltage Vc are correlated with "1" to "32", respectively, the following correction operation can be performed. If the comparison result of the redundant cycle is "1", the code corresponding to comparison reference voltage Vc is selected as the conversion result. If the comparison result of the redundant cycle is "−1", 1 is subtracted from (−1 is added to) the code corresponding to the comparison reference voltage of the redundant cycle.

For example, when the analog input voltage is 10LSB, comparison reference voltage Vc of the redundant cycle is 9.5LSB and a code corresponding to that comparison reference voltage Vc is "01010". Since the comparison result of the redundant cycle is "1", the code "01010" is selected. When the analog input voltage is 23LSB, comparison reference voltage Vc of the redundant cycle is 23.5LSB, and a code corresponding to that comparison reference voltage Vc is "11000". Since the comparison result of the redundant cycle is "−1", −1 is added to the code. The code "10111" is thus obtained as the conversion result, whereby an accurate conversion result can be obtained for analog input value 23LSB.

Any of the above correction methods may be used. Since selector 2 selects comparison reference voltage Vc of the redundant cycle according to a selection signal from comparison/output control circuit 5 shown in FIG. 2, the voltage level of comparison reference voltage Vc of the redundant cycle can be known in comparison/output control circuit 5. The comparison reference voltage is encoded according to the selection signal to selector 2, and the converted value is generated according to the comparison result of the redundant cycle. In this case, the register for storing the comparison result of each conversion cycle as a converted value is not required unlike the case where the conversion result is corrected by using the comparison results of the redundant cycle and the final normal conversion cycle. As a result, the circuit scale can be reduced. The circuit structure of the modification of the first embodiment is the same as that shown in FIG. 2, but conversion/correction operation of comparison/output control circuit 5 is different from that in the structure of FIG. 3.

More specifically, in the modification of the first embodiment, determination unit 12 determines an operation (addition, subtraction) in accordance with the output signal COT indicating the comparison result of the redundant cycle. Main control unit 14 applies a code corresponding to the comparison reference voltage of the redundant cycle to output generation unit 13. When the redundant cycle is completed, output generation unit 13 performs a designated operation on the received code and generates a converted value according to the determination result of determination unit 12. In this way, rapid conversion can be implemented even if the redundant cycle is added to the conversion sequence.

Such generation of the converted value may be performed together with conversion of the subsequent analog input value in a pipeline manner. In this case, the comparison/conversion cycle and the correction operation according to the determination result of the redundant cycle can be performed in parallel. This equivalently hides the operation processing time from the outside. As a result, rapid conversion can be implemented even when the redundant cycle is added to the conversion sequence.

As described so far, according to the first embodiment, the redundant comparison cycle is provided after the number of comparison cycles corresponding to the number of bits of the digital signal, to perform an additional comparison with the comparison reference voltage varied by 1LSB. The conversion result is corrected based on the redundant comparison result. Therefore, even if any wrong comparison result is produced in the conversion sequence due to an insufficient changing rate of the comparison reference voltage, the error can be corrected in the redundant comparison cycle. As a result, accurate A-D conversion can be performed in response to a high-speed clock signal (the cycle time of the comparison cycle is determined by the high-speed signal).

Note that the above error correction operation can be applied if a permissible error of the comparison reference voltage is 1LSB and when an n-bit digital signal is generated.

In particular, the comparison reference voltage is varied by 1LSB in the final comparison cycle (i.e., the redundant comparison cycle). This equivalently increases the convergence time of the digital signal by the convergence time period of 1LSB, whereby an error of the comparison reference voltage of LSB can be corrected. This equivalently increases the permissible error of the comparison reference voltage, whereby accurate comparison/conversion can be achieved.

[Second Embodiment]

Figure 8:
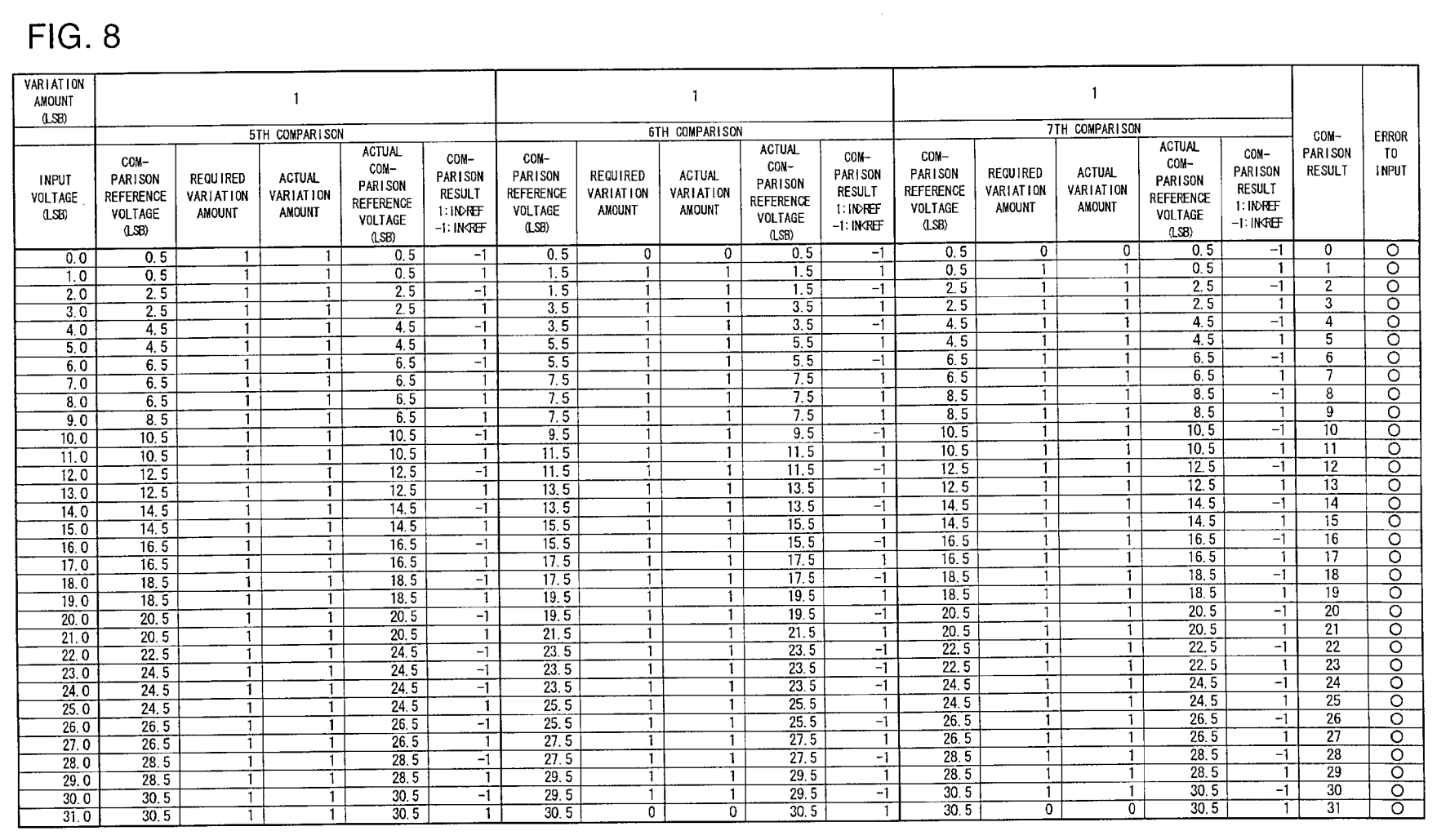

FIGS. 7 and 8 specifically show a conversion sequence of an A-D converter according to the second embodiment of the present invention. The conversion sequence of FIGS. 7 and 8 is performed on the same conditions as those of the first embodiment. In the second embodiment as well, a 5-bit digital signal is generated. FIG. 7 shows the first to fourth comparison cycles, and FIG. 8 shows the fifth to seventh comparison cycles and the final conversion result.

In the second embodiment, the maximum charging/discharging rate of the comparison reference voltage is 6LSB. A permissible error of the comparison reference voltage is 2LSB. Since two comparison cycles are added as redundant comparison cycles, comparison is performed seven times in total. The first to fifth comparison results are corrected based on the sixth and seventh comparison results, whereby the final comparison result is output.

In each redundant comparison cycle, the comparison reference voltage is varied by the voltage 1LSB relative to the reference voltage in the preceding cycle.

In this example, the maximum charging/discharging rate of the comparison reference voltage is 6LSB. Therefore, the comparison reference voltage is actually varied by only 6LSB in the second comparison cycle although it should be varied by 8LSB. Accordingly, if the ideal comparison reference voltage is 7.5LSB or 23.5LSB, an actual comparison reference voltage (actual value) is 9.5LSB or 21.5LSB. As a result, a wrong comparison result is generated for analog input voltages 8.0LSB, 9.0LSB. For analog input voltages 22.0LSB, 23.0LSB as well, a wrong comparison result is generated in the second comparison cycle.

In the third comparison cycle, the comparison reference voltage is to be varied by 4LSB. The actual value is shifted by 2LSB, and therefore, the comparison reference voltage must be actually varied by 6LSB, which is the same as the maximum changeable variation amount in this conversion sequence. Accordingly, the actual comparison reference voltage (actual value) becomes equal to the ideal comparison reference voltage (ideal value) in the third comparison cycle, whereby a correct comparison result is obtained. Since the actual comparison reference voltage (actual value) is equal to the ideal comparison reference voltage (ideal value) in the third comparison cycle, the comparison reference voltage is varied by the ideal amount in the fourth and fifth comparison cycles, or 2LSB and 1LSB, respectively. Therefore, the fourth and fifth comparisons can be performed with the actual comparison reference voltage (actual value) set to the ideal comparison reference voltage level (ideal value).

In each of the sixth and seventh comparison cycles (redundant comparison cycles), the comparison reference voltage is varied by 1LSB. However, if the comparison reference voltage has reached the lower limit 0.5LSB or the upper limit 30.5LSB, it is retained at this value (0.5LSB or 30.5LSB) in these redundant comparison cycles.

If the fifth comparison result is different from the sixth comparison result, it is determined that the first to fifth conversion results are correct. As a result, zero is added to the conversion result obtained by the first to fifth comparison cycles.

If the firth comparison result is the same as the sixth comparison result and the sixth comparison result is different from the seventh comparison result, it is determined that the converted voltage is converged to the analog input voltage in the sixth comparison cycle. In this case, 1 is added to or subtracted from the conversion result obtained by the first to fifth comparison cycles, according to the sign of the fifth and sixth comparison results.

If the fifth to seventh comparison results are the same, it is determined that the conversion result obtained by the first to fifth comparison cycles is different from the input analog voltage by 2LSB. Therefore, 2LSB is added to or subtracted according to the logic level of the comparison result of the redundant comparison cycles.

The relation between the adding/subtracting operation and the sign of the comparison result is the same as that in the first embodiment. More specifically, if the fifth to seventh comparison results are (−1, −1, 0), (−1, −1, −1), (1, 1, 0) and (1, 1, 1), −1, −2, 1 and 2 are added, respectively. When the fifth comparison result is different from the sixth comparison result, zero is added to the conversion result.

In the second embodiment, the two redundant comparison cycles are added and the comparison reference voltage is varied by 1LSB in each redundant comparison cycle. As a result, accurate conversion is assured even if the comparison reference voltage is shifted by 2LSB at the maximum.

In other words, adding the two redundant comparison cycles and varying the comparison reference voltage by 1LSB in each redundant comparison cycle is equivalent to providing additional convergence time period of 2LSB. Therefore, an accurate conversion result can be obtained even if the comparison reference voltage is different from the ideal comparison reference voltage by 2LSB.

The structure of the comparison/output control circuit shown in FIG. 3 can be applied to the comparison/output control circuit of the second embodiment except that determination unit 12 performs determination based on the comparison results of the three comparison cycles rather than two comparison cycles. In this case, a table ROM may be used as a determination circuit for determining an operation to be performed on the final conversion output according to the fifth to seventh comparison results. Alternatively, this table ROM may be configured to produce the final comparison result based on the comparison reference voltage and the fifth to seventh comparison results. The comparison reference voltage is herein used in order to identify the upper limit and the lower limit. When such a table ROM is used, the output value or the operation value need only be stored only for the conversion pattern of the analog input voltage that may likely to cause wrong conversion.

The processing for comparison reference voltages for the upper limit and the lower limit in the redundant comparison cycles is performed as an exceptional processing as in the first embodiment.

Like the modification of the first embodiment, the converted value may be generated according to the comparison result of the seventh comparison cycle (final redundant comparison cycle) and the comparison reference voltage thereof. In this case, operation is performed in the same manner as that of the modification of the first embodiment.

For example, for analog input voltage 8SLB, the comparison reference voltage of the seventh comparison cycle is 8.5LSB and the determination result of the seventh comparison cycle is "−1", as shown in FIG. 8. Since the analog input value is lower than the comparison reference voltage, the converted value "01000" can be obtained from the code corresponding to the comparison reference voltage. As a result, a correct converted value can be generated. In this case, any one of the following three operations may be performed for conversion: −1 is added; −0.5 is added; and a code having a lower value is selected from those corresponding to the comparison reference voltage of the final redundant comparison cycle.

For analog input voltage 9LSB, the comparison reference voltage of the seventh comparison cycle is 8.5LSB and the comparison result is "1", as shown in FIG. 8. Since the analog input voltage is higher than the comparison reference voltage, the converted value "01001" can be obtained from the comparison reference voltage 8.5LSB. As a result, a correct converted value can be generated.

For the other analog input voltages as well, the operation is performed in the same manner as that described above, whereby a correct converted value can be obtained.

[Modification]

FIG. 9 shows an A-D conversion sequence according a modification of the second embodiment. The A-D conversion cycle of FIG. 9 includes K redundant comparison cycles. The comparison reference voltage is varied by 1LSB relative to the comparison reference voltage in the preceding comparison cycle in each redundant comparison cycle.

Adding K redundant comparison cycles increase the permissible error of the comparison reference voltage to the voltage of K·LSB to be corrected. As a result, accurate conversion is assured within the increased permissible error. More specifically, if the comparison reference voltage is varied by 1LSB in each redundant comparison cycle, the permissible error of the comparison reference voltage can be increased by 1LSB for each addition of the redundant comparison cycle.

In this modification as well, the comparison result obtained by the first to fifth comparison cycles is selectively corrected based on the comparison results of the K redundant comparison cycles. This operation to be performed may be determined by a table ROM or may be determined by software based on the comparison result of each redundant comparison cycle. An error is corrected by adding ±K, ±(K−1), . . . ±1 or 0. As described in the second embodiment, the operation to be performed is specified according to the redundant cycle number having a different comparison result. Therefore, addition or subtraction of a greater absolute value is performed as the redundant cycle number having a different comparison result becomes greater.

In this case as well, the converted value can be obtained from the comparison result of the final redundant cycle and the comparison reference voltage thereof. Conversion operation is the same as that described in the modification of the first embodiment.

As described heretofore, according to the second embodiment of the present invention, a plurality of redundant comparison cycles are added and the comparison reference voltage is varied by 1LSB in each redundant comparison cycle. Therefore, at least 2LSB can be provided as a permissible error of the comparison reference voltage. As a result, accurate conversion is assured even if an analog input signal is converted into a digital signal based on the comparison according to a high-speed clock signal.

[Third Embodiment]

FIG. 10 shows an example of a conversion sequence of an A-D converter according to the third embodiment of the present invention. In this conversion sequence as well, an analog input voltage is converted into a 5-bit digital signal. In the example of FIG. 10, the analog input voltage is VRB+10LSB. In FIG. 10, the ordinate indicates voltage and the abscissa indicates time.

The conversion sequence of the third embodiment additionally includes a single redundant comparison cycle (the sixth comparison cycle) as in the case of the first embodiment. In this redundant comparison cycle, the comparison reference voltage is varied by 1LSB. In the comparison cycle right before the redundant comparison cycle, i.e., the fifth comparison cycle, the comparison reference voltage is varied by 2LSB. Accordingly, the comparison reference voltage is varied by 2LSB in both the fourth and fifth comparison cycles. Since the comparison reference voltage is varied by 2LSB rather than 1LSB in the fifth comparison cycle, this extra 1LSB in the fifth comparison cycle and 1LSB in the redundant comparison cycle provides 2LSB as a permissible error of the comparison reference voltage.

According to the comparison result of the redundant comparison cycle, a prescribed operation is performed on the comparison result obtained by the first to fifth comparison cycles, to output a final conversion result. This error correction is performed using the comparison results of the fourth to sixth comparison cycles. Based on these comparison results, ±1 and ±2 are selectively added to the conversion result obtained by the first to fifth comparison cycles.

More specifically, in FIG. 10, "01010" is obtained from the first to fifth comparison results. The fifth and sixth comparison results have the same logic level, and the fourth and fifth comparison results have different logic levels. It is therefore determined from the fourth comparison result that the converted voltage is converged to the analog input voltage. Therefore, zero is added to the conversion result. More specifically, in the illustrated example, the comparison reference voltage is increased by 2LSB in the fifth comparison cycle according to the fourth comparison result. If the resultant comparison reference voltage (final converted value candidate) is higher than the analog input voltage, and the comparison result of the following redundant comparison cycle (the sixth comparison cycle) indicates that the comparison reference voltage is still higher than the analog input voltage, it is determined that the converted value is converged to the analog input voltage when the comparison reference voltage is varied by 1LSB in the fifth comparison cycle. This is equivalent to the case where the fifth and sixth comparison results are different in the first embodiment. Therefore, the conversion result obtained by the first to fifth comparison results is output as a final conversion result with zero addition performed.

FIG. 11 is a table illustrating operation of determining the final output according to the third embodiment. As shown in FIG. 11, the final conversion result is generated using the fourth to sixth comparison results. The "operation" in FIG. 11 indicates an operation performed on the conversion result obtained by the fifth comparison result.

When the fourth comparison result is "1", it means that the conversion result of the fourth comparison cycle is lower than the analog input voltage. If the fifth and sixth comparison results are both "1", it means that the conversion result of the sixth comparison cycle is still lower than the analog input voltage. In this case, +2 is added to the conversion result obtained up to the fifth comparison cycle.

If the fourth and fifth comparison results are both "1" and the sixth comparison result is "−1", it is determined that the conversion result is converged to the analog input voltage in the fifth comparison cycle. The comparison reference voltage is varied by 2LSB in the fifth comparison cycle. Therefore, if the comparison reference voltage is varied by only 1LSB in the fifth comparison cycle, the fifth and sixth comparison results will become "1". Therefore, +1 is added to the conversion result as in the case of the second embodiment.

There is the case where the fourth and fifth comparison results are both "−1" and the sixth comparison result is "1". In this case, even if the comparison reference voltage is reduced by 2LSB in the fifth comparison cycle, the conversion result is still lower than the analog input voltage. If the comparison reference voltage is increased by 1LSB in the sixth comparison cycle, the conversion result becomes higher than the analog input voltage. In this case, the sixth comparison result will become "−1" if the comparison reference voltage is varied by 1LSB in the fifth comparison cycle. If the comparison reference voltage is further varied by 1LSB in the seventh comparison cycle, the comparison result will become "1". Accordingly, addition of +1 is selected for the operation to be performed on the conversion result.

If the fourth to sixth comparison results are all "−1", the conversion result obtained by the fifth comparison cycle is higher than the analog input voltage by 2LSB. Therefore, −2 is added to the conversion result obtained up to the fifth comparison cycle.

If the fourth to sixth comparison results have a pattern different from those described above, conversion is performed correctly, and therefore zero is added to the conversion result.

The structure of the comparison/output control circuit shown in FIG. 3 can be used as a comparison/output control circuit of the third embodiment. Determination unit 12 determines an operation to be performed based on the fourth to sixth comparison results, and output generation unit 13 performs a prescribed selective adding operation on the comparison result obtained by the first to fifth comparison cycles stored in register 11.

FIGS. 12 and 13 show a specific example of the conversion sequence according to the third embodiment. FIG. 12 shows the first to fourth comparison cycles, and FIG. 13 shows the fifth and sixth comparison cycles and the final conversion output. If comparison reference voltage REF is higher than analog input voltage IN, "−1" is output as a comparison result. On the other hand, if analog input voltage IN is higher than comparison reference voltage REF, "1" is output as a comparison result. The parameters in each comparison cycle are the same as those of the first and second embodiments.

In the conversion sequence of FIGS. 12 and 13, the maximum charging/discharging amount of the comparison reference voltage in each comparison cycle is 6LSB. Accordingly, in the second comparison cycle, the comparison reference voltage can be varied by only 6LSB although it should be varied by 8LSB. Therefore, for analog input voltages 8LSB and 9LSB, the actual comparison reference voltage is 9.5LSB although the ideal comparison reference voltage is 7.5LSB. This introduces a wrong determination result in the second comparison cycle. Similarly, for analog input voltages 22LSB and 23LSB, the actual comparison reference voltage is 21.5LSB although the ideal comparison reference voltage is 23.5LSB. This introduces a wrong determination result in the second comparison cycle.

In the third and fourth comparison cycles, the actual variation amount of the comparison reference voltage is equal to the required variation amount (at most 6LSB). In other words, the actual comparison reference voltage is varied to the ideal value.

The variation amount of the comparison reference voltage is 2LSB in the fifth comparison cycle. If the comparison reference voltage reaches the upper limit or lower limit, it is set to the upper limit or lower limit. As shown in FIG. 13, the comparison reference voltage is set to 0.5LSB for analog input voltages 0 and 1LSB, and the comparison reference voltage is set to 30.5LSB for analog input voltages 30LSB and 31LSB.

The variation amount of the comparison reference voltage is 1LSB in the sixth comparison cycle (redundant comparison cycle). In the sixth comparison cycle as well, the comparison reference voltage will not be varied beyond the upper or lower limit.

Referring to FIGS. 12 and 13, for analog input voltage 8LSB, the fourth comparison result is "1", the fifth comparison result is "1", and the sixth comparison result is "−1". The first to fourth comparison results for analog input voltage 8LSB are "−1", "−1", "1" and "1", respectively. The comparison result "−1" corresponds to bit "0 ". Therefore, the conversion result obtained by the first to fifth comparison cycles is "00111". In this case, +1 is added to this 5-bit data "00111", i.e., "00111"+"00001" is preformed to obtain "01000", whereby a digital signal corresponding to analog input voltage 8LSB is correctly obtained.

For analog input voltage 9LSB, the fourth to sixth comparison results are "1". Therefore, +2 is added to the converted value "00111", whereby "01001" is obtained as a final converted value.

For analog input voltages 22LSB and 23LSB, −2 and −1 are respectively added according to the comparison results in the fourth to sixth comparison cycles. As a result, the converted values "11000" and "11000" are respectively converted into "10110" and "10111" finally. Accordingly, even if a wrong comparison result is generated in the second comparison cycle, the final conversion result can be accurately obtained with the error corrected.

For the other comparison result patterns, zero addition is performed. When the comparison reference voltage is set to the upper limit or lower limit, zero is added to the conversion result.

In FIG. 13, "○" indicates that the final conversion result matches the input analog voltage. It can be seen from FIG. 13 that every final conversion result matches the input analog voltage. By the error correction function, accurate conversion is assured even if the error of 2SLB is introduced in the comparison reference voltage.

[Modification]

In the third embodiment as well, a converted value can be generated using the comparison result and comparison reference voltage of the final redundant comparison cycle, as in the case of the modification of the first embodiment. For example, in FIG. 10, the comparison reference voltage Vc is 10.5LSB and the comparison result is "−1" in the sixth comparison cycle. Since the analog input voltage is lower than the comparison reference voltage in the sixth comparison cycle, the converted value "10 (decimal)" can be obtained from the comparison reference voltage 10.5LSB.

For analog input voltage 11LSB, the comparison reference voltage is 10.5LSB and the comparison result is "1" in the redundant comparison cycle. In this case, the converted value "01011" higher than the comparison reference voltage can be obtained. As a result, the converted value "11 (decimal)" can be obtained accurately.

As shown in FIG. 13, for analog input voltages 8LSB and 9LSB, the comparison reference voltage is 8.5LSB and the comparison result is "−1" and "1", respectively, in the redundant cycle. Therefore, "01000" and "01001" can be obtained from the comparison reference voltage as converted values corresponding to analog input voltages 8LSB, 9LSB. In this way, accurate converted values can be obtained.

For the other analog input values, the converted values can be obtained from the comparison reference voltage and comparison result of the final redundant cycle. Conversion may be performed by any of the methods described in the modification of the first embodiment.

As has been described heretofore, according to the third embodiment of the present invention, the variation amount of the comparison reference voltage is increased in the comparison cycle corresponding to the least significant bit. Moreover, the variation amount of the comparison reference voltage is 1LSB in the following redundant comparison cycle. This provides 2LSB as a permissible error of the comparison reference voltage. As a result, accurate conversion is assured even if a wrong conversion result is generated due to the insufficient charging/discharging of the comparison reference voltage.

[Fourth Embodiment]

Figure 14:
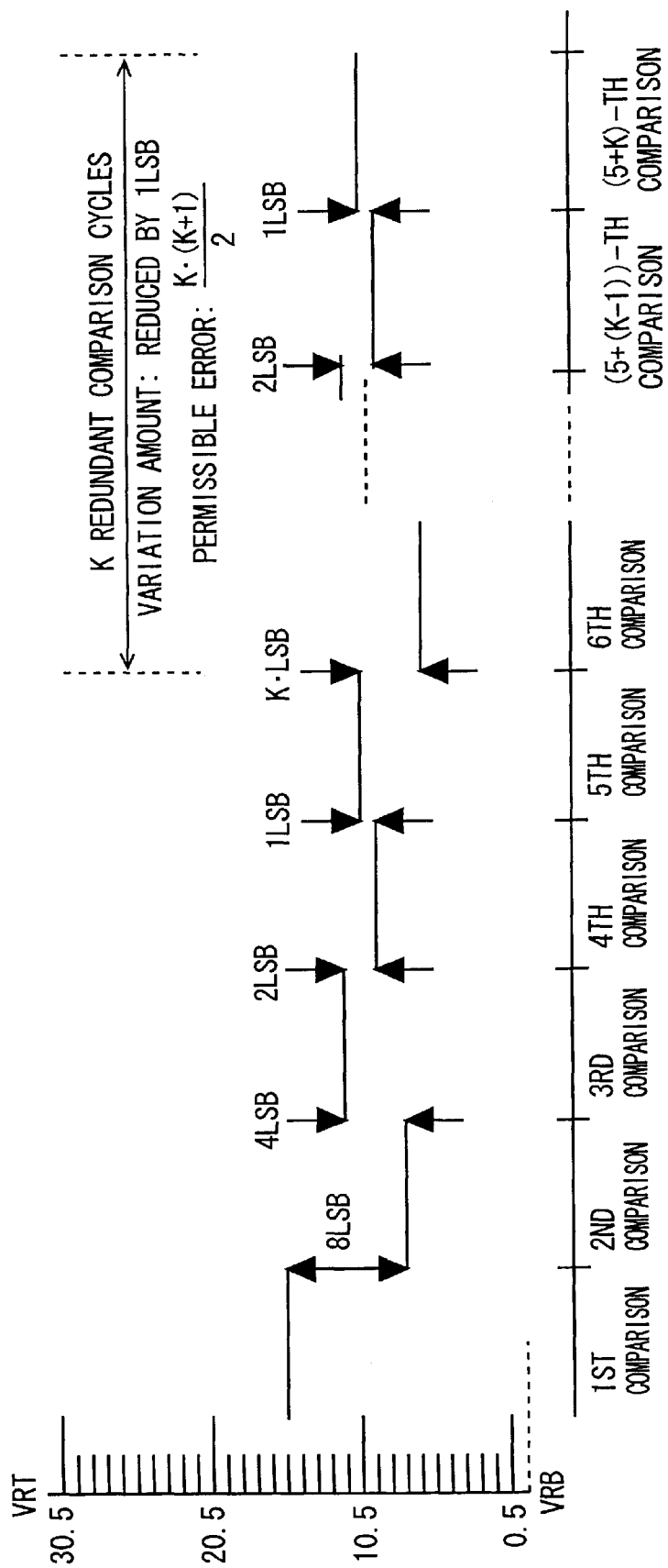
FIG. 14 shows an example of an A-D conversion sequence according to a fourth embodiment of the present invention.

FIG. 14 shows an example of a conversion sequence of an A-D converter according to the fourth embodiment of the present invention. This A/D conversion sequence additionally includes K redundant comparison cycles. In the first redundant comparison cycle (the sixth comparison cycle), the variation amount of the comparison reference voltage is K·LSB. In the following redundant comparison cycles, the variation amount of the comparison reference voltage is sequentially decremented by 1LSB. Since redundant comparison is performed K times and the variation amount of the comparison reference voltage is sequentially decremented by 1LSB in the second to K-th redundant comparison cycles, the sum of 1, 2, . . . , and K, that is, (K·(K+1)/2)LSB, is provided in total as a permissible error of the comparison reference voltage. In other words, these redundant comparison cycles allow an additional convergence period for the voltage (K·(K+1)/2)LSB. Accordingly, the error of the comparison reference voltage corresponding to (K·(K+1)/2)LSB can be compensated for by the redundant comparison cycles.

Figure 16:
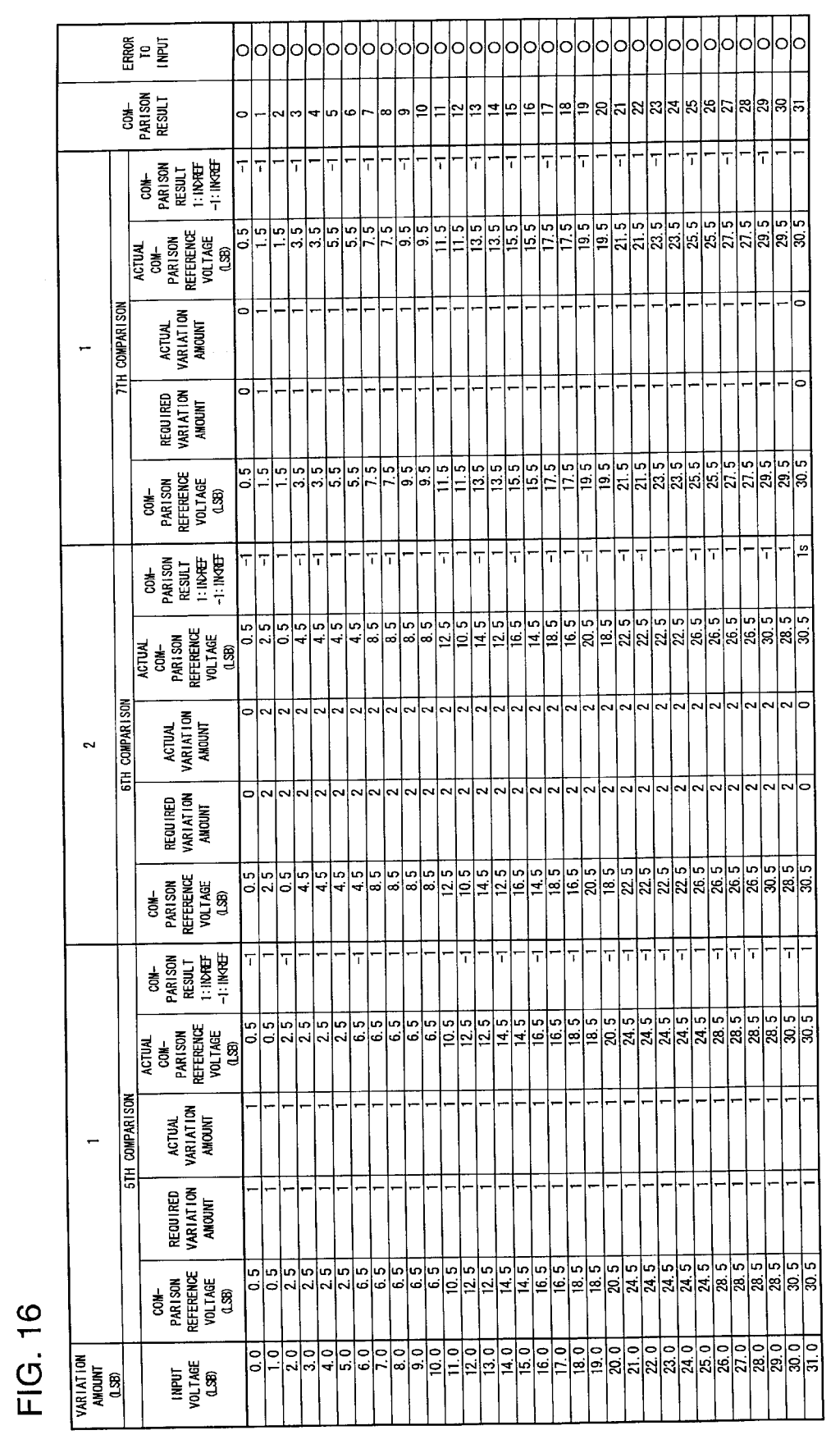

FIGS. 15 and 16 show a specific example of the conversion sequence of the fourth embodiment. In this conversion sequence, the maximum charging/discharging amount of the comparison reference voltage is 5LSB. This conversion sequence includes additional two redundant comparison cycles, and therefore, the sixth and seventh comparison cycles are additionally performed. The variation amount of the comparison reference voltage is 2LSB in the sixth comparison cycle, and 1LSB in the seventh comparison cycle.

The parameters in the conversion sequence of FIGS. 15 and 16 are the same as those of the first to third embodiments. However, actual values of the comparison reference voltage are different from those of the first to third embodiments. Accordingly, conversion patterns for some analog input voltages are different from those of the first to third embodiments. FIG. 15 shows the first to fourth comparison cycles, and FIG. 16 shows the fifth to seventh comparison cycles, final comparison result, and error.

After the first comparison cycle is completed, the comparison reference voltage is required to vary by 8LSB in the second comparison cycle. In this case, however, the actual variation amount is 5LSB. Therefore, the actual comparison reference voltage (actual value) is set to 10.5LSB or 20.5LSB according to the comparison result of the first comparison cycle. As a result, in the second comparison cycle, a wrong comparison result is generated for analog input voltages 8, 9, 10, 21, 22 and 23 with LSB being the unit.

In the third comparison cycle, a required variation amount of the comparison reference voltage is 7LSB. However, since the maximum variable amount is 5LSB, the comparison reference voltage to vary by 7LSB is actually varied by only 5LSB. Accordingly, an error of 2LSB is introduced. As a result, a wrong comparison result is generated for other analog input voltages (4LSB, 5LSB).

In the fourth and fifth comparison cycles, the comparison reference voltage is actually varied by 4LSB and 1LSB at the maximum, respectively. Therefore, the comparison reference voltage can be varied accurately.

The variation amount of the comparison reference voltage is set to 2LSB in the sixth comparison cycle (redundant comparison cycle), and 1LSB in the seventh comparison cycle (redundant comparison cycle).

If in the second and third comparison cycles, the error voltage of 3LSB at the maximum causes the conversion error, the conversion error can be compensated for by setting the variation amount of the comparison reference voltage to 2LSB and 1LSB in the sixth and seventh comparison cycles, respectively. The operation that is performed to obtain the final comparison result will be described below.

The final comparison result is obtained using the comparison results of the fourth to seventh comparison cycles.

If the fourth to seventh comparison results are the same, the comparison reference voltage is varied in the same direction in these comparison cycles. Therefore, ±3 is added to the conversion result obtained by the first to fifth comparison results, according to the sign of the comparison results. For example, if the fourth to seventh comparison results are (1, 1, 1, 1), +3 is added to the conversion result obtained by the first to fifth comparison cycles, whereby the final converted value is generated.

If the fourth to sixth comparison results are the same, but the sixth and seventh comparison results are different, it is determined from the sixth comparison result that the digital value is converged to the analog input voltage. In this case, ±2 is added to the conversion result obtained by the first to fifth comparison cycles, according to the signs of the comparison results. For example, if the fourth to seventh comparison results are (1, 1, 1, −1), +2 is added to the comparison result obtained by the first to fifth comparison cycles.

There is also the case where the fourth and fifth comparison results are the same, the fifth and sixth comparison results are different, and the sixth and seventh comparison results are different. In this case, if the comparison reference voltage is varied by 2LSB in the sixth comparison cycle, the comparison reference voltage goes beyond the analog input voltage. Then, when the comparison reference voltage is varied by 1LSB in the opposite direction in the seventh comparison cycle, the converted value returns to the same side as the conversion candidate in the fifth cycle. It is therefore determined that there is an error of 1LSB is generated relative to the analog input value in the fifth comparison cycle. As a result, ±1 is added to the conversion result obtained by the first to fifth comparison cycles. For example, if the fourth to seventh comparison results are (1, 1, −1, 1), +1 addition is selected for the operation to be performed, and +1 is added to the conversion result.

For the other comparison result patterns, conversion is correctly performed in the first to fifth comparison cycles. Therefore, zero addition is performed.

For example, as shown in FIGS. 15 and 16, the first to fifth comparison results are "00111" for analog input voltage of 8LSB. The comparison result "−1" corresponds to bit "0". The fifth to seventh comparison results are "1", "−1" and "1", respectively. Therefore, +1 addition is performed, whereby "01000" is obtained. In this way, a digital value corresponding to 8LSB is obtained correctly.

For analog input voltage 10LSB, the first to seventh comparison results are (0, 0, 1, 1, 1, 1, 1). Accordingly, +3 is added to "00111", whereby "01010" is obtained. In this way, a digital signal corresponding to 10LSB can be obtained.

The above structure provides 3LSB for a permissible error of the comparison reference voltage.

Note that, in the fourth embodiment as well, the determination unit may be configured by hardware so as to implement the above comparison operations. Alternatively, the determination unit may be formed of a table ROM. In this case, data specifying operations to be performed based on the fourth to seventh comparison results may be stored in the table ROM, and an operation to be performed may be determined according to the data stored in the table ROM with the comparison results being an address. This operation can either be performed by software or hardware. When the ROM is used, the comparison result pattern of the fourth to seventh comparison cycles is stored only for an input voltage that may be accompanied by a wrong comparison result due to the permissible error of the comparison reference voltage. This enables implementation of error correction with a small structure.

In the fourth embodiment as well, the converted value can be generated by using the comparison reference voltage and comparison result of the final redundant cycle. As shown in FIG. 16, for analog input voltage 9LSB, the comparison reference voltage is 9.5LSB and the comparison result is "−1" in the final redundant cycle. Since the analog input value is lower than that comparison reference voltage, an accurate converted value can be obtained by selecting "8 (decimal)" as a converted value. For analog input value 10LSB, the comparison reference voltage is 9.5LSB and the comparison result is "1" in the final redundant cycle. Since the analog input value is higher than that comparison reference voltage, an accurate converted value can be obtained by selecting "10 (decimal)".

The same applies to the other analog input values. An accurate converted value can be obtained as long as the comparison reference voltage is converged to the analog input voltage in the final redundant cycle.

In this case, conversion may be performed by using any of the methods described in the modification of the first embodiment.

As described heretofore, according to the fourth embodiment of the present invention, a conversion sequence includes a plurality of redundant comparison cycles, and the variation amount of the comparison reference voltage is sequentially reduced by 1LSB in the successive redundant comparison cycles. This allows an increased permissible error of the comparison reference voltage, whereby rapid conversion can be achieved.

This redundant comparison cycles may be executed in a pipeline manner with the step of outputting the final comparison result and the step of performing the first to fifth comparison cycles. This enables the redundant comparison cycles to be hidden by the normal comparison cycles. As a result, comparison can be made to output the conversion result at high speed even if the number of redundant comparison cycles is increased.

[Fifth Embodiment]

FIG. 17 shows an example of a conversion sequence of an A-D converter according to the fifth embodiment of the present invention. In the illustrated example, analog input voltage of the voltage 10LSB is converted into a 5-bit digital signal.

The A-D conversion sequence of FIG. 17 additionally includes a single redundant comparison cycle as the sixth comparison cycle. Of the comparison cycles corresponding to the respective bits of the digital signal, the variation amount of the comparison reference voltage is changed in a comparison cycle other than the final comparison cycle. In FIG. 17, the variation amount of the comparison reference voltage is increased by 1LSB to be set to 3LSB in the fourth comparison cycle. In the 5-bit digital signal, the fourth comparison cycle corresponds to a bit having a weight of 2. Changing the variation amount of the comparison reference voltage by 1LSB in the fourth comparison cycle increases the permissible error of the comparison reference voltage up to 2LSB.

Since the variation amount of the comparison reference voltage is set to be 3LSB in the fourth comparison cycle, the comparison reference voltage of the fourth comparison cycle is a voltage level different from $^{1}/_{16}$ times the full scale. In each of the fifth and sixth comparison cycles, the comparison reference voltage is varied by 1LSB relative to the comparison reference voltage in the fourth comparison cycle. Accordingly, the comparison reference voltages in the fourth to sixth comparison cycles have a voltage level different from a reciprocal of the full scale multiplied by a power of 2. In this case, an operation to be performed is determined based on the third to sixth comparison results, i.e., the comparison results from a comparison cycle prior to the comparison cycle having a changed variation amount of the comparison reference voltage to the sixth comparison cycle.

In this case, the difference in the number of bits is small between the comparison results used for determination and the digital signal to be generated. As shown in FIG. 18, a table ROM 13a is therefore used as output generation unit 13 of the output control circuit. Bit patterns of the comparison results and correct final conversion results are stored as a table in table ROM 13a. Register 11 storing an output signal COT of the comparator applies (n+1)-bit data (6-bit data) to table ROM 13a as an address signal. In response to the address signal, table ROM 13a outputs an n-bit (5-bit) final conversion result D. In this case, the ROM need not store the output patterns corresponding to all digital signals. The ROM stores only the output patterns corresponding to the analog input values that may cause a wrong conversion result. If the ROM is not addressed, the output signal of register 11 is selected as a final conversion result. Alternatively, operations to be performed may be stored in the ROM. In this case, the ROM is addressed for a converted value that may be subjected to an error, and an operation of adding ±1 and ±2 is specified. For the other bit patterns, data designating the operation of adding zero is stored in the ROM.

FIGS. 19 and 20 show a specific example of the conversion sequence according to the fifth embodiment. In this example, an analog input signal is converted into 5-bit digital data. The parameters in each comparison cycle of FIGS. 19 and 20 are the same as those of the first to fourth embodiments. FIG. 19 shows the first to third comparison cycles, and FIG. 20 shows the fourth to sixth comparison cycles and the final conversion result. The maximum charging/discharging amount of the comparison reference voltage is herein 6LSB. Therefore, as shown in FIG. 19, the comparison reference voltage is actually varied by only 6LSB in the second comparison cycle although it should be varied by 8LSB. Accordingly, a difference of 2LSB is generated between the ideal and actual comparison reference voltages and the error of 2LSB is introduced in the second comparison cycle.

Since the maximum variable amount of the comparison reference voltage is 6LSB, the actual comparison reference voltage (actual value) is set to the ideal comparison reference voltage level (ideal value) in the third comparison cycle.

In the fourth comparison cycle, the comparison reference voltage is varied by 3LSB. The direction in which the comparison reference voltage is varied in the fourth comparison cycle is determined by the comparison result of the third comparison cycle. Since the variation amount of the comparison reference voltage is 3LSB in the fourth comparison cycle, the actual comparison reference voltage is set to the ideal comparison reference voltage level.

In the fifth comparison cycle, the comparison reference voltage of the fourth comparison cycle is varied by 1LSB with respect to the comparison reference voltage in the fourth comparison cycle. If the comparison reference voltage reaches the upper limit or lower limit in the fourth comparison cycle, the comparison reference voltage will not be varied beyond the upper or lower limit.

In the sixth comparison cycle, the comparison reference voltage is varied by 1 LSB with respect to the comparison reference voltage of the fifth comparison cycle according to the comparison result of the fifth comparison cycle.

When an operation is performed in accordance with the comparison results, the comparison result s of the third to sixth cycles need to be used. Now, a method for specifying an operation from a comparison result pattern will be described, unlike the arrangement shown in FIG. 18.

If the third to sixth comparison results are (1, 1, 1, −1), the converted value is converged to the analog input value in the fifth comparison cycle. Since the variation amount of the comparison reference voltage is additionally increased by 1LSB in the third comparison cycle, it is necessary to compensate for this additional variation amount (1LSB). Therefore, +1 is added to the conversion result obtained by the comparison in the first to fifth comparison cycles.

If the third to sixth comparison results are (1, 1, 1, 1), it is determined that the converted value will be converged to the analog input value in the following seventh comparison cycle. Therefore, +2 addition is performed.

If the third to sixth comparison results are (−1, 1, 1, −1), it is determined that the converted value is converged to the analog input value in the fifth comparison cycle. Since the variation amount of the comparison reference voltage is additionally increased by 1LSB in the fourth comparison cycle, −1 addition is performed.

Similarly, if the third to sixth comparison results are (−1, −1, −1, 1), (−1, −1, −1, −1) and (1, −1, −1, 1), −1 addition, −2 addition and +1 addition are performed, respectively.

For the other comparison result patterns, zero addition is performed.

For example, when the analog input voltage is 12 (decimal), the conversion result is "011000" as shown in FIGS. 19 and 20. Accordingly, zero is added to the upper five bits "01100", whereby a correct conversion result "01100" is obtained. On the other hand, when the analog input voltage is 10LSB as shown in FIG. 17, the conversion result is "010110" as shown FIGS. 19 and 20. In this case, −1 is added to the upper five bits "01011", whereby the conversion result "01010" is obtained.

In the operation, the final comparison result may be generated with reference to table ROM 13a shown in FIG. 18. For the other analog input voltages as well, the final comparison result may be generated with reference to table ROM 13a, or the final conversion value may be obtained by selecting an operation to be performed for the each respective comparison pattern and performing the selected operation to the conversion result.

In the fifth embodiment, the variation amount of the comparison reference voltage is additionally increased by 1LSB in the fourth comparison cycle, and a single redundant comparison cycle is added. This redundant comparison cycle compensates for the convergence time of the voltage of the extra 1LSB in the fourth cycle. Moreover, the permissible error of the comparison reference voltage can be expanded to 2LSB, since the fourth comparison cycle corresponds to the second least significant bit, and the weight thereof corresponds to 2.

[Modification]

In the fifth embodiment as well, the converted value may be obtained by any of the methods described in the modification of the first embodiment. For example, when the analog input voltage is 10LSB as shown in FIG. 17, the comparison reference voltage is 10.5LSB and the comparison result is "−1" in the sixth comparison cycle. Therefore, the converted value "01010" can be obtained by selecting a code lower than this comparison reference voltage as a converted value.

The same applies to the other analog input values. More specifically, if the comparison result of the final redundant cycle is "1", the code that is higher than and closest to the comparison reference voltage level of the final redundant cycle is obtained. On the other hand, if the comparison result of the final redundant cycle is "−1", the code that is lower than and closest to the comparison reference voltage level is obtained. In this way, a converted value can be accurately obtained.

It is apparent from the following fact that this conversion method is an accurate method: in the final cycle shown in FIG. 20, the comparison results are different if the same comparison reference voltage is used for different analog input values.

[Sixth Embodiment]

FIG. 21 shows an example of a conversion sequence of an A-D converter according to the sixth embodiment of the present invention. In the example of FIG. 21, an analog input signal is converted into a 5-bit digital signal. In FIG. 21, the abscissa indicates time and the ordinate indicates voltage.

In the A-D conversion sequence shown in FIG. 21, a redundant cycle is inserted in the second comparison cycle while maintaining the comparison reference voltage. More specifically, the cycle time of the second comparison cycle is made longer than those of the other comparison cycles.

The comparison reference voltage varies largest in the second comparison cycle. By increasing the charging/discharging time of the comparison reference voltage in the second comparison cycle, the comparison reference voltage can be reliably changed to a prescribed voltage level (ideal value) even if there are large parasitic capacitance and parasitic resistance at the comparison reference voltage node. The cycle time M·T of the second comparison cycle is at least twice the cycle time T of the other comparison cycles (M≧2). The variation amount of the comparison reference voltage is 4LSB in the third comparison cycle. Accordingly, by setting the cycle time of the second comparison cycle to at least twice the cycle time of the third comparison cycle, the comparison reference voltage of 8LSB can be reliably charged or discharged in the second comparison cycle.

The redundant cycle is inserted into a single comparison cycle to increase the cycle time of the inserted cycle. This provides the same effect as that obtained by adding a single redundant comparison cycle. Accordingly, conversion can be performed reliably.

Note that the cycle time M·T of the second comparison cycle may be shorter than the time required for discharging or charging the comparison reference voltage by the maximum variation amount. In this case, the cycle time M·T is increased as much as possible, to reduce the error voltage, whereby accurate conversion can be achieved. In other words, accurate conversion is assured as long as the cycle time M·T of the second comparison cycle is equal to the time required for the comparison reference voltage to reach a voltage level within a permissible error voltage range of the ideal comparison reference voltage.

Figure 22:
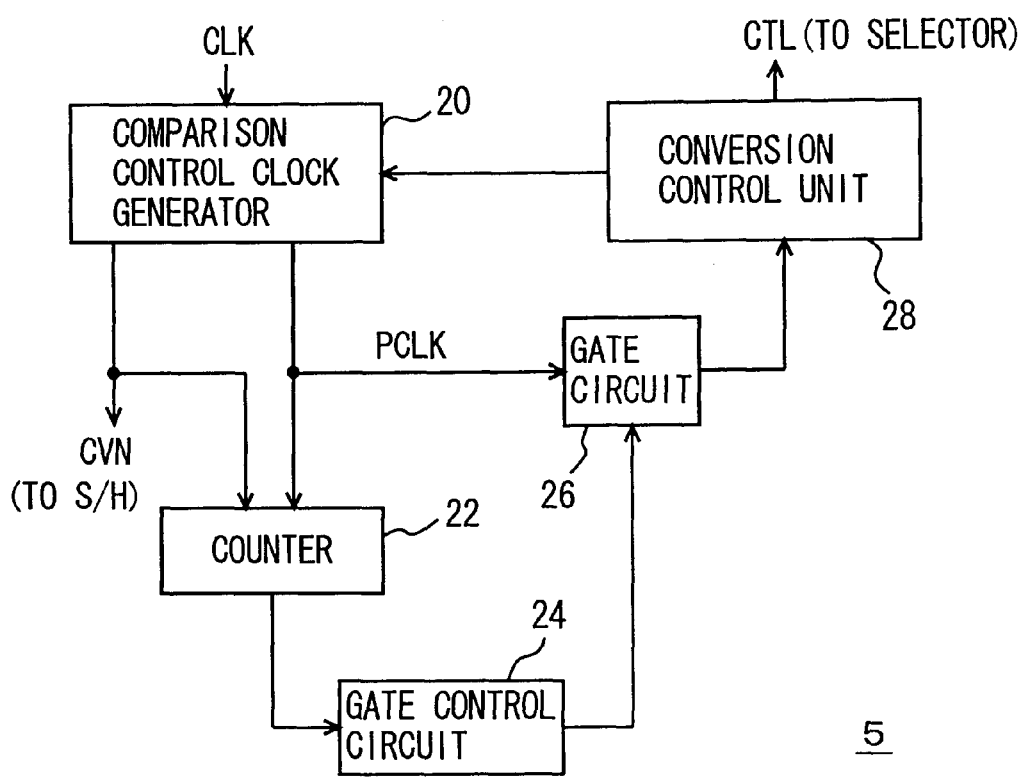
FIG. 22 schematically shows the structure of a main part of an A-D converter according to the sixth embodiment of the present invention.

FIG. 22 schematically shows the structure of a comparison cycle time determining portion of comparison/output control circuit 5 according to the sixth embodiment of the present invention. In FIG. 22, comparison/output control circuit 5 includes a comparison control clock generator 20 for generating a conversion clock signal CVN and a comparison cycle clock signal PCLK in accordance with a clock signal CLK from the clock generator, a counter 22 activated upon activation of the conversion clock signal CVN and counting the comparison cycle clock signal PCLK, a gate circuit 26 for passing the comparison cycle clock signal PCLK selectively, a gate control circuit 24 for controlling an operation of gate circuit 26 in accordance with the count signal of the counter 22, and a conversion control unit 28 for controlling the operation of generating the conversion clock signal and generating the comparison reference voltage in each comparison cycle in a conversion cycle in accordance with the clock signal from the gate circuit 26.

Comparison cycle clock signal PCLK is a one-shot pulse signal having a prescribed time duration, and indicates the end and start of a comparison cycle.

Gate control circuit 24 is activated when counter 22 indicates the second comparison cycle of the conversion cycle, and fixes the clock signal of gate circuit 26 to a prescribed logic level for a prescribed period and also renders gate circuit 26 non-conductive.

When gate circuit 26 is in the non-conductive state and the output signal thereof is fixed to the prescribed logic level, conversion control unit 28 does not perform control operation for the following comparison cycle.

Gate control circuit 24 is reset in response to a change in the clock signal received from gate circuit 26. Gate control circuit 24 is formed of a shift register and a set/reset flip-flop, for example. Counter 22 starts count operation in response to activation of conversion cycle clock signal CVN, and is activated when the count indicates the second comparison cycle to activate gate control circuit 24. When gate control circuit 24 is activated, the internal set/reset flip-flop is set, and gate control circuit 24 fixes the output signal of gate circuit 26 to a prescribed potential level and renders gate circuit 26 non-conductive. It should be noted that gate control circuit 24 renders gate circuit 26 non-conductive and inactivates the output signal thereof after the comparison clock signal for starting the second comparison cycle passes gate circuit 26.

Gate control circuit 24 performs shifting operation for a prescribed period after the internal flip-flop is set. After the shifting operation is completed, the internal flip-flop is reset, and gate control circuit 24 renders gate circuit 26 non-conductive. The cycle time of the second comparison cycle is determined by the number of shift cycles of the shift register.

Gate circuit 26 is formed of a transmission gate and an OR circuit or a NOR circuit, for example. While gate control circuit 24 is active, gate circuit 26 is retained in the non-conductive state and the output signal thereof is fixed to H level or L level.

According to the clock signal generated from gate circuit 26, conversion control unit 28 controls operation of generating a control signal for selecting a comparison reference voltage and operation of updating the storage location of register circuitry for storing the comparison result. When gate control circuit 24 is inactivated and gate circuit 26 transmits the comparison cycle clock signal PCLK, conversion control unit 28 performs control operation for the following comparison cycle.

Note that in the structure where the comparison result of the second comparison cycle is stored in the register circuit, the comparison result need only be stored in the register circuit according to comparison cycle clock signal PCLK. In the second comparison cycle, the comparison result is repeatedly stored at the same bit position of the register circuit. Therefore, the comparison result of the second comparison cycle is stored accurately.

Gate control circuit 24 may be a match detection circuit that is activated when counter 22 indicates the second comparison cycle, for determining whether the count value of counter 22 matches a comparison cycle number (M) stored in a prescribed register. The comparison cycle time can be determined based on the data stored in a prescribed register.

Note that, in comparison/output control circuit 5 shown in FIG. 22, the cycle time of the second comparison cycle may be set to M times the cycle time of other comparison cycles by software. In other words, a sequence controller may be programmed such that the cycle time of the second comparison cycle is increased by a prescribed time period upon execution of the comparison cycles. Note that conversion cycle clock signal CVN determines a comparison/conversion cycle of an analog input voltage.

In the sixth embodiment as well, the converted value can be obtained from the comparison reference voltage and comparison result of the final comparison cycle. As shown in FIG. 21, when the analog input voltage is 10LSB, the comparison reference voltage is 10.5LSB and the comparison result is "−1" in the fifth comparison cycle. Accordingly, the converted value "10 (decimal)" can be obtained from this comparison reference voltage.

The same applies to the other analog input values. Since the redundant cycle is inserted in the second comparison cycle, the comparison reference voltage is converged to the analog input voltage in the fifth comparison cycle. Therefore, the converted value can be accurately obtained according to the comparison reference voltage and comparison result of the fifth comparison cycle.

Moreover, the inserted redundant cycle allows the input node of the comparator to be accurately set to the ideal voltage level. Therefore, comparison is correctly performed in each comparison cycle. By using the comparison result of each comparison cycle as a converted value, a converted value corresponding to an analog input value can be obtained accurately.

As described above, according to the sixth embodiment, the cycle time of the second comparison cycle is made longer than that of the other comparison cycles. Accordingly, the comparison reference voltage can be reliably set to a prescribed voltage level in the comparison cycle that is the largest in the variation amount of the comparison reference voltage. As a result, accurate conversion is assured.

Note that, in the first comparison cycle, the reference voltage of the comparator is determined according to an input analog signal, and the comparison reference voltage is set to 15.5LSB. However, since the A-D converter is initialized during a so-called setup time, the analog input voltage of the comparator and the comparison reference voltage are stable at the beginning of the comparison cycle. This setup time is set for the conversion cycle or the conversion clock signal CVN. Therefore, a sufficient setup time can be ensured so that the comparison reference voltage can be set to even a median of the full scale precisely.

[Seventh Embodiment]

Figure 23:
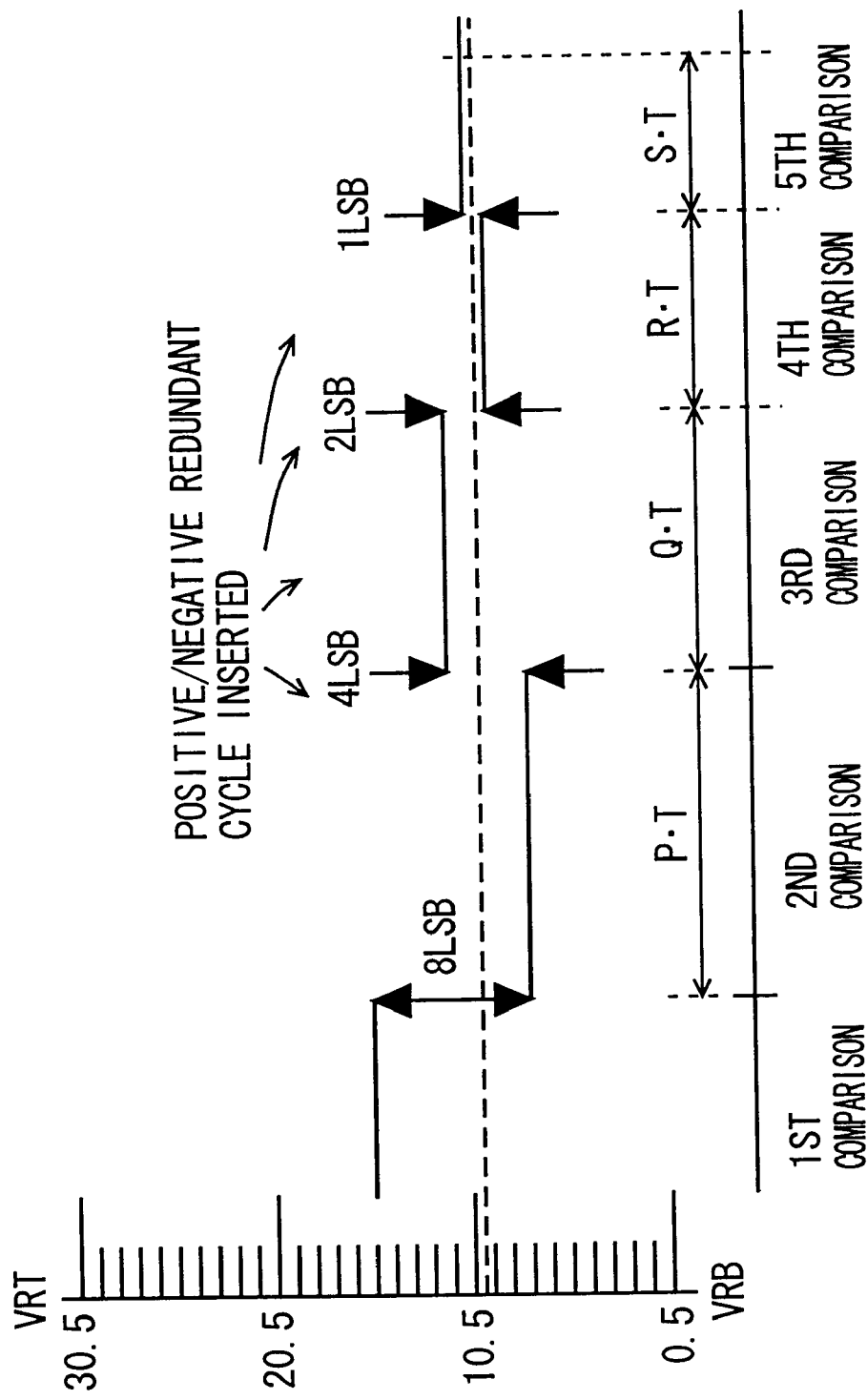
FIG. 23 shows an example of an A-D conversion sequence according to a seventh embodiment of the present invention.

FIG. 23 shows an example of an A-D conversion sequence according to the seventh embodiment of the present invention. In FIG. 23, the abscissa indicates time and the ordinate indicates voltage.

In this A-D conversion sequence as well, comparison is performed five times in order to convert an analog input voltage into a 5-bit digital signal. In the seventh embodiment, the cycle time is individually determined for each of the second to fifth comparison cycles. In FIG. 23, a cycle time P·T is assigned to the second comparison cycle, a cycle time Q·T is assigned to the third comparison cycle, a cycle time R·T is assigned to the fourth comparison cycle, and a cycle time S·T is assigned to the fifth comparison cycle. In the second to fifth comparison cycles, the variation amounts of the comparison reference voltage are 8LSB, 4LSB, 2LSB and 1LSB, respectively.

The variation amount of the comparison reference voltage is gradually reduced from the second comparison cycle towards the fifth comparison cycle. As a result, the time required for charging/discharging of the comparison reference voltage is also reduced accordingly. The cycle time of each comparison cycle is determined according to the time required for charging/discharging of the corresponding comparison reference voltage. Thus, the analog input voltage can be accurately converted into a digital signal without increasing the total time required for a conversion cycle.

Since the setup time can be used for the first comparison cycle, the first comparison cycle need not have an increased cycle time.

In the conversion sequence of FIG. 23, a redundant cycle is inserted into each comparison cycle. More specifically, a positive redundant cycle is inserted in order to increase the cycle time of a comparison cycle of interest, and a negative redundant cycle is inserted in order to reduce the cycle time of a comparison cycle of interest. The cycle time of the comparison cycle may be sequentially reduced from the second comparison cycle towards the fifth comparison cycle. Alternatively, the cycle time of the second and third comparison cycles may be set to 2T and the cycle time of the fourth and fifth comparison cycles may be set to T/2. The cycle time of each comparison cycle is merely required to be appropriately determined according to the charging/discharging rate of the comparison reference voltage.

Figure 24:
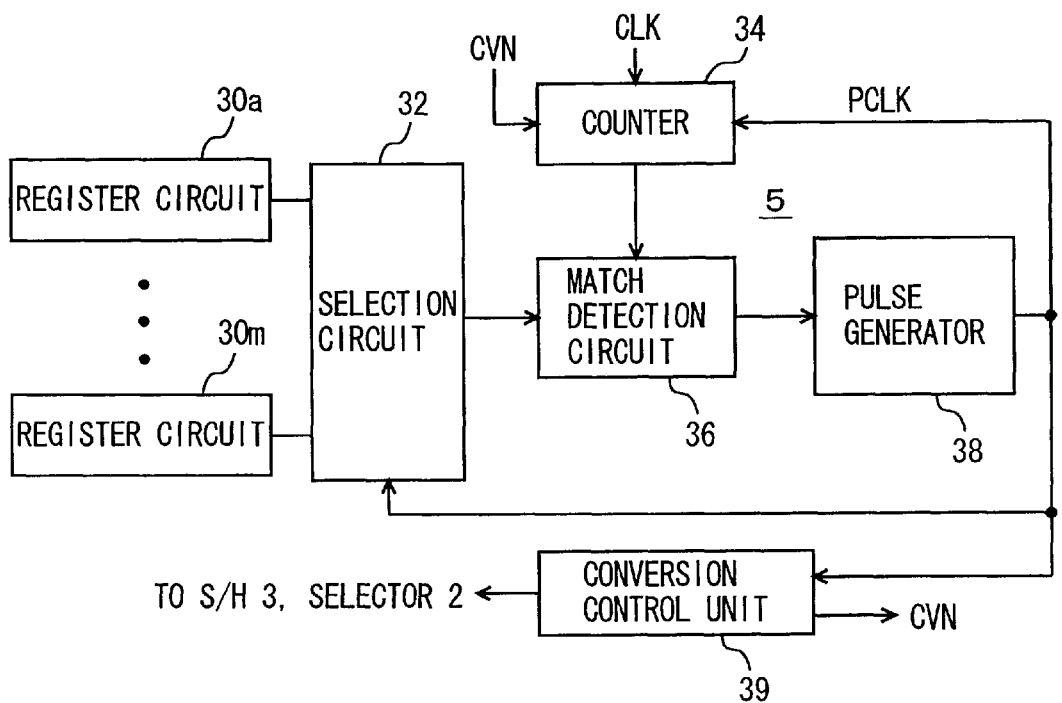
FIG. 24 schematically shows the structure of a main part of a control circuit according to the seventh embodiment of the present invention.

FIG. 24 schematically shows the structure of a main part of comparison/output control circuit 5 in the A-D converter according to the seventh embodiment of the present invention. In FIG. 24, comparison/output control circuit 5 includes register circuits 30a to 30m for storing information indicating a cycle time for the respective comparison cycles, a selection circuit 32 for alternatively selecting information stored in registers 30a to 30m, a counter 34 for counting the internal clock signal CLK from the clock generator upon activation of the conversion cycle clock signal CVN, a match detection circuit 36 for detecting a matching between the count of the counter 34 and an output value of the selection circuit 32, a pulse generator 38 for generating a pulse signal PCLK as the comparison cycle clock signal in accordance with a match detection signal from the match detection circuit 36, and a conversion control unit 39 for generating control signals to the sample/hold (S/H) circuit 3 and selector 2 and generating the conversion cycle clock signal CVN in accordance with comparison clock signal PCLK from pulse generation circuit 38.

Selection circuit 32 is formed of a shift register, for example, and performs a shifting operation in accordance with the comparison cycle clock signal PCLK generated from pulse generation circuit 38, to select the data stored in registers 30a to 30m.

Figure 25:
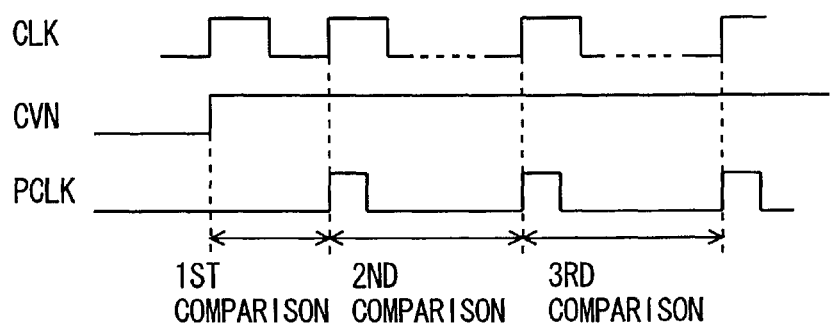
FIG. 25 is a waveform chart illustrating operation of the control circuit in FIG. 24.
Figure 26:
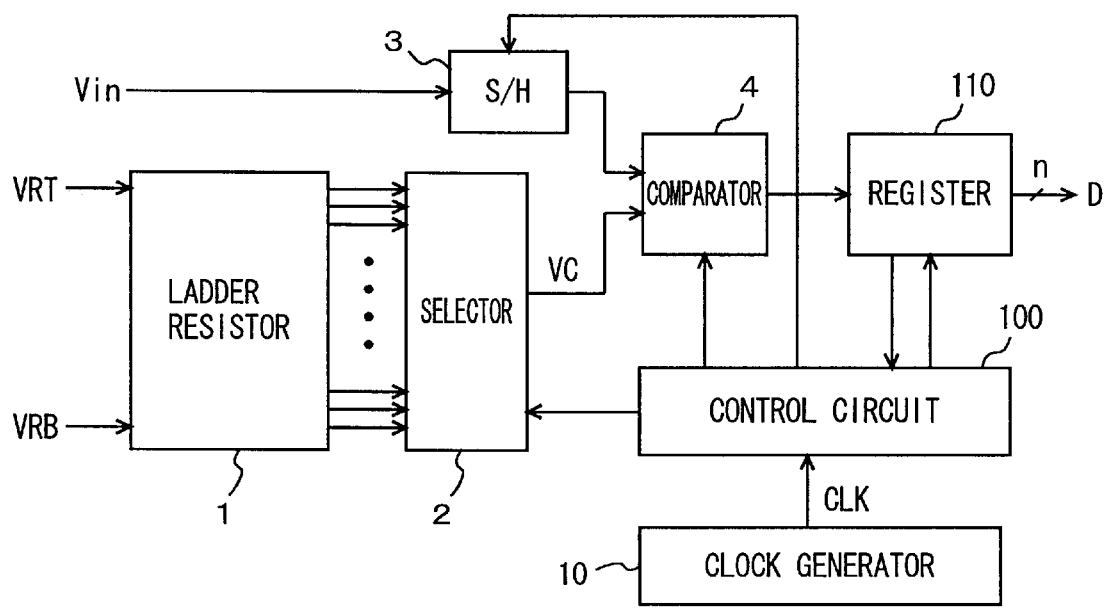
FIG. 26 schematically shows the structure of a conventional A-D converter.
Figure 27:
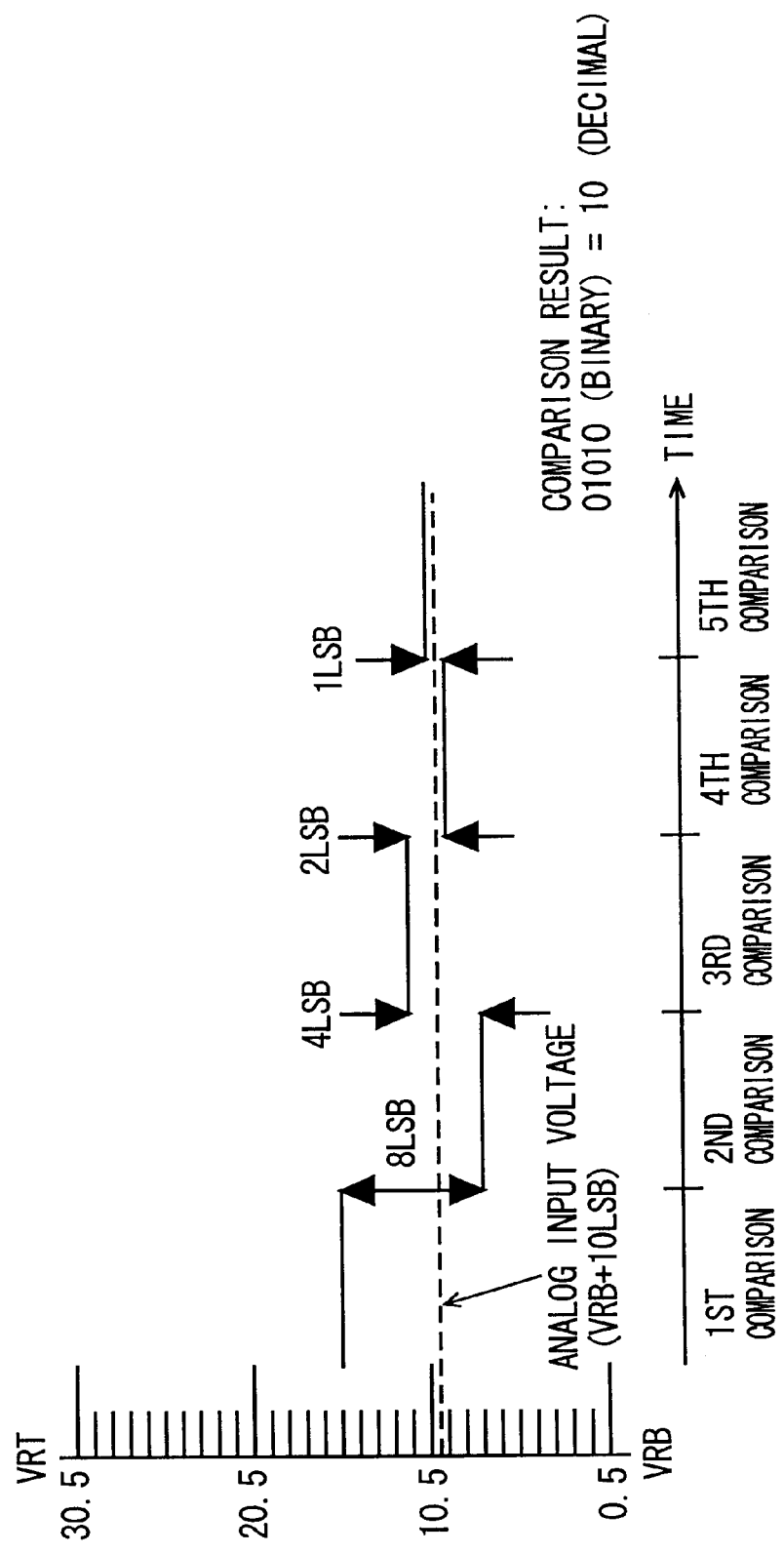
FIG. 27 shows an example of a conventional A-D conversion sequence.
Figure 28:
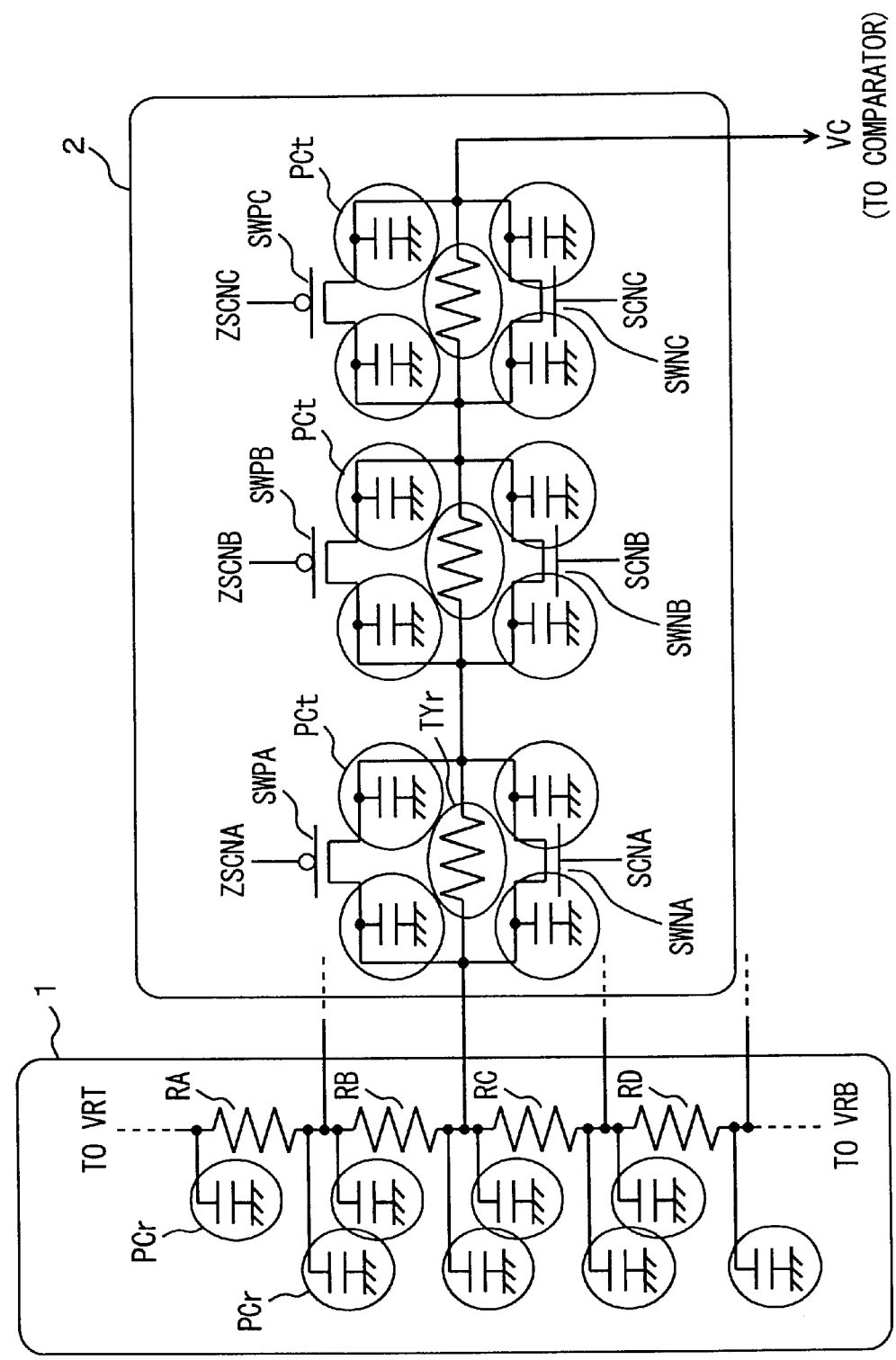
FIG. 28 shows an example of the structure of a ladder resistor and a selector in FIG. 26.
Figure 33:
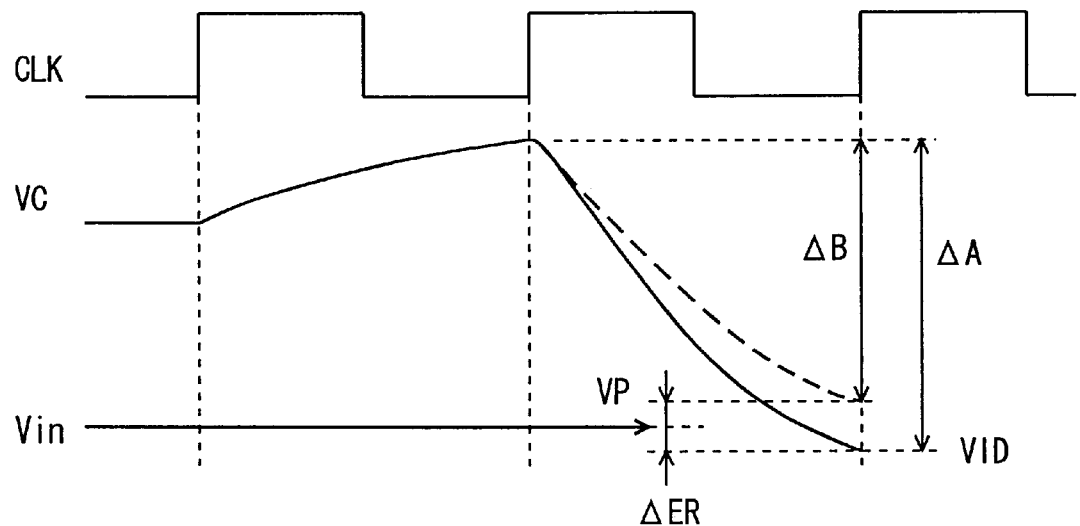
FIG. 33 shows an example of variation in comparison reference voltage in the conventional A-D converter.
Figure 34:
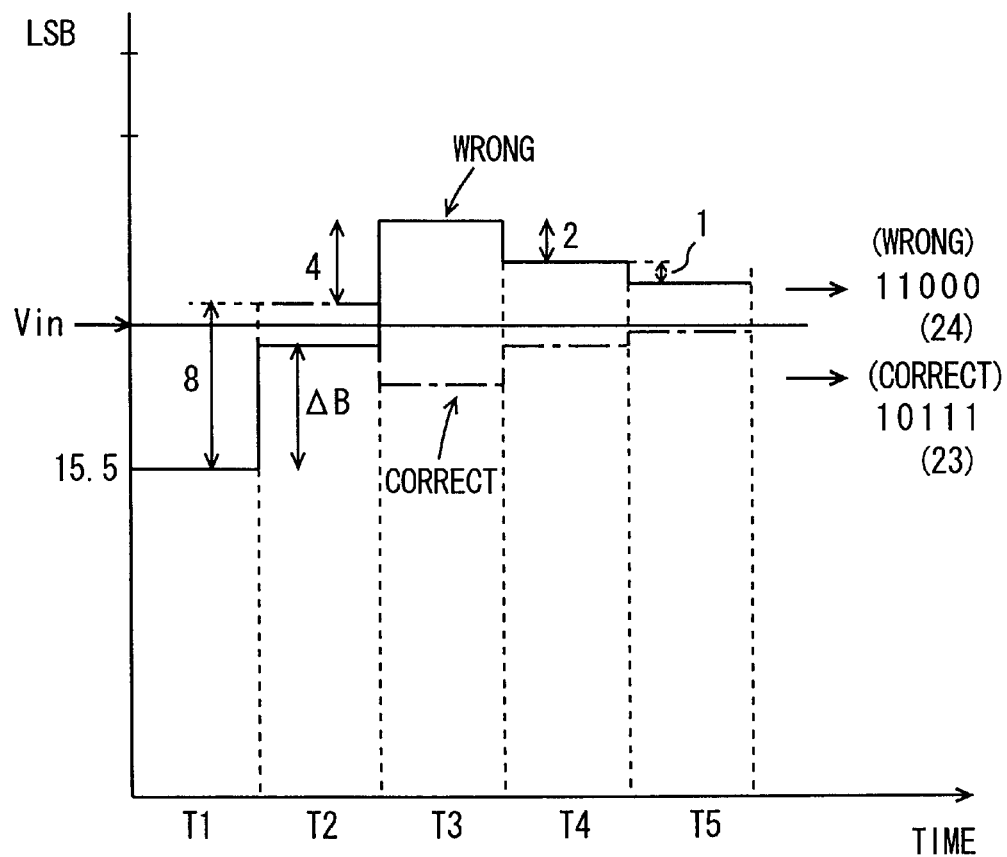
FIG. 34 illustrates operation of the conventional A-D converter.

FIG. 25 is a waveform diagram illustrating operation of comparison/output control circuit 5 shown in FIG. 24. An operation of comparison/output control circuit 5 in FIG. 24 will be described with reference to FIG. 25.

Conversion control unit 39 generates conversion cycle clock signal CVN for each conversion cycle. The conversion cycle clock signal CVN determines a conversion cycle for each analog input voltage. When the conversion cycle is started, selection circuit 32 selects storage data of the register circuit that stores the information of the cycle time of the first comparison cycle (e.g., register circuit 30a). At the start of the conversion cycle, counter 34 counts the clock signal CLK in response to activation of this conversion cycle clock signal CVN. The count of counter 34 is applied to match detection circuit 36.

Match detection circuit 36 generates a match detection signal if the count value of counter 34 matches the cycle time selected by selection circuit 32. FIG. 25 exemplarily shows the case where the cycle time of the first comparison cycle corresponds to one cycle of clock signal CLK. Pulse generator 38 generates a one-shot pulse signal having a prescribed time duration according to the match detection signal from match detection circuit 36.

If the one-shot pulse signal PCLK is applied to counter 34 in the active period of conversion cycle clock signal CVN, counter 34 resets the count value and resumes the count operation from the initial value. Therefore, counter 34 performs count operation from the initial value in each comparison cycle. The cycle time of each comparison cycle is determined according to the cycle time selected by selection circuit 32. In response to comparison cycle clock signal PCLK, selection circuit 32 performs shifting operation and selects the storage data of the register circuit corresponding to the following comparison cycle.

In response to the comparison cycle clock signal PCLK, conversion control unit 39 generates a selection control signal to selector 2 so that selector 2 selects the comparison reference voltage of the following comparison cycle. When the count of this pulse comparison clock signal PCLK reaches a prescribed value (a value corresponding to the number of bits of the output digital signal), comparison control unit 39 inactivates conversion cycle clock signal CVN, for causing S/H circuit 3 to sample the following analog input voltage. Counter 34 has its counting operation stopped and has the count value reset to the initial value in preparation for the following analog input voltage. The above operation is repeated for each analog input voltage, and comparison and conversion can be achieved with the cycle time of each comparison cycle determined according to the charging/discharging rate of the comparison reference voltage.

In the seventh embodiment, a redundant cycle is inserted into each comparison cycle and the comparison reference voltage is converged to the analog input voltage in the final comparison cycle. Therefore, in the seventh embodiment as well, the converted value can be generated by using the comparison reference voltage and comparison result of the final comparison cycle, as in the case of the modification of the first embodiment. The comparison result of each comparison cycle may be stored in registers and the bits stored in the registers may be output as a converted value at the end of the conversion cycle for each analog input value. The input node of the comparator is reliably charged/discharged in each comparison cycle. Therefore, the actual comparison reference voltage is the same as the ideal comparison reference voltage. As a result, comparison can be performed accurately in each comparison cycle. Thus, the storage data bits correctly indicate the converted value of an analog input voltage.

As described so far, according to the seventh embodiment of the present invention, the cycle time of each comparison cycle in the conversion sequence can be individually determined, and can be determined according to the charging/discharging rate of the comparison reference voltage. As a result, rapid, accurate comparison and conversion can be implemented while suppressing generation of error of the comparison reference voltage.

[Other Applications]

The A-D converter of the present invention is not limited to the A-D converter using a ladder resistor. The present invention is also applicable to a hybrid, successive-approximation type A-D converter using both a ladder resistor and a capacitor, and a successive approximation type A-D converter using a capacitor. In other words, the present invention is applicable to any A-D converter for converting an analog input signal into a digital signal by sequentially comparing the analog input signal with a comparison reference voltage on a bit-by-bit basis from the most significant bit according to the "binary search" method.

The number of bits of the digital signal is not limited to that described in the above embodiments, and has only to be determined appropriately according to individual applications. The number of comparison cycles is determined by the number of bits of the digital signal to be generated.

Moreover, comparison operation and error correction operation may be performed in a pipeline manner.

As described heretofore, according to the present invention, the successive approximation type A-D converter has at least one redundant comparison cycle provided in the comparison sequence. This ensures accurate conversion even when the charging/discharging rate of the comparison reference voltage assumes a finite value, enabling implementation of an A-D converter capable of rapidly performing analog-to-digital conversion with high accuracy.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. An analog to digital converter for converting an analog signal into a digital signal, comprising:

comparison circuitry for comparing said analog signal with a comparison reference voltage a predetermined number of times equal in number to bits of said digital signal, a voltage level of said comparison reference voltage being variable for each comparison; and control circuitry for causing said comparison circuitry to perform the predetermined number of times of comparison and a redundant comparison, said control circuitry setting the voltage level of said comparison reference voltage in each comparison, and said redundant comparison including at least one of an increased cycle time of a second comparison in the predetermined number of times of comparison greater than a cycle time of the other(s) of said predetermined number of times of comparison and an additional comparison after said predetermined number of times of comparison.

2. The analog to digital converter according to claim 1, wherein said control circuitry controls said comparison circuitry so as to perform said redundant comparison after said predetermined number of times of comparison, and a variation amount of the comparison reference voltage in said redundant comparison is set to a minimum variation amount.

3. The analog to digital converter according to claim 2, wherein said control circuitry makes a minimum variation amount of the comparison reference voltage in the comparisons of the predetermined number of times different from the variation amount of the comparison reference voltage in the redundant comparison.

4. The analog to digital converter according to claim 1, wherein said redundant comparison is performed once after said predetermined number of times of comparison.

5. The analog to digital converter according to claim 1, wherein said redundant comparison is performed at least twice after said predetermined number of times of comparison.

6. The analog to digital converter according to claim 5, wherein, for each of the redundant comparisons, said control circuitry reduces the variation amount of the comparison reference voltage by a minimum variation amount.

7. The analog to digital converter according to claim 1, wherein said analog to digital converter is a successive approximation type converter, and in said predetermined number of times of comparison, said control circuitry sequentially reduces the comparison reference voltage by a prescribed multiple of a basic variation amount in a predetermined sequence, and said control circuitry further inserts said redundant comparison at least into a second comparison cycle of said predetermined number of times of comparison, and retains the comparison reference voltage of said redundant comparison at a same voltage level as the comparison reference voltage in a comparison immediately before said redundant comparison, thereby changing a cycle time of the comparison cycle having said redundant comparison inserted therein.

8. The analog to digital converter according to claim 1, wherein
said analog to digital converter is a successive approximation type converter, and
in said predetermined number of times of comparison, said control circuitry sequentially reduces a variation amount of said comparison reference voltage with a basic voltage width being a reference in a prescribed sequence, and
said control circuitry further sets a variation amount of a comparison reference voltage in said redundant comparison to a same value as a variation amount of a comparison reference voltage in a last comparison in said predetermined number of times of comparison.

9. The analog to digital converter according to claim 1, wherein
said analog to digital converter is a successive approximation type converter, and
said control circuitry sets a ratio of a variation amount of a comparison reference voltage in a prescribed comparison cycle of said predetermined number of times of comparison to a full scale of said comparison reference voltage to a value different from a cycle number of said prescribed comparison cycle raised to the power of 2.

10. The analog to digital converter according to claim 1, wherein said control circuitry determines the comparison cycles according to a clock signal, and inserts said redundant comparison into a prescribed comparison cycle the largest in variation amount of said comparison reference voltage, to make a cycle time allotted to said prescribed comparison cycle longer than the cycle time of other comparison cycle(s) of said predetermined number of times of comparison.

11. The analog to digital converter according to claim 10, wherein
said analog to digital converter is a successive approximation type converter,
in said predetermined number of times of comparison, said control circuitry sequentially reduces the variation amount of the comparison reference voltage in a prescribed sequence with a basic voltage width being a reference, and
said prescribed comparison cycle is a second comparison cycle in said predetermined number of times of comparison.

12. The analog to digital converter according to claim 11, wherein
said control circuitry sets a cycle time of each comparison according to a clock signal, and
a cycle time of said redundant comparison inserted into said second comparison cycle is at least a basic cycle time allotted to the second comparison.

13. The analog to digital converter according to claim 1, wherein
said control circuitry includes a circuit for inserting a cycle of said redundant comparison so as to selectively vary cycle times of said second and subsequent comparisons in said predetermined number of times of comparison, and
a comparison reference voltage of the inserted redundant comparison cycle is the same in voltage level as a comparison reference voltage of a comparison cycle to which the redundant comparison cycle is inserted.

14. The analog to digital converter according to claim 1, wherein said control circuitry inserts said redundant comparison to each of a second and subsequent comparisons in said predetermined number of times of comparison, and sequentially reduces a cycle time of inserted redundant comparison over the second and subsequent comparisons of the predetermined number of times of comparison.

15. An analog to digital converter, comprising:
a comparator for comparing an applied analog signal with a comparison reference voltage;
control circuitry for setting a comparison cycle of said comparator and setting a voltage level of said comparison reference voltage in each comparison cycle of a predetermined number of times of comparison, said control circuitry determining respective cycle times of second and subsequent comparisons of the predetermined number of times of comparison such that cycle times of successive comparison cycles including at least the second comparison cycle vary from each other; and
output circuitry for generating a digital signal corresponding to the analog signal according to an output signal of said comparator.

16. The analog to digital converter according to claim 15, wherein
said analog to digital converter is a successive approximation type analog to digital converter for performing a comparison with a voltage level of the comparison reference voltage varied in each comparison, and
said control circuitry determines cycles of the comparisons according to a clock signal such that a prescribed comparison cycle the largest in variation amount of the comparison reference voltage has a longer cycle time than other(s) in the comparison cycles of the predetermined number.

17. The analog to digital converter according to claim 16, wherein
said control circuitry sets respective variation amounts of the comparison reference voltage in said predetermined number of times of comparison on a basis of a basic voltage width, and
said prescribed comparison cycle longer in cycle time is the second comparison cycle in said predetermined number of times of comparison.

18. The analog to digital converter according to claim 15, wherein said control circuitry sets a cycle time of the second comparison to at least twice a basic cycle time.

19. The analog to digital converter according to claim 15, wherein said control circuitry varies a cycle time of each of the second and subsequent comparisons in said predetermined number of times of comparison.

20. The analog to digital converter according to claim 19, wherein said control circuitry sequentially reduces the cycle times of said second and subsequent comparisons in said predetermined number of times of comparison.

* * * * *